(12) United States Patent
Chen et al.

(10) Patent No.: US 11,164,848 B2
(45) Date of Patent: Nov. 2, 2021

(54) SEMICONDUCTOR STRUCTURE AND METHOD MANUFACTURING THE SAME

(71) Applicant: Taiwan Semiconductor Manufacturing Co., Ltd., Hsinchu (TW)

(72) Inventors: Ming-Fa Chen, Taichung (TW); Chao-Wen Shih, Hsinchu County (TW); Min-Chien Hsiao, Taichung (TW); Sung-Feng Yeh, Taipei (TW); Tzuan-Horng Liu, Taoyuan (TW); Chuan-An Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/737,869

(22) Filed: Jan. 8, 2020

(65) Prior Publication Data
US 2020/0402960 A1 Dec. 24, 2020

Related U.S. Application Data

(60) Provisional application No. 62/864,446, filed on Jun. 20, 2019.

(51) Int. Cl.
| | |
|---|---|
| *H01L 25/065* | (2006.01) |
| *H01L 23/48* | (2006.01) |
| *H01L 25/00* | (2006.01) |
| *H01L 23/31* | (2006.01) |

(52) U.S. Cl.
CPC ...... *H01L 25/0657* (2013.01); *H01L 23/3121* (2013.01); *H01L 23/3135* (2013.01); *H01L 23/481* (2013.01); *H01L 25/50* (2013.01)

(58) Field of Classification Search
CPC .................................................. H01L 23/3121
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

*Primary Examiner* — Thao P Le
(74) *Attorney, Agent, or Firm* — JCIPRNET

(57) ABSTRACT

A semiconductor structure includes a stacked structure. The stacked structure includes a first semiconductor die and a second semiconductor die. The first semiconductor die includes a first semiconductor substrate having a first active surface and a first back surface opposite to the first active surface. The second semiconductor die is over the first semiconductor die, and includes a second semiconductor substrate having a second active surface and a second back surface opposite to the second active surface. The second semiconductor die is bonded to the first semiconductor die through joining the second active surface to the first back surface at a first hybrid bonding interface along a vertical direction. Along a lateral direction, a first dimension of the first semiconductor die is greater than a second dimension of the second semiconductor die.

20 Claims, 42 Drawing Sheets

(56) References Cited

U.S. PATENT DOCUMENTS

| | | | |
|---|---|---|---|
| 9,666,502 B2* | 5/2017 | Chen | H01L 23/3135 |
| 9,735,131 B2* | 8/2017 | Su | H01L 25/0657 |
| 2009/0152683 A1* | 6/2009 | Nguyen | H01L 29/06 |
| 2013/0011968 A1* | 1/2013 | Bartley | H01L 25/18 |
| | | | 438/109 |
| 2020/0058617 A1* | 2/2020 | Wu | H01L 24/83 |
| 2020/0402960 A1* | 12/2020 | Chen | H01L 23/3121 |

* cited by examiner

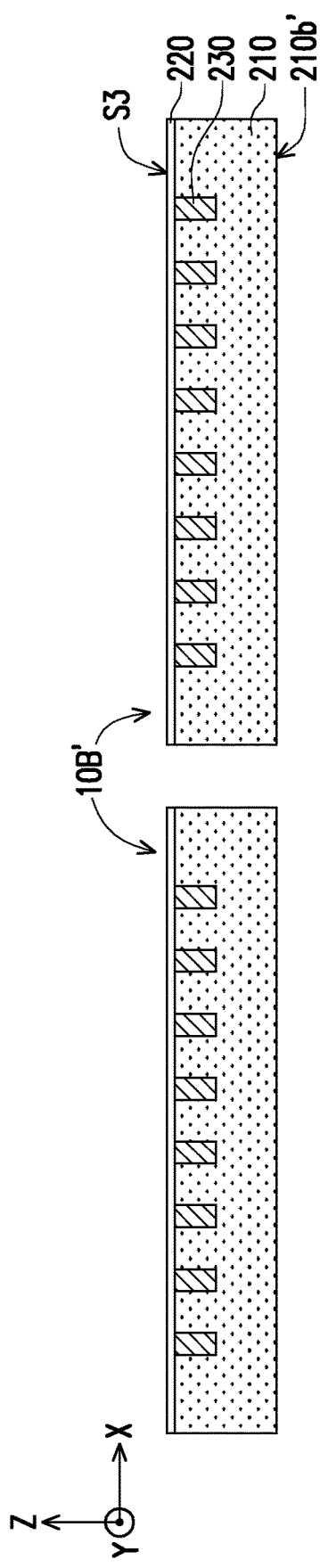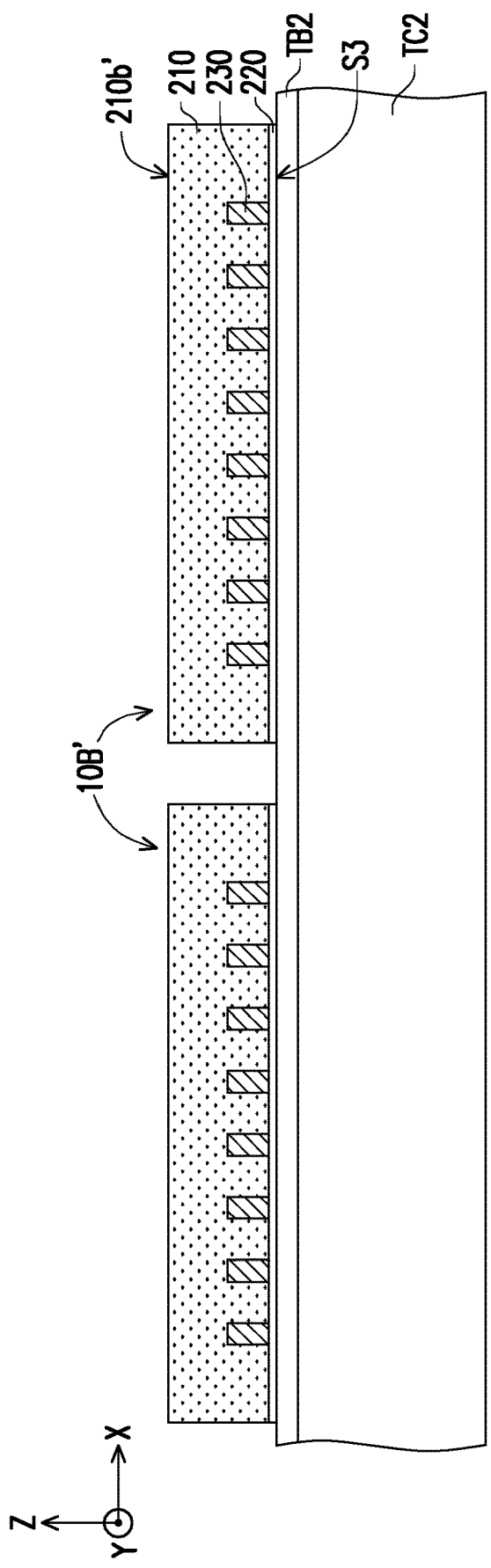

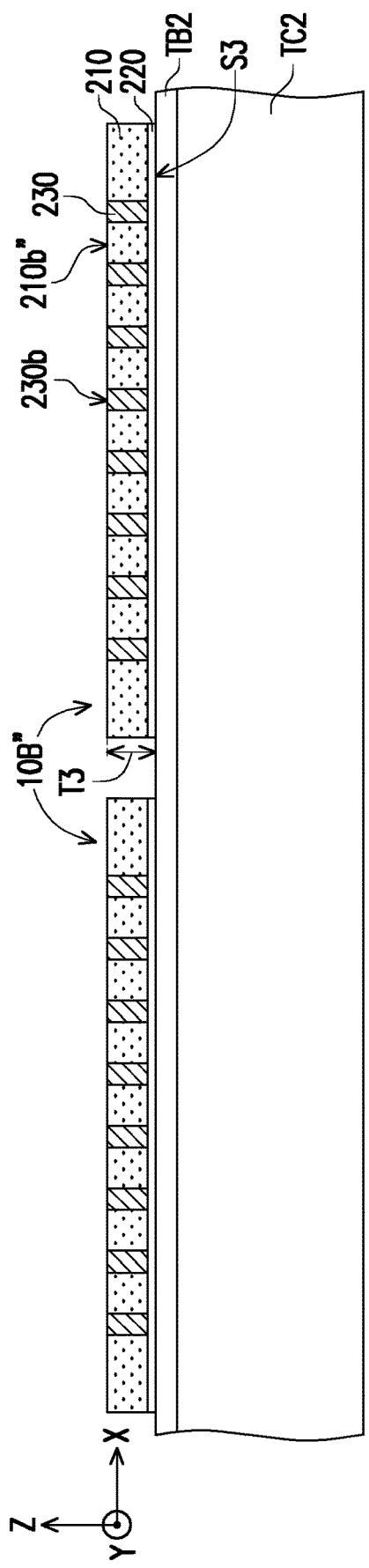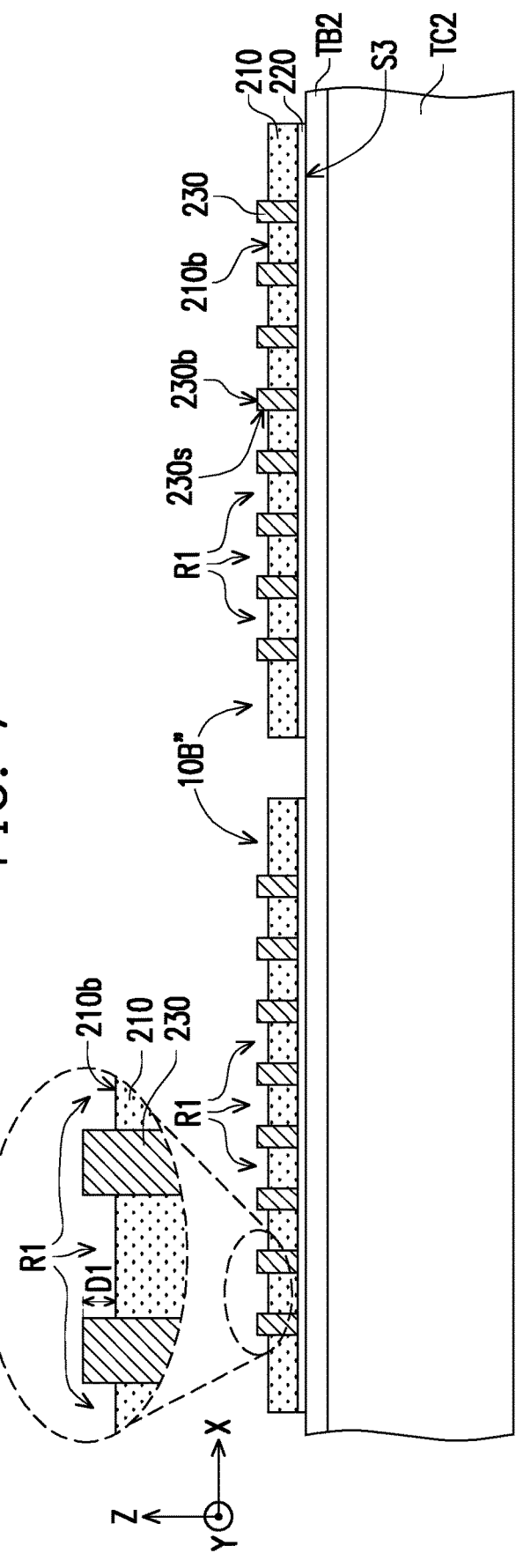

SEMICONDUCTOR STRUCTURE AND METHOD MANUFACTURING THE SAME

CROSS-REFERENCE TO RELATED APPLICATION

This application claims the priority benefit of U.S. provisional application Ser. No. 62/864,446, filed on Jun. 20, 2019. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. For example, the area occupied by integrated components is proximate to the surface of a semiconductor wafer; however, there are physical limitations to an achievable density in two-dimensional (2D) integrated circuit formation. For example, one of these limitations comes from the significant gains in the number and length of interconnections between semiconductor devices as the number of semiconductor devices increases. As the existing integrated circuit design rules require a decreasing pitch for laying out conductive wirings in a semiconductor structure, there is continuous effort in developing new mechanisms of forming semiconductor structures.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 through FIG. 24 are schematic cross-sectional views showing various stages in a manufacturing method of a semiconductor structure in accordance with some embodiments of the disclosure.

DETAILED DESCRIPTION

Figure 1:
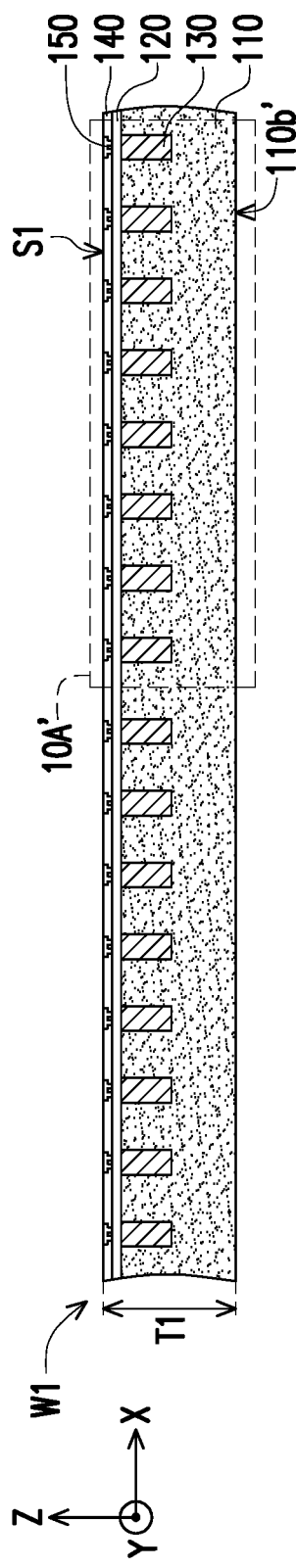
FIG. 1 through FIG. 4 are schematic cross-sectional views showing various stages in a manufacturing method of a semiconductor die in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 4 are schematic cross-sectional views showing various stages in a manufacturing method of a semiconductor die in accordance with some embodiments of the disclosure. Referring to FIG. 1, in some embodiments, a semiconductor wafer W1 is provided. In some embodiments, the semiconductor wafer W1 includes a plurality of semiconductor dies 10A' connected to one another. For example, each of the semiconductor dies 10A' may include an integrated circuit device (e.g., a logic die, a memory die, a radio frequency die, a power management die, a micro-electro-mechanical-system (MEMS) die, the like, or combinations of these). In some embodiments, a thickness T1 of the semiconductor wafer W1 is in a range of about 720 μm to about 800 μm.

For example, each of the semiconductor dies 10A' includes a semiconductor substrate 110 having semiconductor devices (not shown) formed therein, an interconnect structure 120 formed on the semiconductor substrate 110, a plurality of conductive vias 130 formed in the semiconductor substrate 110 and extending into the interconnect structure 120, a dielectric layer 140 formed on the interconnect structure 120 and opposite to the semiconductor substrate 110, and a plurality of bonding conductors 150 formed over the interconnect structure 120 and laterally covered by the dielectric layer 140. In some embodiments, as shown in FIG. 1, each of the semiconductor dies 10A' has a front surface S1 and a bottom surface 110b' opposite to the front surface S1.

The bonding conductors 150 are distributed at the front surface S1 and accessibly revealed by the dielectric layer 140, and the bottom surface 110b' may be considered to the side distal from the interconnect structure 120 and the bonding conductors 150.

In some embodiments, the semiconductor substrate 110 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 110 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure. In some embodiments, the alloy SiGe is formed over a silicon substrate. In other embodiments, a SiGe substrate is strained. The semiconductor substrate 110 may include the semiconductor devices (not shown) formed therein or thereon, and the semiconductor devices may be or may include active devices (e.g., transistors, diodes, etc.) and/or passive devices (e.g., capacitors, resistors, inductors, etc.), or other suitable electrical components. In some embodiments, the semiconductor devices are formed at the side of the semiconductor substrate 110 proximal to the interconnect structure 120.

The semiconductor substrate 110 may include circuitry (not shown) formed in a front-end-of-line (FEOL), and the interconnect structure 120 may be formed in a back-end-of-line (BEOL). In some embodiments, the interconnect structure 120 includes an inter-layer dielectric (ILD) layer formed over the semiconductor substrate 110 and covering the semiconductor devices, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 120 including one or more dielectric layer(s) (e.g., dielectric layers DI1 illustrated in FIG. 26A) and one or more metallization pattern(s) (e.g., metallization patterns MP illustrated in FIG. 26A) is formed on the semiconductor substrate 110. The metallization pattern(s) may be embedded in the dielectric layers (e.g., the IMD layers), and the metallization patterns (e.g., metal lines, metal vias, metal pads, metal traces, etc.) may be formed of conductive materials such as copper, gold, aluminum, the like, or combinations thereof. In some embodiments, the interconnect structure 120 is electrically coupled to the semiconductor devices formed in and/or on the semiconductor substrate 110 to one another and to external components (e.g., test pads, bonding conductors, etc.). For example, the metallization patterns in the dielectric layers route electrical signals between the semiconductor devices of the semiconductor substrate 110. The semiconductor devices and metallization patterns are interconnected to perform one or more functions including memory structures (e.g., memory cell), processing structures, input/output circuitry, or the like. The outermost layer of the interconnect structure 120 may be a passivation layer (e.g., a passivation layer PL illustrated in FIG. 26A) made of one or more suitable dielectric materials such as silicon oxide, silicon nitride, low-k dielectrics, polyimide, combinations of these, or the like. In some embodiments, each of the semiconductor dies 10A' includes a conductive pad (e.g., a conductive pad AP illustrated in FIG. 26A) disposed over and electrically coupled to the top metallization pattern of the interconnect structure 120, and the passivation layer of the interconnect structure 120 may have an opening exposing at least a portion of the conductive pad for testing or for further electrical connection.

In some embodiments, the conductive vias 130 are formed to extend into the semiconductor substrate 110. The conductive vias 130 may be in physical and electrical contact with the metallization patterns of the interconnect structure 120. For example, when the conductive vias 130 are initially formed, the conductive vias 130 are embedded in the semiconductor substrate 110 and may not extend to the bottom surface 110b' of the semiconductor substrate 110. That is, for the semiconductor wafer W1, the conductive vias 130 are not accessible revealed by the semiconductor substrate 110.

For example, each of the conductive vias 130 may include a barrier material (e.g., TiN, Ta, TaN, Ti, or the like; not shown) and a conductive material (e.g., copper, tungsten, aluminum, silver, combinations thereof, or the like; not shown). For example, the barrier material may be formed between the conductive material and the semiconductor substrate 110.

In alternative embodiments, a dielectric liner (not shown) (e.g., silicon nitride, an oxide, a polymer, a combination thereof, etc.) may be further optionally formed between the barrier material of the conductive vias 130 and the semiconductor substrate 110. In some embodiments, the conductive vias 130 are formed by forming recesses in the semiconductor substrate 110 and respectively depositing the dielectric liner, the barrier material, and the conductive material in the recesses, removing excess materials on the semiconductor substrate 110. For example, the recesses of the semiconductor substrate 110 are lined with the dielectric liner so as to laterally separate the conductive vias 130 from the semiconductor substrate 110. The conductive vias 130 may be formed by using a via-first approach. For example, the conductive vias 130 are formed during the formation of the interconnect structure 120. Alternatively, the conductive vias 130 may be formed by using a via-last approach, and may be formed after the formation of interconnect structure 120. The disclosure is not limited thereto.

In some embodiments, the dielectric layer 140 is formed on the interconnect structure 120. For example, the dielectric layer 140 includes one or more layers (e.g., dielectric layers DI2, DI3, DI4 illustrated in FIG. 26A) of dielectric materials (e.g., silicon nitride, silicon oxide, high-density plasma (HDP) oxide, tetra-ethyl-ortho-silicate (TEOS), undoped silicate glass (USG), the like, or a combination thereof). In some embodiments, the dielectric layer 140 laterally covering the bonding conductor 150 is subsequently used for bonding. It should be appreciated that the dielectric layer 140 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials. The structure of the dielectric layer 140 will be described in detail later in conjunction with figures.

In some embodiments, the bonding conductors 150, such as bond vias (e.g., bond vias 150b illustrated in FIG. 26A) and/or bond pads (e.g., a bond pad 150a illustrated in FIG. 26A), are formed over the interconnect structure 120 to provide an external electrical connection to the circuitry and semiconductor devices. In the disclosure, the bonding conductors 150 each have a bond pad with two or more than two bond vias disposed thereon. The bonding conductors 150 may be formed of conductive materials such as copper, gold, aluminum, the like, or combinations thereof. The bonding conductors 150 may be electrically coupled to the semiconductor devices of the semiconductor substrate 110 through the interconnect structure 120. The bonding conductors 150 may be substantially leveled with the dielectric layer 140 for bonding. The above examples are provided for illustrative purposes, other embodiments may utilize fewer or additional elements (e.g., conductive pads), and the details of the semiconductor dies will be described later in accompanying with enlarged views. In the other words, for example, it may be also saying that the semiconductor wafer W1 includes the semiconductor substrate 110, the interconnect structure 120, the conductive vias 130, the dielectric layer 140, and the bonding conductors 150, as shown in FIG. 1.

Figure 2:
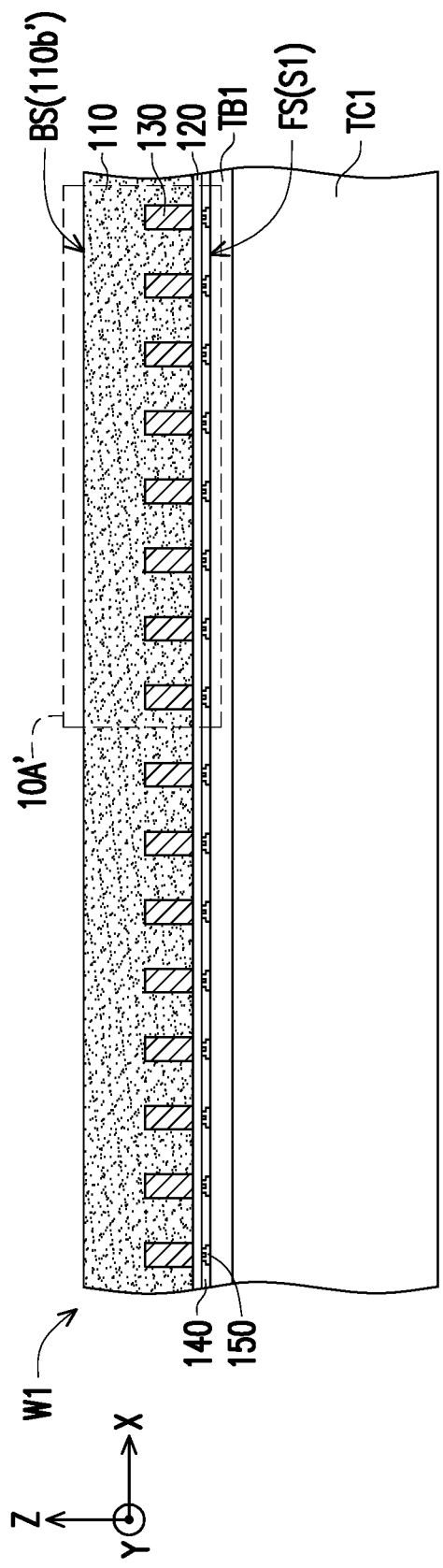

Referring to FIG. 2, in some embodiments, the semiconductor wafer W1 is placed on a temporary carrier TC1 by a temporary bonding layer TB1. A material of the temporary carrier TC1 may include glass, metal, ceramic, silicon, plastic, combinations thereof, multi-layers thereof, or other suitable material that can provide structural support for the semiconductor wafer W1 in subsequent processing. In some embodiments, the temporary carrier TC1 is made of glass, and the temporary bonding layer TB1 used to adhere the semiconductor wafer W1 to the temporary carrier TC1 includes a polymer adhesive layer (e.g., die attach film (DAF)), a ultra-violet (UV) cured layer, such as a light-to-heat conversion (LTHC) release coating, ultra-violet (UV) glue, which reduces or loses its adhesiveness when exposed to a radiation source (e.g., UV light or a laser). Other suitable temporary adhesives may be used. In some embodiments, the temporary carrier TC1 is a silicon wafer, and the temporary bonding layer TB1 includes a silicon-containing dielectric material (e.g., silicon oxide, silicon nitride, etc.) or other suitable dielectric material(s) used for bonding. For example, the bonding includes oxide-to-oxide bonding, and the dielectric layer 140 of the semiconductor wafer W1 is bonded to the temporary bonding layer TB1. Alternatively, the temporary bonding layer TB1 may be omitted.

In some embodiments, a front-side FS of the semiconductor wafer W1 (e.g. the front surfaces S1 of the semiconductor dies 10A') is attached to the temporary carrier TC1 and a back-side BS of the semiconductor wafer W1 (e.g. the bottom surfaces 110b' of the semiconductor dies 10A') faces upwardly for subsequent processing, as shown in FIG. 2. The front-side FS is opposite to the back-side BS along a stacking direction Z of the semiconductor substrate 110 and the interconnect structure 120, for example.

Figure 3:
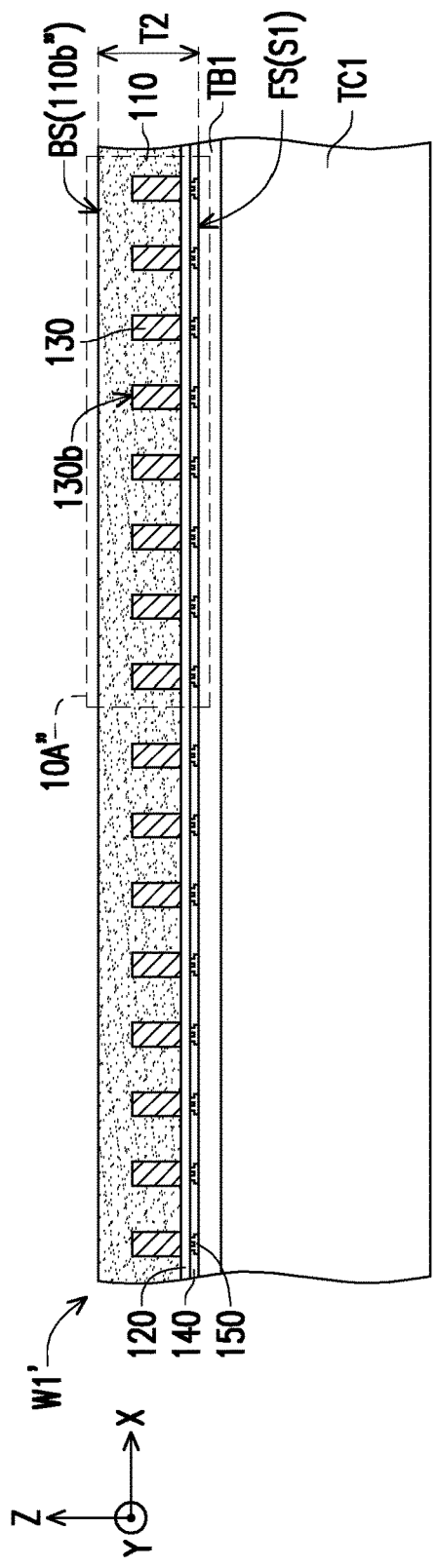

Referring to FIG. 2 and FIG. 3, in some embodiments, the semiconductor wafer W1 is thinned to form a thinned semiconductor wafer W1' by, for example, etching, grinding, a chemical mechanical polishing (CMP) process, combinations thereof, or other suitable thinning techniques. For example, a thinning process is performed on the back-side BS of the semiconductor wafer W1 (e.g. the bottom surfaces 110b' of the semiconductor dies 10A') to obtain the thinned semiconductor wafer W having a reduced thickness T2. That is, the reduced thickness T2 of the thinned semiconductor wafer W1' is less than the thickness T1 of the semiconductor wafer W1. In some embodiments, the reduced thickness T2 is in a range of about 40 µm to about 200 µm. As shown in FIG. 3, after the thinning process, the conductive vias 130 are not yet accessibly revealed through a back-side BS of the thinned semiconductor wafer W1' (e.g., a bottom surfaces 110b" of the semiconductor dies 10A"). In other words, for each semiconductor die 10A", bottom surfaces 130b of the conductive vias 130 are not accessibly exposed by the bottom surface 110b" of the semiconductor dies 10A".

Figure 4:
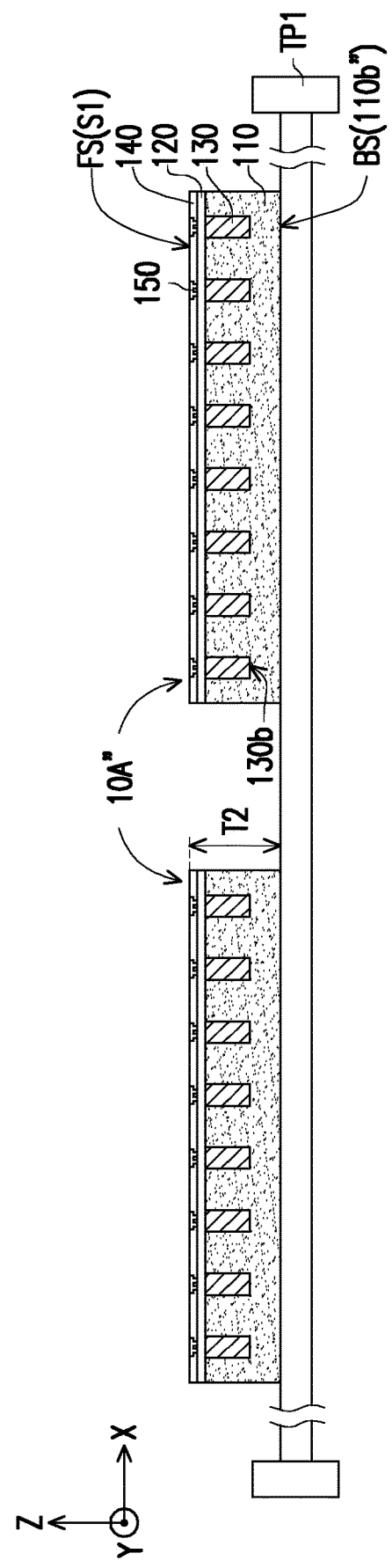

Continue to FIG. 4, in some embodiments, after the wafer backside thinning process, the thinned semiconductor wafer W1' is mounted on the tape frame TP1. For example, the structure shown in FIG. 3 is overturned (e.g., flipped upside down along the stacking direction Z), such that the back-side BS of the thinned semiconductor wafer W1' (e.g., the bottom surfaces 110b" (of semiconductor substrates 110) of the semiconductor dies 10K') is disposed on the tape frame TP1. Next, a de-bonding process may be performed on the temporary carrier TC1 to release from the thinned semiconductor wafer W1'. For example, external energy (e.g., UV light or a laser) is applied on the temporary bonding layer TB1. Alternatively, the removal process of the temporary carrier TC1 may include a mechanical peel-off process, a grinding process, an etching process, or the like. In some embodiments, a cleaning process is performed to remove residues of temporary bonding layer TB1 from the thinned semiconductor wafer W1' by using suitable solvent, cleaning chemical, or other cleaning techniques. Subsequently, a singulation process is performed on the thinned semiconductor wafer W1' to obtain a plurality of separated and individual semiconductor die 10A". As shown in FIG. 4, the separated and individual semiconductor die 10A" each has the front surface S1 and the bottom surface 110b", for example.

For example, the tape frame TP1 holds the thinned semiconductor wafer W1' in place during the singulation process, and a dicing tool (e.g., a saw) may be used to cut through the thinned semiconductor wafer W1' along the scribe lines (not shown). In other embodiments, the singulation process is performed prior to mounting on the tape frame TP1. In some embodiments, before dicing/singulating, the semiconductor dies 10A" included in the thinned semiconductor wafer W1' are tested for functionality and performance by probing, and only known good dies (KGDs) from the tested semiconductor dies 10A" are selected and used for subsequently processing.

In some embodiments, the temporary carrier TC1 illustrated in FIG. 2 and FIG. 3 may be replaced by the tape frame TP1. For example, the semiconductor wafer W1 is mounted on the first tape frame with the front-side FS of the semiconductor wafer W1 facing towards the first tape frame, and then the thinning process is performed on the back side BS of the semiconductor wafer W1. Subsequently, the thinned semiconductor wafer W1' is transferred to be mounted on the second tape frame with the back side BS of the thinned semiconductor wafer W1' (e.g., the bottom surface 110b" of semiconductor dies 10A") facing towards the second tape frame, and then the singulation process is performed, and the second tape frame holds the thinned semiconductor wafer W1' in place during the singulation process. It should be noted that above examples are provided for illustrative purposes, the formation of the semiconductor dies 10A" can be formed in any logical order which are not limited in the disclosure.

Figure 24:
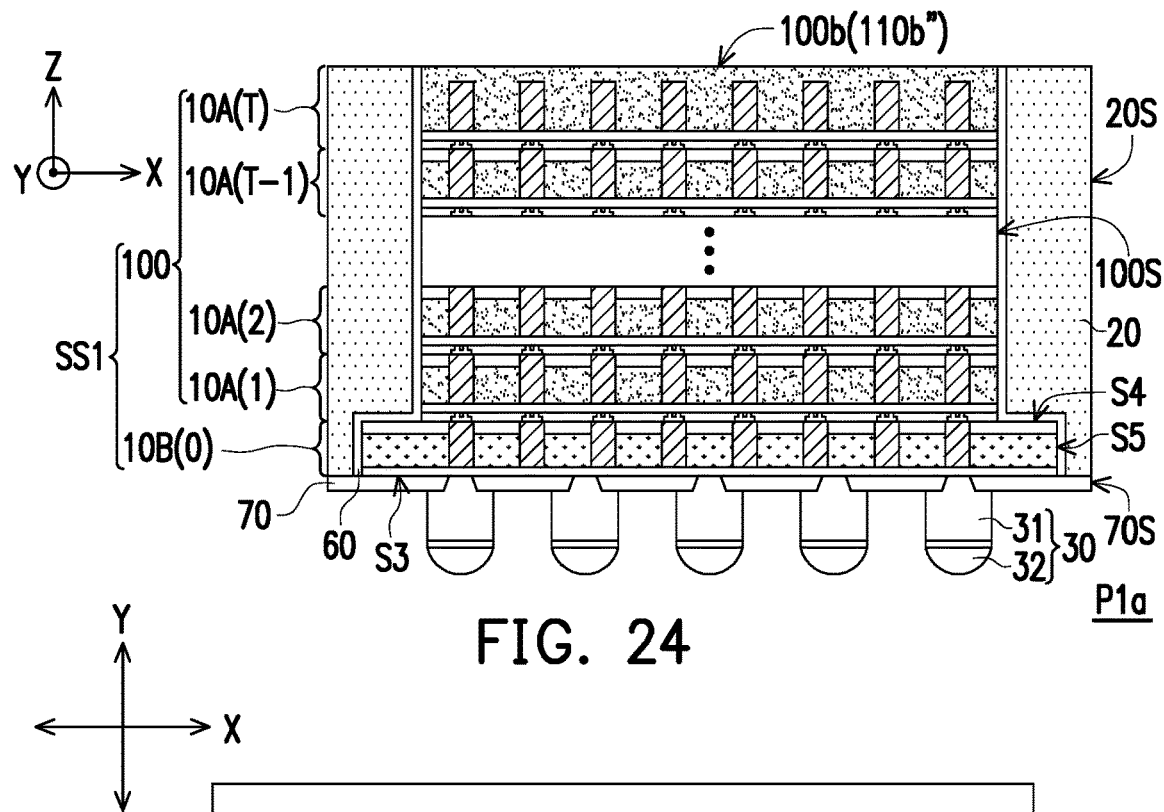
Figure 25:
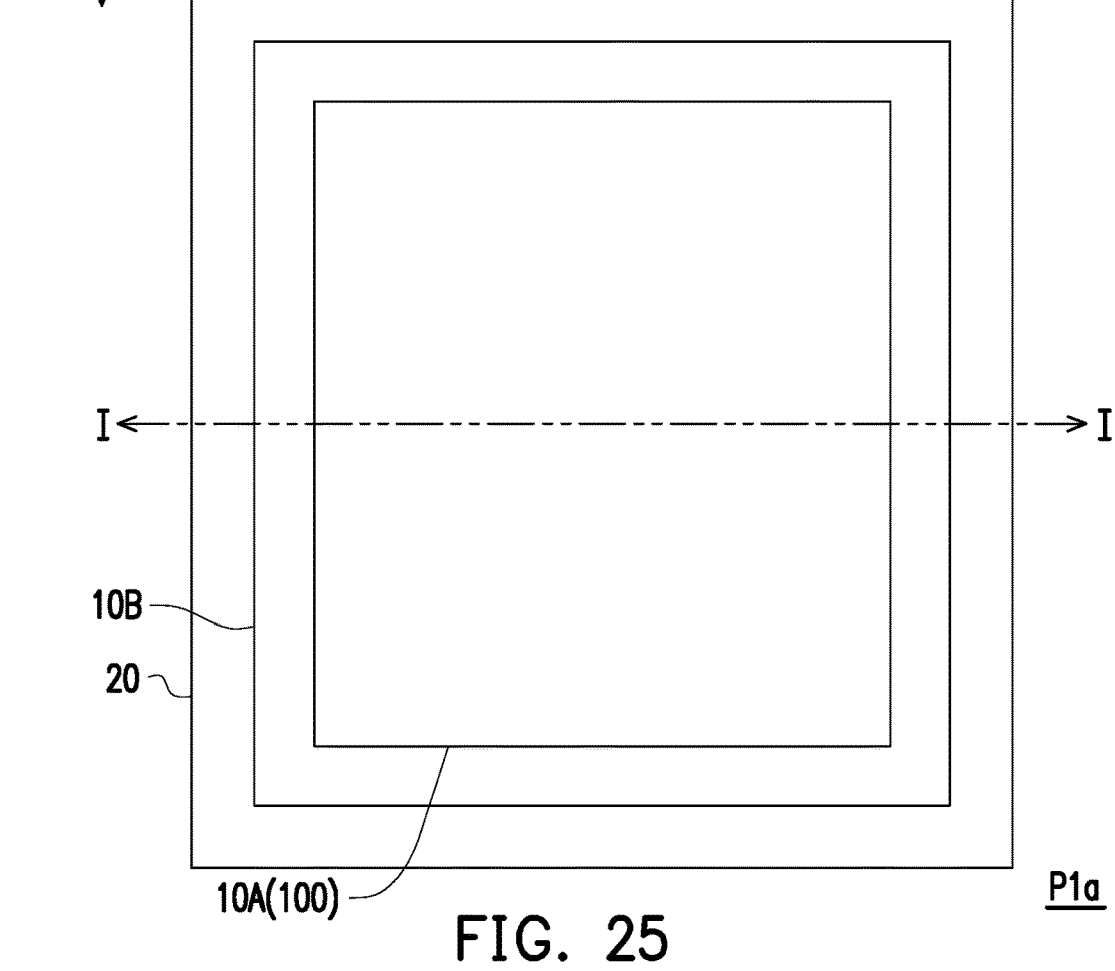
FIG. 25 is a schematic top view illustrating a relative position between a semiconductor die, a carrier die and an insulating encapsulation of a semiconductor structure in accordance with some embodiments of the disclosure.
Figure 26A:
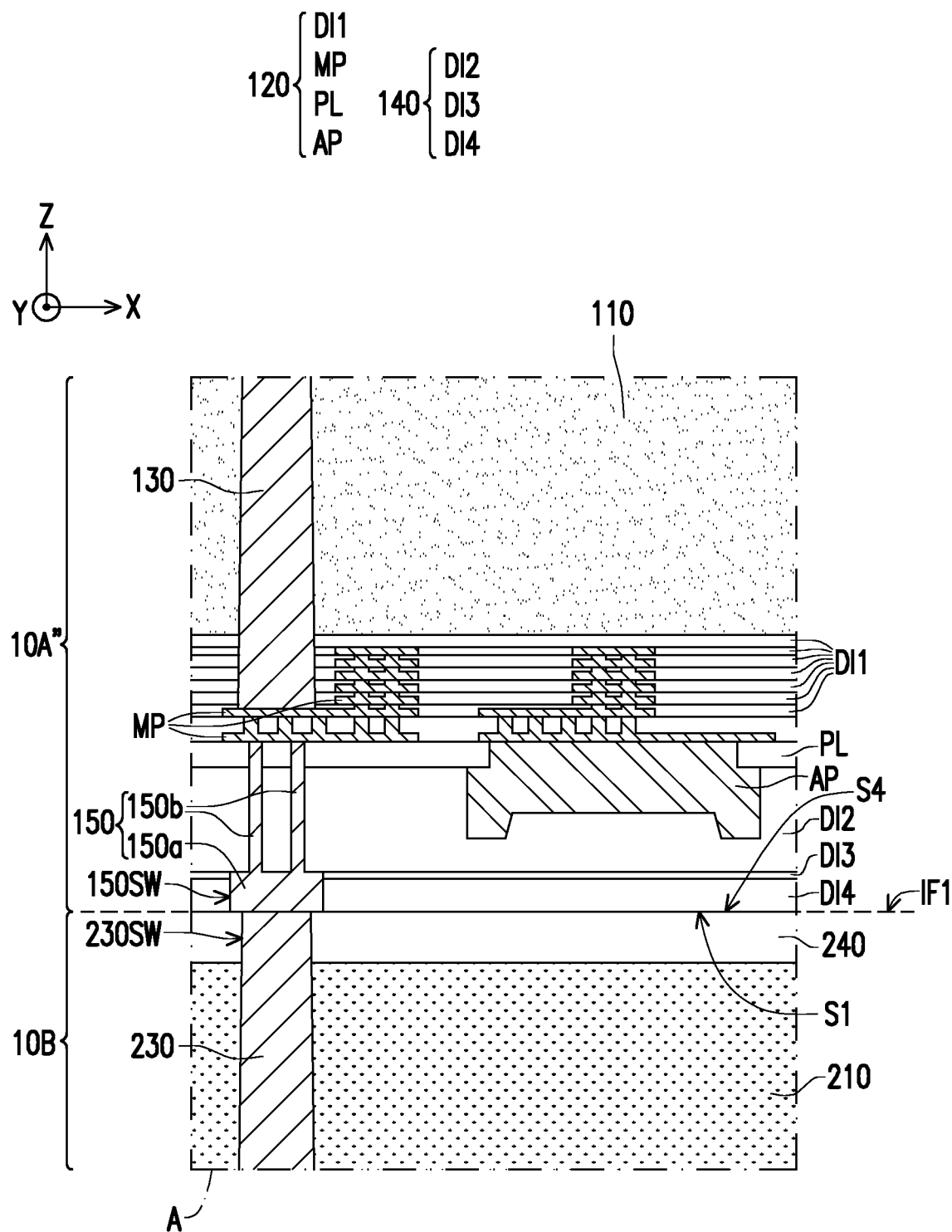
FIG. 26A is an enlarged and schematic cross-sectional view showing a bonding interface between a semiconductor die and a carrier die underlying thereto in a dashed area A outlined in FIG. 11 in accordance with some embodiments of the disclosure.
Figure 27A:
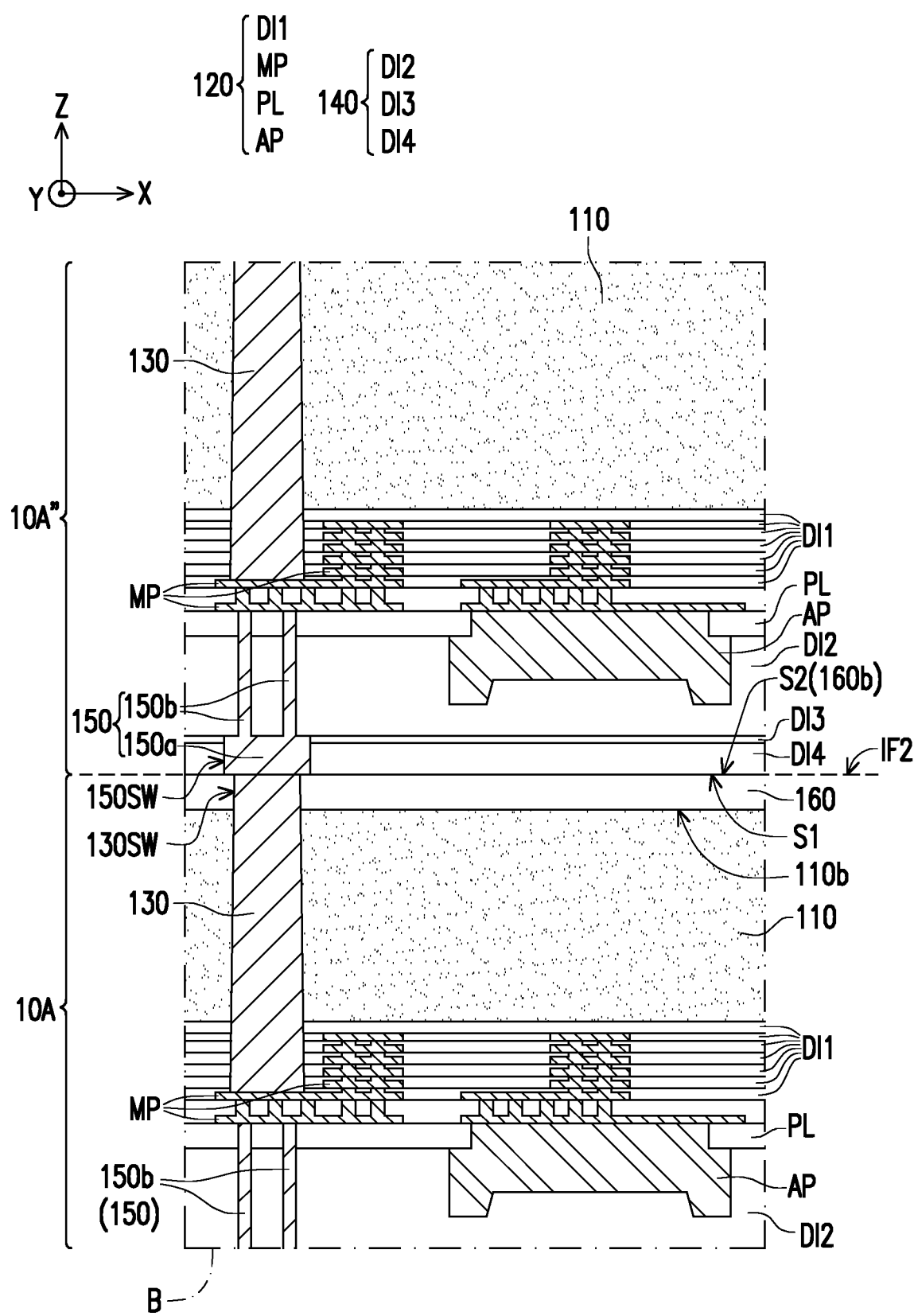
FIG. 27A is an enlarged and schematic cross-sectional view showing a bonding interface between adjacent tiers of a die stack in a dashed area B outlined in FIG. 17 in accordance with some embodiments of the disclosure.
Figure 28A:
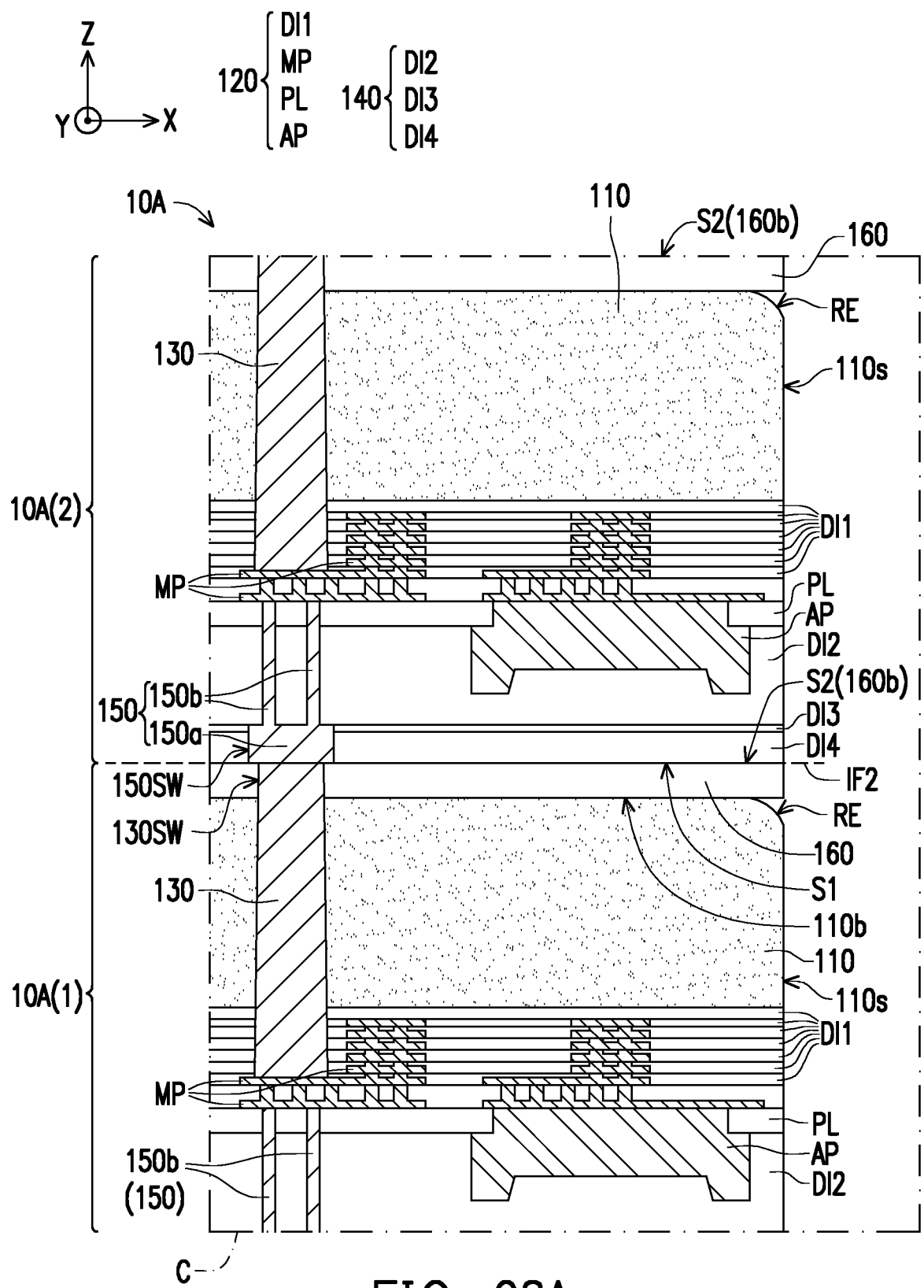
FIG. 28A is an enlarged and schematic cross-sectional view showing a bonding interface between adjacent tiers of a die stack in a dashed area C outlined in FIG. 19 in accordance with some embodiments of the disclosure.
Figure 29A:
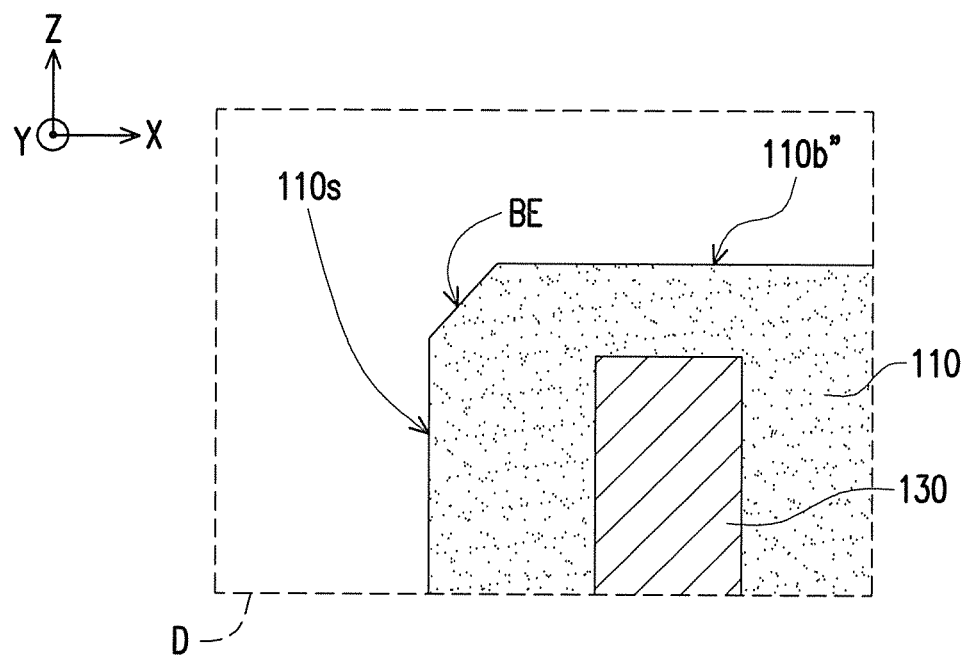
FIG. 29A is an enlarged and schematic cross-sectional view illustrating a configuration of an outermost tier of a die stack in a dashed area D outlined in FIG. 19 in accordance with some embodiments of the disclosure.

FIG. 5 through FIG. 24 are schematic cross-sectional views showing various stages in a manufacturing method of a semiconductor structure in accordance with some embodiments of the disclosure, and are taken along a cross-sectional line I-I depicted in FIG. 25. FIG. 25 is a schematic top view illustrating a relative position between a semiconductor die, a carrier die and an insulating encapsulation of a semiconductor structure in accordance with some embodiments of the disclosure. FIG. 26A is an enlarged and schematic cross-sectional view showing a bonding interface between a semiconductor die and a carrier die underlying thereto in a dashed area A outlined in FIG. 11 in accordance with some embodiments of the disclosure. FIG. 27A is an enlarged and schematic cross-sectional view showing a bonding interface between adjacent tiers of a die stack in a dashed area B outlined in FIG. 17 in accordance with some embodiments of the disclosure. FIG. 28A is an enlarged and schematic cross-sectional view showing a bonding interface between adjacent tiers of a die stack in a dashed area C outlined in FIG. 19 in accordance with some embodiments of the disclosure. FIG. 29A is an enlarged and schematic cross-sectional view illustrating a configuration of an outermost tier of a die stack in a dashed area D outlined in FIG. 19 in accordance with some embodiments of the disclosure. The manufacturing method of the semiconductor structure includes bonding a die stack (e.g., 100) to a carrier die (e.g., 10B), where forming the die stack involves the stacked semiconductor dies (e.g., 10A and 10A'). Like elements are designated with the same reference numbers for ease of understanding and the details thereof are not repeated herein, for simplicity.

Referring to FIG. 5, in some embodiments, at least one semiconductor die 10B' is provided. For example, a semiconductor wafer (not shown) is processed in a manner as described in FIG. 1 through FIG. 4 to generate individual semiconductor dies 10B', and thus the formation of the semiconductor dies 10B' is not repeated here for simplicity. The semiconductor dies 10B' each may include a structure similar to the semiconductor dies 10A". For example, each of the semiconductor dies 10B' has a front surface S3 and a bottom surface 210b' opposite to the front surface S3, and includes the semiconductor substrate 210 having semiconductor devices formed therein, the interconnect structure 220 formed over the semiconductor substrate 210 and including dielectric layers and metallization patterns proximal to the front surface S3, and the conductive vias 230 formed in the semiconductor substrate 210 and extending into the dielectric layers of the interconnect structure 220 to be in physical and electrical contact with the metallization pattern of the interconnect structure 220. The conductive vias 230 of each of the semiconductor dies 10B' may be electrically coupled to the semiconductor devices and the metallization patterns of the interconnect structure 220.

For illustrative purposes, only two semiconductor dies 10B' are shown in FIG. 5; however, the number of the semiconductor dies 10B' is not limited to the disclosure. The number of the semiconductor dies 10B' may be one or more than one based on the design layout and demand.

It should be noted that various layers and features of each of the semiconductor dies 10B' are omitted from the figures. For example, the interconnect structure 220 includes a passivation layer (not individually illustrated) formed over the top metallization pattern of the interconnect structure 220 in order to provide a degree of protection for the underlying structures. The passivation layer may be made of one or more suitable dielectric materials such as silicon oxide, silicon nitride, low-k dielectrics, polyimide, combinations of these, or the like. The conductive pads may be covered by the passivation layer at this point for protection.

It is appreciated that semiconductor dies diced from different semiconductor wafers may have different properties and functions. In some embodiments, the semiconductor dies 10B' and the semiconductor dies 10A" are singulated from different semiconductor wafers, and may be different in functions and properties. For example, the semiconductor dies 10B' depicted in FIG. 5 are logic dies (e.g., a system-on-a-chip (SoC), a central processing unit (CPU), a graphics processing unit (GPU), etc.). On the other hand, the semiconductor dies 10A" described in FIG. 4 are, for example, memory dies (e.g., a dynamic random access memory (DRAM) die, a static random access memory (SRAM) die, a synchronous dynamic random access memory (SDRAM), a NAND flash, etc.). As shown in FIG. 5, for example, two semiconductor dies 10B' are shown for illustration purposes; however, the number of the semiconductor dies 10B' is not limited to what is depicted in the disclosure, and may be selected and designated based on the demand and design layout.

Referring to FIG. 6 and FIG. 7, in some embodiments, the semiconductor dies 10B' are disposed on the temporary carrier TC2 through the temporary bonding layer TB2. For example, the semiconductor wafer including the semiconductor dies 10B' is probed and tested before singulating. After performing the singulation process, only known good semiconductor dies 10B' are picked and placed on the temporary carrier TC2. In some embodiments, the temporary bonding layer TB2 is deposited on the temporary carrier TC2, and the front surface S3 of each of the semiconductor dies 10B' is attached to the temporary carrier TC2 through the temporary bonding layer TB2. In alternative embodiments, the temporary bonding layer TB2 may be omitted. The formation and/or material of the temporary bonding layer TB2 and the temporary carrier TC2 are similar to the formation and/or material of the temporary bonding layer TB1 and the temporary carrier TC1 described in FIG. 2, thus are not repeated herein. As shown in FIG. 6, for example, the bottom surfaces 210b' of the semiconductor dies 10B' face upwardly for subsequent processing.

Thereafter, for each of the semiconductor dies 10B', a thinning process (e.g., etching, grinding, CMP process, or the like) is performed on the bottom surface 210b' of the semiconductor substrate 210 until the conductive vias 230 are exposed by a bottom surface 210b" of the semiconductor substrate 210 so as to form thinned semiconductor dies 10B". For example, after attaching the semiconductor dies 10B' to the temporary bonding layer TB2, the semiconductor dies 10B' are thinned to form the thinned semiconductor dies 10B" each having a thickness T3 approximately ranging from 5 μm to 100 μm. In some embodiments, the thickness T3 is less than the thickness T2. As shown in FIG. 7, in some embodiments, in each of the thinned semiconductor dies 10B", bottom surfaces 230b of the conductive vias 230 are accessibly exposed by the bottom surface 210b" of the semiconductor substrate 210. For example, in each thinned semiconductor dies 10B", the bottom surfaces 230b of the conductive vias 230 are substantially levelled with and coplanar to the bottom surface 210b" of the semiconductor substrate 210. In each of the thinned semiconductor dies 10B", the conductive vias 230, which penetrate through the semiconductor substrate 210, are referred to as through semiconductor vias (TSVs) or through silicon vias when the semiconductor substrate 210 is a silicon substrate.

Referring to FIG. 8, in some embodiments, the thinned semiconductor dies 10B" are recessed such that the conductive vias 230 are protruded from the semiconductor substrate 210. In other words, the semiconductor substrate 210 of each of the thinned semiconductor dies 10B" is partially removed to obtain a bottom surface 210b, and a portion of each of the conductive vias 230 protrudes out of the bottom surface 210b of the semiconductor substrate 210. After recessing, in the cross-section shown in FIG. 8, a plurality of recesses R1 are formed, where each of the recesses R1 is formed on the bottom surface 210b and between the protruded portions of two adjacent conductive vias 230. The recesses R1 each has a depth D1 approximately ranging from 0.5 μm to 1.5 μm (as measured along the stacked direction Z), for example.

During the recessing process, the semiconductor substrate 210 of each of the thinned semiconductor dies 10B" may be partially removed by etching. For example, the etching process has a high etch-rate selectivity to the material of the semiconductor substrate 210 over the material of the conductive vias 230 and the material of the temporary bonding layer TB2. For example, the removed amount of the semiconductor substrate 210 may be controlled by adjusting the etching time. In some embodiments, the conductive vias 230 and the temporary bonding layer TB2 may remain intact during recessing. The etching process may include a dry etching, a wet etching or a combination thereof. In some embodiments, a cleaning process is performed to remove residues of the etching process by using suitable solvent, cleaning chemical, or other cleaning techniques.

Figure 9:
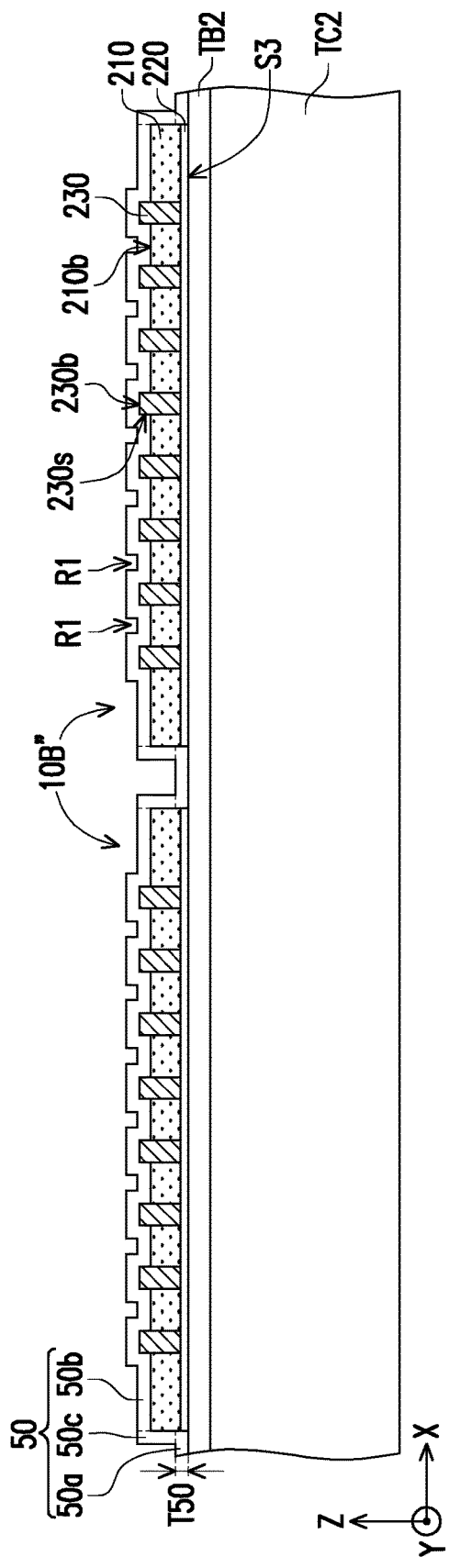

Referring to FIG. 9, in some embodiments, an isolation layer 50 is formed over the temporary carrier TC2 and on the thinned semiconductor dies 10B". In some embodiments, the isolation layer 50 includes a first lateral portion 50a, a second lateral portion 50b and a connecting portion 50c. For example, as shown in FIG. 9, the first lateral portion 50a is disposed on and extends over the temporary bonding layer TB2, the second lateral portion 50b is disposed on and extends over the bottom surfaces 210b of the semiconductor substrates 210 and the bottom surfaces 230b and sidewalls 230s of the conductive vias 230, and the connecting portion 50c is disposed on the first lateral portion 50a and extended to be in contact with the second lateral portion 50b. In some embodiments, the isolation layer 50 has a thickness T50 approximately ranging from 0.5 μm to 1.6 μm, where the thickness T50 is measured with a minimum distance between to opposite sides of the isolation layer 50. As shown in FIG. 9, the second lateral portion 50b fills the recesses R1. In one embodiment, the thickness T50 is greater than the depth D1, however the disclosure is not limited thereto. In an alternative embodiment, the thickness T50 is substantially equal to the depth D1. In other words, the isolation layer 50 is thick enough to cover the protruded portions of the conductive vias 230.

In some embodiments, the first lateral portion 50a and the second lateral portion 50b are extended laterally, such as along a direction X and/or a direction Y depicted in FIG. 9. For example, the direction X is different from direction Y, and the directions X and Y are independently perpendicular to the stacking direction Z. In some embodiments, the connecting portion 50c is extended vertically to connect the first lateral portion 50a and the second lateral portion 50b. For example, the connecting portion 50c may be extended upwards in a manner of straight-form as shown in FIG. 9.

Figure 15:
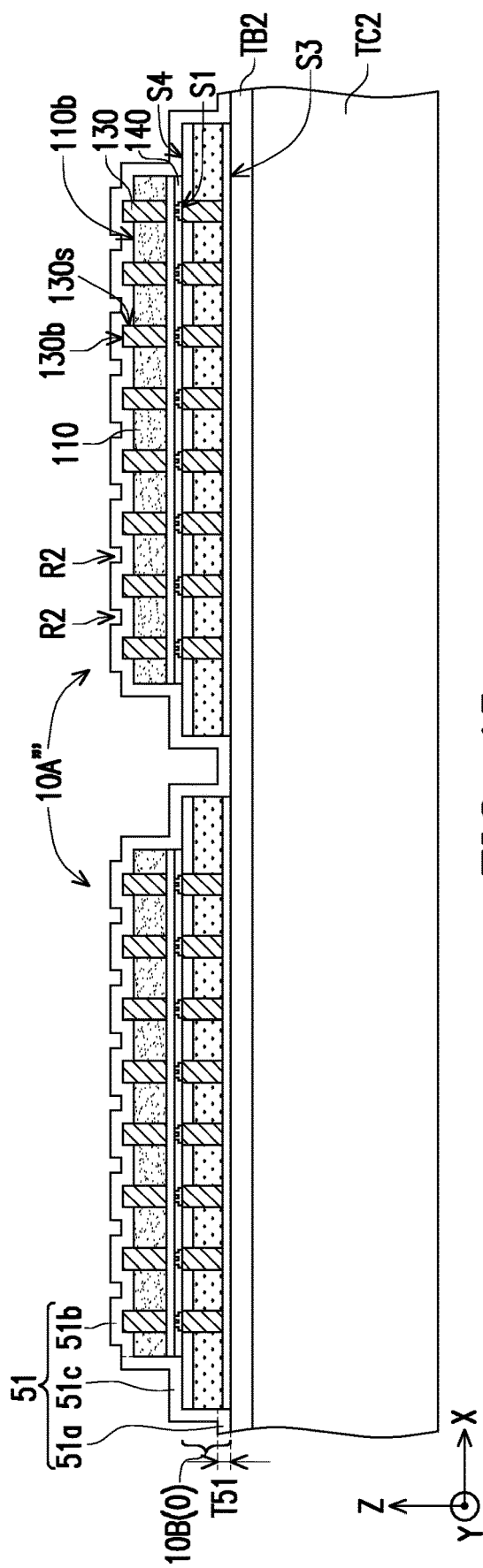

However, the connecting portion 50c may be extended upwards in a manner of step-form (e.g., a connecting portion 51c in FIG. 15).

In some embodiments, the isolation layer 50 may be conformally formed over the temporary carrier TC2 by, for example, spin-coating, a chemical vapor deposition (CVD) process, or the like. In some embodiments, a material of the isolation layer 50 may include a nitride (such as silicon nitride), an oxide (such as silicon oxide) or the like (such as, silicon oxynitride, silicon carbide, a polymer, the like). Alternatively, a native oxide that may be formed on the bottom surface 210 of the semiconductor substrate 210 of each thinned semiconductor die 10B" before the formation of the isolation layer 50. As shown in FIG. 9, for example, the portions of the conductive vias 230 protruded from the bottom surfaces 210b of the semiconductor substrates 210 are wrapped around by the second lateral portion 50b of the isolation layer 50.

Figure 10:
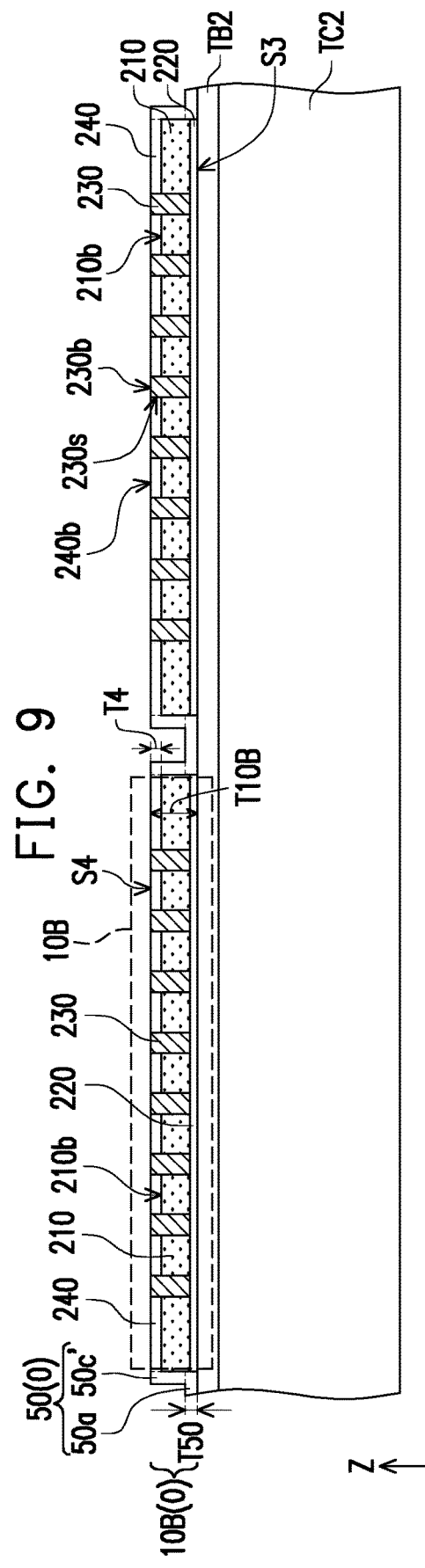

Referring to FIG. 9 and FIG. 10 together, in some embodiments, the isolation layer 50 is partially removed to expose the conductive vias 230. In such embodiments, the isolation layer 50 is patterned via a planarizing process, where one first lateral portion 50a and a planarized connecting portion 50c' connected thereto together constitutes one isolation structure 50(0), and the second lateral portion 50b of the isolation layer 50 is planarized to form an isolation layer 240 disposed on the bottom surface 210b. The planarizing process may include a CMP process or the like, for example. Up to here, the carrier dies 10B are manufactured. In some embodiments, a thickness T10B of the carrier dies 10B each approximately ranges from 3 μm to 90 μm. In some embodiments, the thickness T10B is less than or substantially equal to the thickness T3. In the disclosure, the carrier dies 10B each are referred to as a base tier 10B(0) for one die stack, in the semiconductor structure P1a. It should be noted that various layers and features of the semiconductor dies are omitted from the figures, and the carrier dies 10B may include more elements formed therein to perform different functions.

In some embodiments, for each carrier die 10B as shown FIG. 10, the isolation layer 240 accessibly reveals the conductive vias 230 for further electrical connection. In some embodiments, a thickness T4 of the isolation layer 240 of the carrier die 10B approximately ranges from 0.3 μm to 1 μm. After the planarizing process, a cleaning process may be optionally performed, for example to clean and remove the residue generated from the planarizing process. However, the disclosure is not limited thereto, and the planarizing process may be performed through any other suitable method. In some embodiments, during planarizing the isolation layer 50, the conductive vias 230 may also be planarized. In some embodiments, the thickness T50 of the isolation layer 50 is greater than or substantially equal to the depth D1 of the recesses R1, and the thickness T4 of the isolation layer 240 is less than or substantially equal to the depth D1 of the recesses R1.

In some embodiments, a bottom surface 240b of the isolation layer 240 is substantially levelled with the bottom surfaces 230b of the conductive vias 230. That is, the surface 240b of the isolation layer 240 is substantially coplanar to the bottom surfaces 230b of the conductive vias 230. In some embodiments, the portion of each of the conductive vias 230 protruding from the bottom surface 210b of the semiconductor substrate 210 is laterally covered by the isolation layer 240, and the bottom surfaces 230b of the conductive vias 230 are accessibly exposed by the isolation layer 240, as shown in FIG. 10. With such planarization, the carrier dies 10B are formed and separated from one another through the isolation structures 50(0), in some embodiments. In the disclosure, the carrier dies 10B each has the front surface S3 and a back surface S4 (e.g., the bottom surface 240b), the back surface S4 is opposite to the front surface S3, as shown in FIG. 10, for example.

Figure 11:
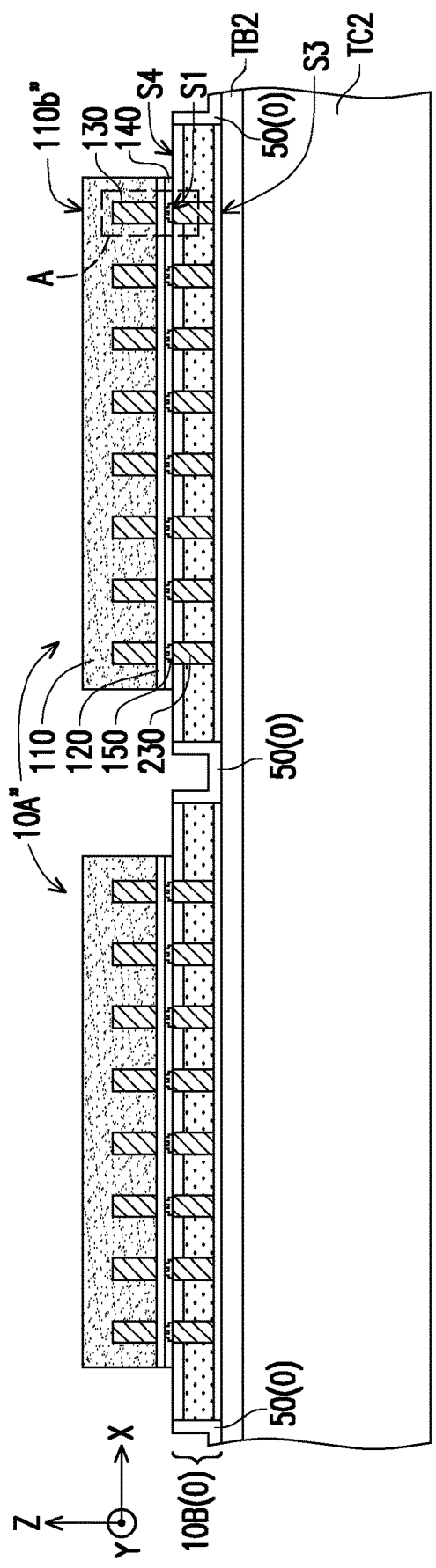

Referring to FIG. 11, in some embodiments, a first set of the semiconductor dies 10A" are provided, where these semiconductor dies 10A" are stacked on the semiconductor dies 10B. For example, the semiconductor dies 10A" and the carrier dies 10B are separately fabricated as respectively described in conjunction with FIG. 1 through FIG. 4 and FIG. 5 through FIG. 10. In some embodiments, the semiconductor dies 10A" may be removed from the tape frame TP1 (shown in FIG. 4) to be mounted on the carrier dies 10B by using, for example, a pick-and-place process or other suitable attaching techniques. The semiconductor dies 10A" may be tested before bonding, so that only known good die (KGD) is used for attaching. In the disclosure, the semiconductor dies 10A" and the carrier dies 10B are bonded together in a face-to-back configuration. As shown in FIG. 11, for example, the front surfaces S1 of the semiconductor dies 10A" face toward the back surfaces S4 of the carrier dies 10B, respectively.

For illustrative purposes, only one semiconductor die 10A" is disposed on one carrier die 10B are shown in FIG. 11; however, the number of the semiconductor die 10A" disposed on one carrier die 10B is not limited to the disclosure. The number of the semiconductor die 10A" may be one or more than one based on the design layout and demand. For example, in alternative embodiments, a plurality of semiconductor die 10A" are disposed on one carrier die 10B underlying thereto (see FIG. 45).

In some embodiments, a bonding process is performed to bond the semiconductor dies 10A" to the carrier dies 10B. For example, as shown in FIG. 11 and FIG. 26A (illustrating an enlarged cross-sectional view indicated by the dashed box A of FIG. 11), a bonding interface IF1 between one semiconductor die 10A" and a respective underlying carrier die 10B includes metal-to-metal bonding (e.g., copper-to-copper bonding) and dielectric-to-dielectric bonding (e.g., oxide-to-oxide bonding, oxide-to-nitride bonding, or nitride-to-nitride bonding). That is, the bonding process includes a hybrid bonding process. For example, the bonding conductor 150 of the semiconductor die 10A" and the conductive via 230 of the carrier die 10B are bonded together through copper-to-copper bonding (known as a direct metal-to-metal bonding), and the dielectric layer 140 (e.g. the dielectric layer DI4) of the semiconductor die 10A" and the isolation layer 240 of the carrier die 10B are bonded together through oxide-to-nitride bonding (known as a direct dielectrics-to-dielectrics bonding). In the disclosure, the bonding interface IF1 may be referred to as a hybrid bonding interface.

It should be noted that bonding methods described above are merely examples and are not intended to be limiting. In some embodiments, an offset is between a sidewall 150SW of the bonding conductor 150 and a sidewall 230SW of the conductive via 230 underlying thereto, as shown in FIG. 26A. In other words, since the bonding conductor 150 has a larger bonding surface than the conductive vias 230, direct metal-to-metal bonding may still be achieved even if misalignment occurs, thereby exhibiting better reliability. In some embodiments in which the dimensions of conductive vias 230 are greater than those of corresponding bonding conductors 150, the dielectric layers 140 of the semiconductor dies 10A" immediately adjacent to the bonding conductors 150 may be bonded to a portion of the conductive vias 230 of the carrier dies 10B.

In some embodiments, the conductive vias 130 may be tapered from the interconnect structure 120 to the bottom surface 110b". Alternatively, for example, as shown in FIG. 11 and FIG. 26A, the conductive vias 130 has substantially vertical sidewalls. In a cross-sectional view along the stacking direction Z, the shape of the conductive vias 130 may depend on the design requirements, and is not intended to be limiting in the disclosure. On the other hand, in a top (plane) view on a X-Y plane, the shape of the conductive vias 130 may depend on the design requirements, and may be a circular shape, an oval shape, a rectangular shape, a polygonal shape, or combinations thereof; the disclosure is not limited thereto. Similar geometric specifications may also applied on the conductive vias 230 of the carrier dies, and thus are not repeated therein.

Figure 26B:
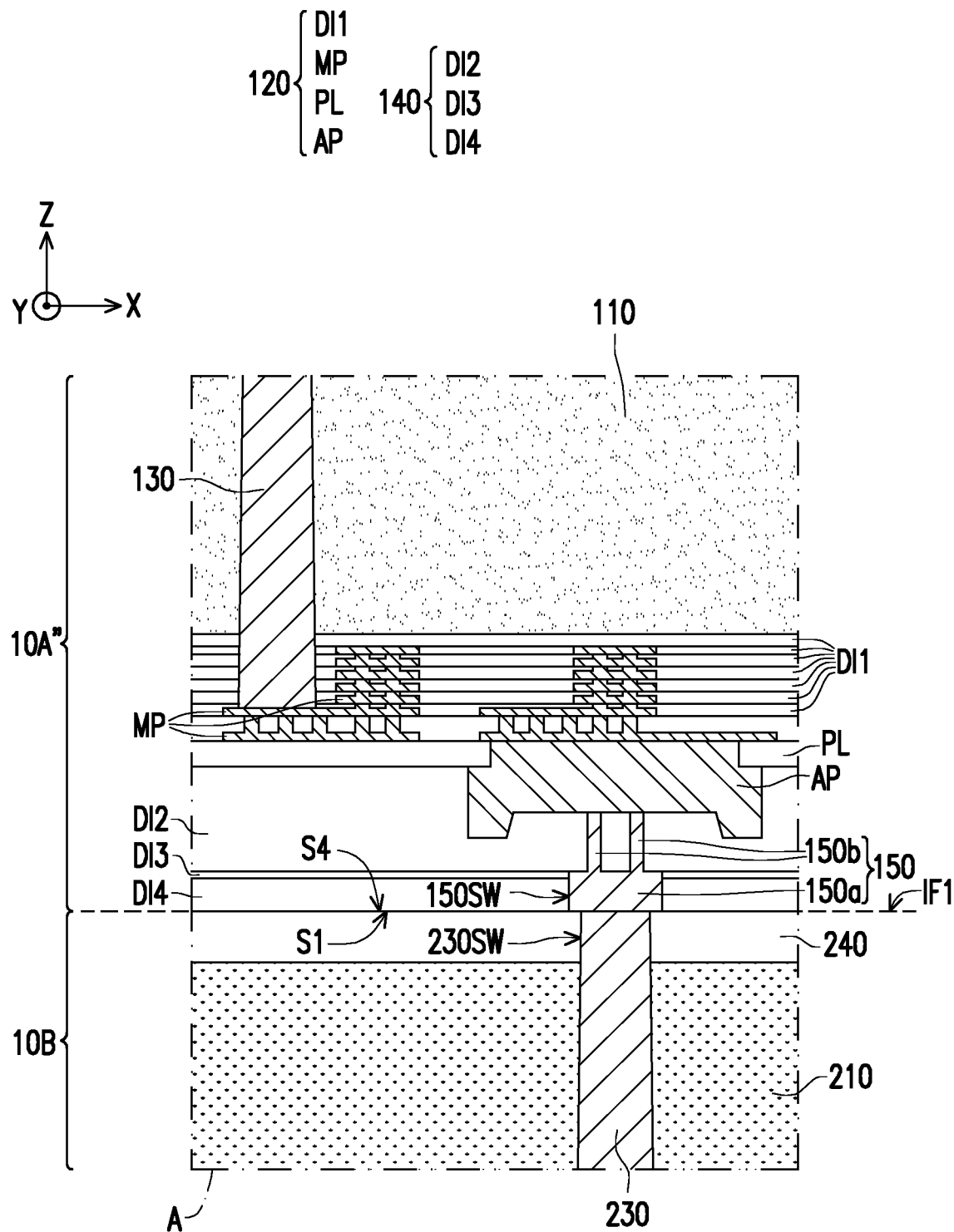
FIG. 26B is an enlarged and schematic cross-sectional view showing a bonding interface between a semiconductor die and a carrier die underlying thereto in accordance with some embodiments of the disclosure.

Each bonding conductor 150 of one semiconductor die 10A" distributed at the front surface S1 is in physical and electrical contact with the respective one conductive via 230 of the semiconductor die 10B underlying thereto, as shown in FIG. 11 and FIG. 26A, for example. In some embodiments, as illustrated in FIG. 26A, such bonding conductor 150 is in physical and electrical contact with the respective metallization patterns MP overlying thereto. However, the disclosure is not limited thereto; in an alternative embodiment, such bonding conductor 150 may be in physical and electrical contact with a respective conductive pad AP overlying thereto, as illustrated in FIG. 26B.

Figure 12:
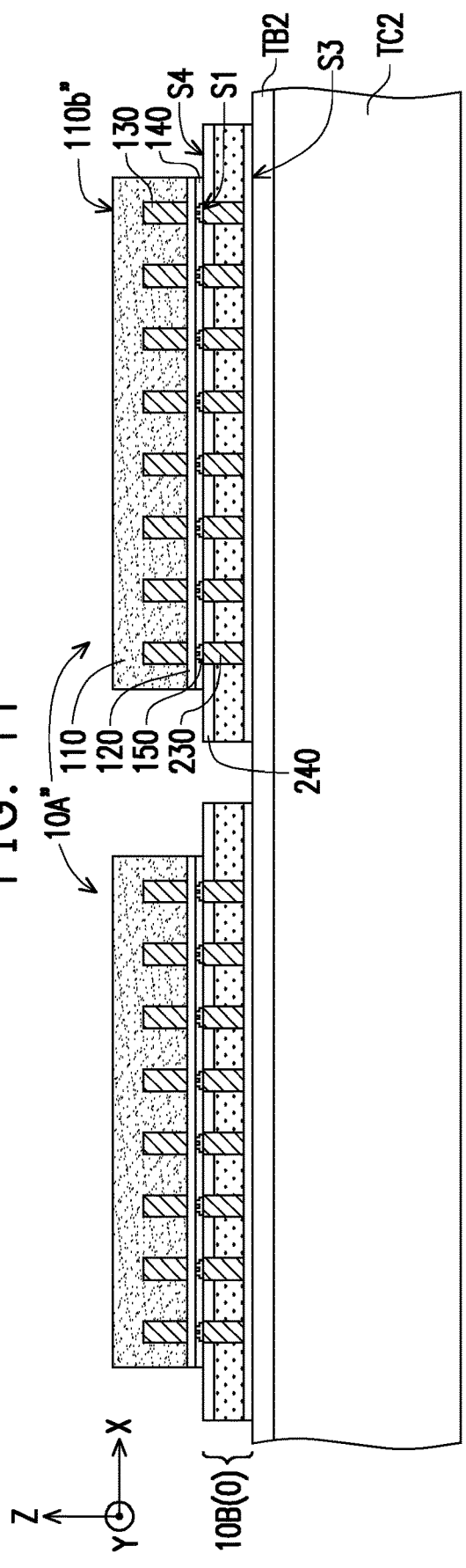

Referring to FIG. 12, in some embodiments, the isolation structures 50(0) are removed from the temporary carrier TC2. For example, the isolation structures 50(0) may be removed by etching or the like; the disclosure is not limited thereto. The etching process, for example, may include dry etching, wet etching, or a combination thereof. In one embodiment, during the removal of the isolation structures 50(0), the isolation layer 240 of each carrier die 10B being exposed by the overlying semiconductor die 10A" is remained, as shown in FIG. 12. However, in an alternative embodiment, during the removal of the isolation structures 50(0), the isolation layer 240 of each carrier die 10B being exposed by the overlying semiconductor die 10A" may be removed simultaneously.

Figure 13:
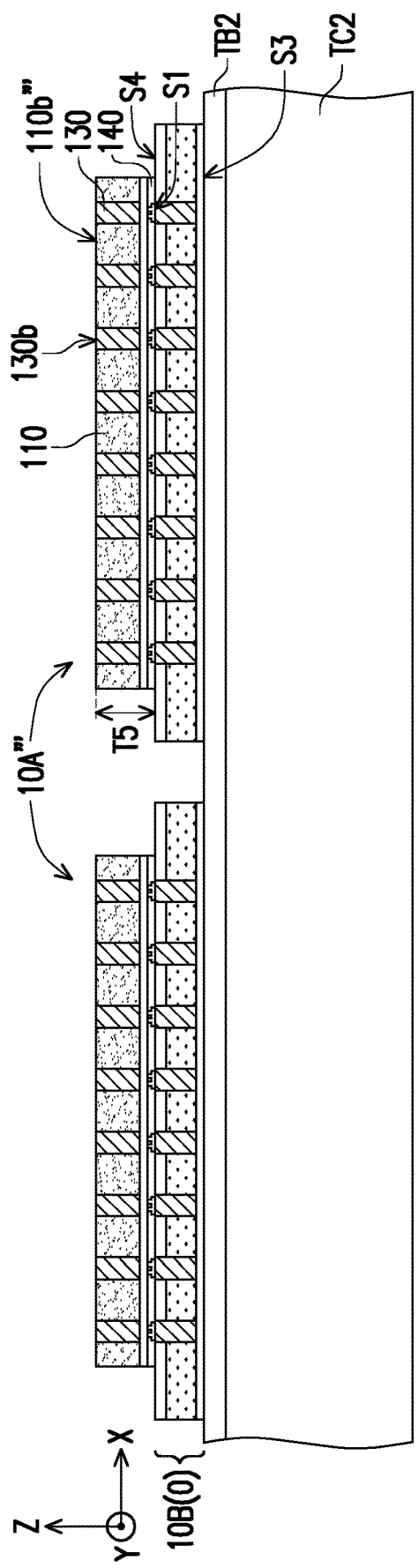

Referring to FIG. 12 and FIG. 13 together, in some embodiments, the thinning process (e.g., grinding, CMP, or the like) may be performed on the bottom surfaces 110b" of the semiconductor dies 10A" to form thinned semiconductor dies 10A'''. In some embodiments, the conductive vias 130 are exposed by bottom surfaces 110b''' of the thinned semiconductor dies 10A'''. That is, after bonding the semiconductor dies 10A" to the carrier dies 10B, the semiconductor dies 10A" are thinned to form the thinned semiconductor dies 10A''' having a thickness T5 approximately ranging from 40 μm to 200 μm. As shown in FIG. 13, for example, in each of the thinned semiconductor dies 10A''', bottom surfaces 130b of the conductive vias 130 are accessibly exposed by the bottom surface 110b''' of the semiconductor substrate 110. For example, in each thinned semiconductor dies 10A''', the bottom surfaces 130b of the conductive vias 130 are substantially levelled with and coplanar to the bottom surface 110b''' of the semiconductor substrate 110. In each of the thinned semiconductor dies 10A''', since the conductive vias 130 extend through the semiconductor substrate 110, the conductive vias 130 are referred to as through semiconductor vias (TSVs) or through silicon vias when the semiconductor substrate 110 is a silicon substrate.

Figure 14:
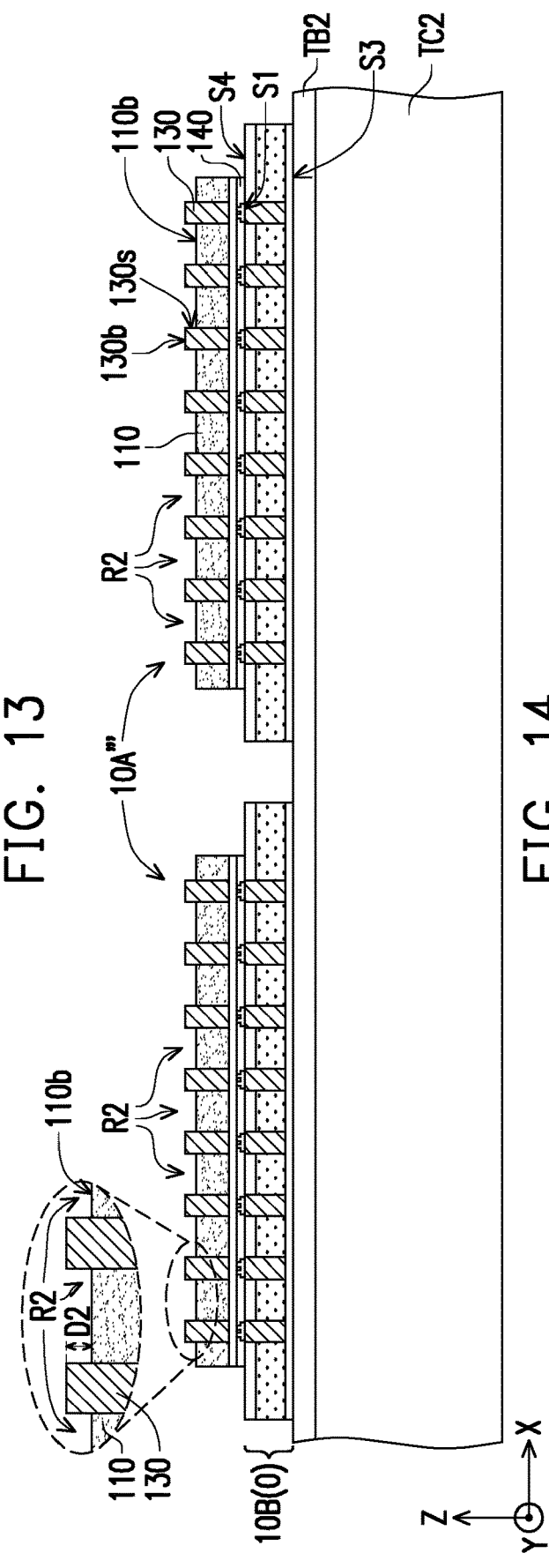

Referring to FIG. 14, in some embodiments, the thinned semiconductor dies 10A''' are recessed such that the conductive vias 130 are protruded from the semiconductor substrate 110. In other words, the semiconductor substrate 110 of each of the thinned semiconductor dies 10A''' is partially removed to obtain a bottom surface 110b, and a portion of each of the conductive vias 130 is protrudes out of the bottom surfaces 110b of the semiconductor substrate 110. After recessing, in the cross-section shown in FIG. 14, a plurality of recesses R2 are formed, where each of the recesses R2 is formed on the bottom surface 110b and between the protruded portions of two adjacent conductive vias 130. The recesses R2 each has a depth D2 approximately ranging from 0.5 μm to 1.5 μm (as measured along the stacked direction Z), for example. The recessing process is similar to the process described in conjunction with FIG. 8, and thus is not repeated herein.

Referring to FIG. 15, in some embodiments, an isolation layer 51 is formed over the temporary carrier TC2. In some embodiments, the isolation layer 51 includes a first lateral portion 51a, a second lateral portion 51b and a connecting portion 51c. For example, as shown in FIG. 15, the first lateral portion 51a is disposed on and extends over the temporary bonding layer TB2, the second lateral portion 51b is disposed on and extends over the bottom surfaces 110b of the semiconductor substrates 110 and the bottom surfaces 130b and sidewalls 130s of the conductive vias 130, and the connecting portion 51c is disposed on the first lateral portion 51a and extended to be in contact with the second lateral portion 51b. In some embodiments, the isolation layer 51 has a thickness T51 approximately ranging from 0.5 μm to 1.6 μm, where the thickness T51 is measured with a minimum distance between to opposite sides of the isolation layer 51. As shown in FIG. 15, the second lateral portion 51b fills the recesses R2. In one embodiment, the thickness T51 is greater than the depth D2, however the disclosure is not limited thereto. In an alternative embodiment, the thickness T51 is substantially equal to the depth D2. In other words, the isolation layer 51 is thick enough to cover the protruded portion of each of the conductive vias 130. As shown in FIG. 15, for example, the portions of the conductive vias 130 protruded from the bottom surface 110b of the semiconductor substrate 110 are wrapped around by the second lateral portion 51b of the isolation layer 51.

In some embodiments, the first lateral portion 51a and the second lateral portion 51b are extended laterally, such as along the direction X and/or the direction Y, and the connecting portion 51c may be extended upwards in a manner of step-form, such as along the stacking direction Z in addition to the direction X and/or the direction Y, as shown in FIG. 15. The formation and material of the isolation layer 51 may be the same as the forming process of isolation layer 50 as described in FIG. 9, and thus are not repeated herein. In one embodiment, the thickness T51 of the isolation layer 51 may be the same as the thickness T50 of the isolation layer 50. In an alternative embodiment, the thickness T51 of the isolation layer 51 may be different from the thickness T50 of the isolation layer 50.

Figure 16:
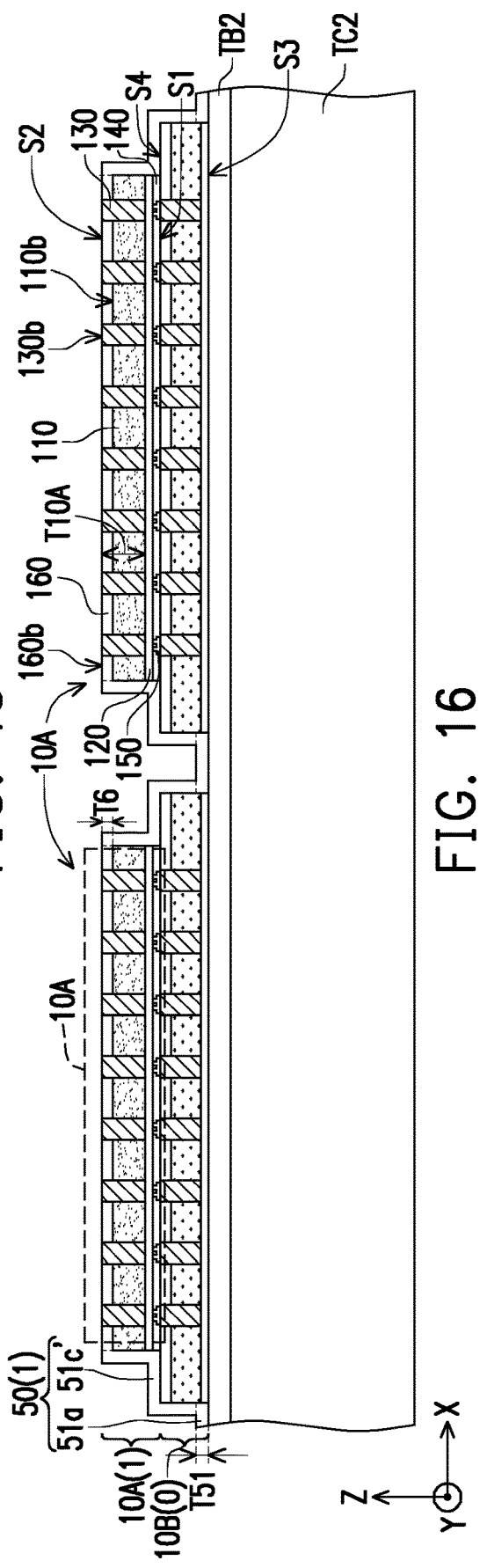

Referring to FIG. 15 and FIG. 16 together, in some embodiments, the isolation layer 51 is partially removed to expose the conductive vias 130. In such embodiments, the isolation layer 51 is planarized, where one first lateral portion 51a and a planarized connecting portion 51c' connected thereto together constitutes one isolation structure 50(1), and the second lateral portion 51b of the isolation layer 51 is planarized to form an isolation layer 160 disposed on the bottom surface 110b. The planarized process may include by a CMP process or the like, for example. Up to here, the semiconductor dies 10A are manufactured. In some embodiments, a thickness T10A of the semiconductor dies 10A approximately ranges from 3 μm to 50 μm. In some embodiments, the thickness T10A is less than or substantially equal to the thickness 15. In the disclosure, the semiconductor dies 10A are referred to as a first tier 10A(1) of the die stack, in the semiconductor structure P1a. It should be noted that various layers and features of the semiconductor dies are omitted from the figures, and the semiconductor dies 10A may include more elements formed therein to perform different functions.

In some embodiments, as shown in FIG. 16, the isolation layer 160 accessibly reveals the conductive vias 130 for further electrical connection. In some embodiments, a thickness T6 of the isolation layer 160 approximately ranges from 0.3 μm to 1 μm. After the planarizing process, a cleaning process may be optionally performed, for example to clean and remove the residue generated from the planarizing process. However, the disclosure is not limited thereto, and the planarizing process may be performed through any other suitable method. In some embodiments, during planarizing the isolation layer 51, the conductive vias 130 may also be planarized. In some embodiments, the thickness T51 of the isolation layer 51 is greater than or substantially equal to the depth D2 of the recesses R2, and the thickness T6 of the isolation layer 160 is less than or substantially equal to the depth D2 of the recesses R2.

In some embodiments, a bottom surface 160b of the isolation layer 160 is substantially levelled with the bottom surfaces 130b of the conductive vias 130. That is, the surface 160b of the isolation layer 160 is substantially coplanar to the bottom surfaces 130b of the conductive vias 130. In some embodiments, the portion of each of the conductive vias 130 protruding from the bottom surface 110b of the semiconductor substrate 110 is laterally covered by the isolation layer 160, and the bottom surfaces 130b of the conductive vias 130 are accessibly exposed by the isolation layer 160, as shown in FIG. 16. With such planarization, the semiconductor dies 10A are formed and separated from one another through the isolation structures 50(1), in some embodiments. In the disclosure, the semiconductor dies 10A each has the front surface S1 and a back surface S2 (e.g., the bottom surface 160b), the back surface S2 is opposite to the front surface S1, as shown in FIG. 16, for example. That is, for example, the front surfaces S1 of the semiconductor dies 10A (e.g. the first tier 10A(1) of the die stack) face toward and are bonded to the back surfaces S4 of the carrier dies 10B (e.g. the base tiers 10B(0) for the die stacks), respectively.

Figure 17:
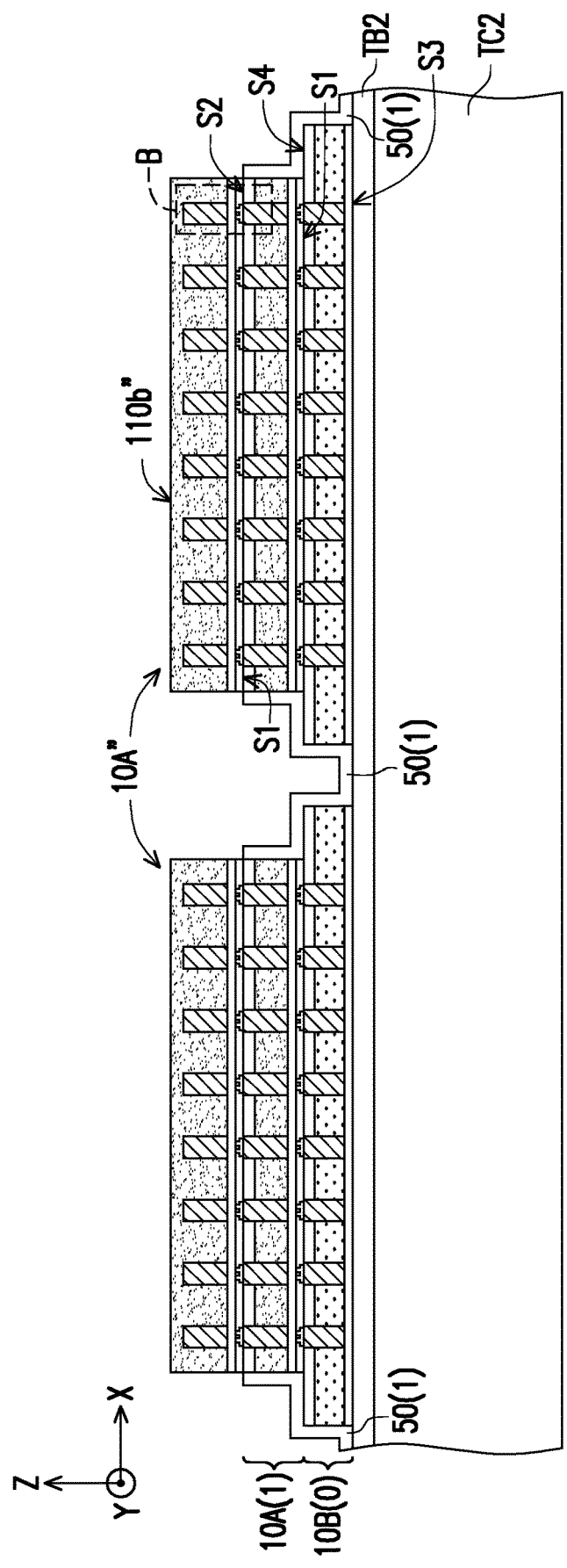

Referring to FIG. 17, in some embodiments, a second set of the semiconductor dies 10A" are provided, and these semiconductor dies 10A" are respectively stacked on the semiconductor dies 10A of the first tier 10A(1). In the disclosure, each semiconductor die 10A" (from the second set) is disposed on one of the semiconductor dies 10A of the first tier 10A(1) in a face-to-back configuration for forming a second tier (e.g. 10A(2) depicted in FIG. 18) of the die stack. For example, the front surfaces S1 of the semiconductor dies 10A" (from the second set) face toward the back surfaces S2 of the semiconductor dies 10A of the first tier 10A(1), respectively. Similar to the process as described in FIG. 11, before removing from the tape frame TP1 (shown in FIG. 4) to be mounted on the semiconductor dies 10A of the first tier 10A(1), the semiconductor dies 10A" may be tested before bonding, so that only known good die (KGD) is used for attaching.

In some embodiments, a bonding process is performed, via hybrid bonding, to bond the semiconductor dies 10A" to the semiconductor dies 10A. For example, as shown in FIG. 17 and FIG. 27A (illustrating an enlarged cross-sectional view indicated by the dashed box B of FIG. 17), a bonding interface IF2 between one semiconductor die 10A" and a respective underlying semiconductor dies 10A includes metal-to-metal bonding (e.g., copper-to-copper bonding) and dielectric-to-dielectric bonding (e.g., oxide-to-oxide bonding, oxide-to-nitride bonding, or nitride-to-nitride bonding). For example, the bonding conductor 150 of the semiconductor die 10A" and the conductive via 130 of the semiconductor die 10A are bonded together through copper-to-copper bonding (known as a direct metal-to-metal bonding), and the dielectric layer 140 (e.g. the dielectric layer DI4) of the semiconductor die 10A" and the isolation layer 160 of the semiconductor dies 10A are bonded together through oxide-to-nitride bonding (known as a direct dielectrics-to-dielectrics bonding). In the disclosure, the bonding interface IF2 may be referred to as a hybrid bonding interface.

It should be noted that bonding methods described above are merely examples and are not intended to be limiting. As shown in FIG. 27A, for example, an offset is between a sidewall 150SW of the bonding conductor 150 and a sidewall 130SW of the conductive via 130 underlying thereto. In other words, since the bonding conductor 150 has a larger bonding surface than the conductive vias 130, direct metal-to-metal bonding may still be achieved even if misalignment occurs, thereby exhibiting better reliability. In some embodiments in which the dimensions of conductive vias 130 are greater than those of corresponding bonding conductors 150, the dielectric layers 140 of the semiconductor dies 10A" immediately adjacent to the bonding conductors 150 may further be bonded to a portion of the conductive vias 130 of the semiconductor dies 10A, such as a metal-to-dielectrics bonding.

Figure 27B:
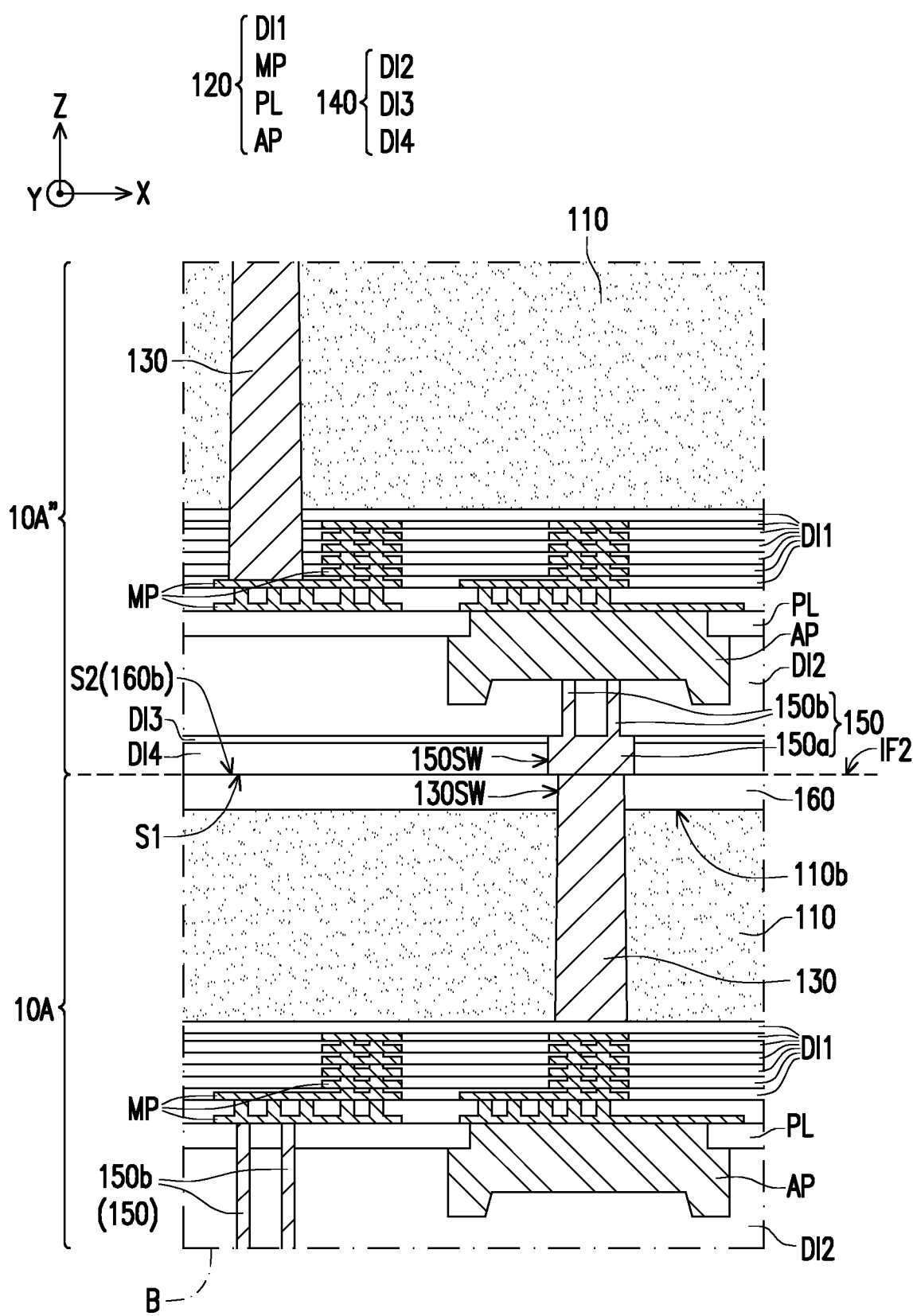
FIG. 27B is an enlarged and schematic cross-sectional view showing a bonding interface between adjacent tiers of a die stack in accordance with some embodiments of the disclosure.

Each bonding conductor 150 of one semiconductor die 10A" distributed at the front surface S1 is in physical and electrical contact with the respective one conductive via 130 of the semiconductor die 10A underlying thereto, for example, as shown in FIG. 17 and FIG. 27A. In some embodiments, as illustrated in FIG. 27A, such bonding conductor 150 is in physical and electrical contact with the respective metallization patterns MP overlying thereto. However, the disclosure is not limited thereto; in an alternative embodiment, such bonding conductor 150 may be in physical and electrical contact with a respective conductive pad AP overlying thereto, see FIG. 27B.

Figure 18:
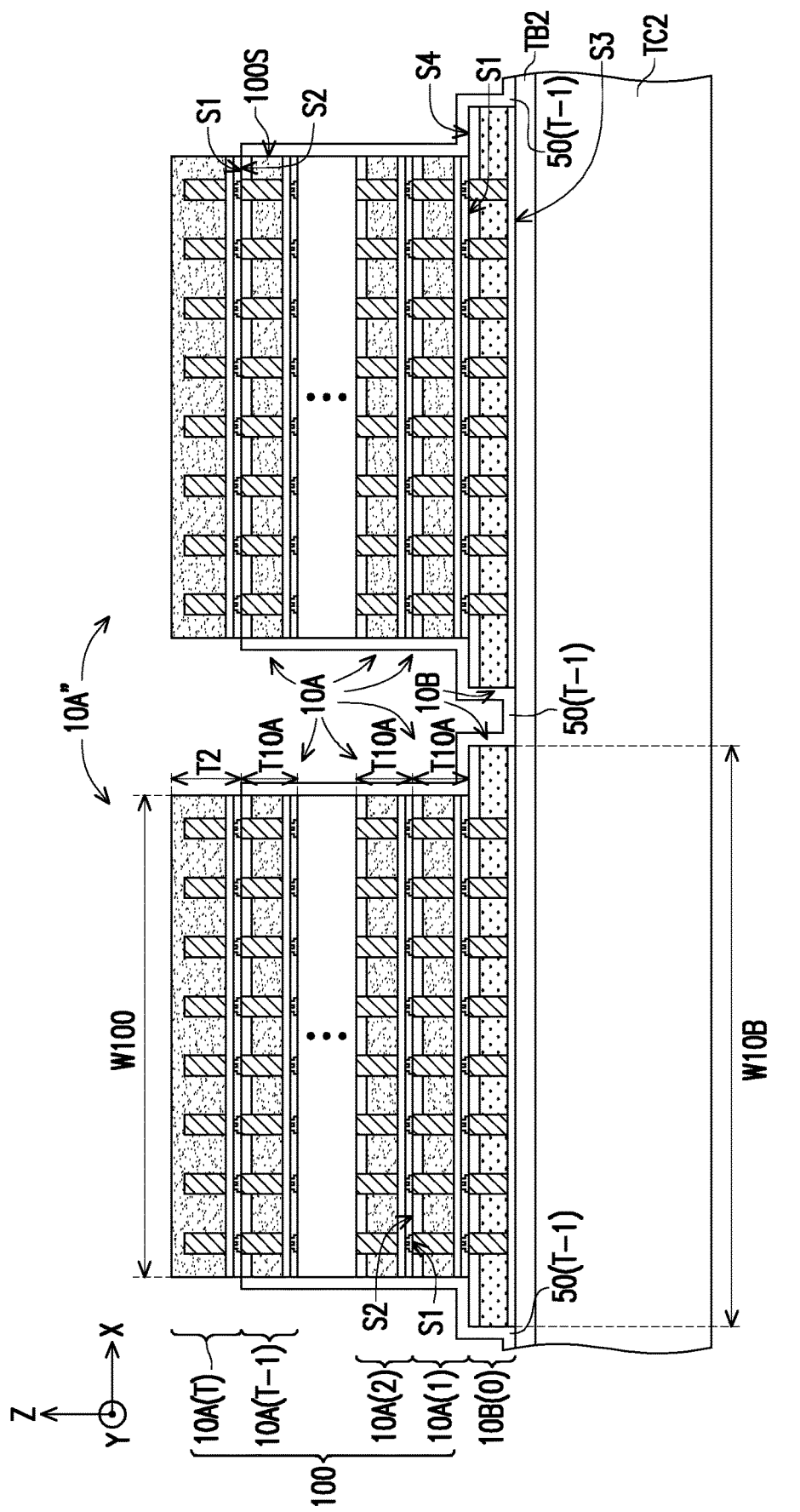

Referring to FIG. 18, in some embodiments, the steps described in FIG. 12 through FIG. 17 are repeated to form the die stacks 100 over the carrier dies 10B of the base tiers 10B(0). As shown in FIG. 18, each die stack 100 is located on one carrier die 10B underlying thereto. In some embodiments, the die stacks 100 each include a topmost tier 10A(T), where the topmost tier 10A(T) includes the semiconductor die 10A" depicted in FIG. 4. It should be appreciated that the symbol T indicates the number of tiers for each die stack 100, and the die stacks 100 respectively disposed on the base tiers 10B(0) each may include any number of tiers. For example, T is an integer greater than 1. For example, as shown in FIG. 18, the semiconductor die 10A" has the conductive vias 130 not be revealed. In some embodiments, the semiconductor die 10A" of the topmost tier 10A(T) is thicker than any one of the underlying semiconductor dies 10A of the inner tiers (e.g. 10A(1) to 10A(T-1)) in each of the die stacks 100. For example, the thickness T2 of the semiconductor die 10A" of the topmost tier 10A(T) is greater than the thickness T10A of one tier of the other semiconductor dies 10A of the inner tiers (e.g. 10A(1) to 10A(T−1)).

For example, in each die stack 100, the semiconductor dies 10A at the second tier 10A(2) is fabricated by performing the method described in conjunction with FIG. 13 to FIG. 16 on the structure depicted in FIG. 17, and thus the semiconductor dies 10A at the first tier 10A(1) and at the second tier 10A(2) may be similar or the same in configurations, functions, and properties. That is, the semiconductor dies 10A at the first tier 10A(1) through the (T−1)th tier 10A(T−1) of each die stack 100 may be similar or the same in configurations, functions, and properties due to the similar forming steps are utilized. For example, the die stacks 100 each have a sidewall 100S with a flat surface. In some embodiments, along the direction X, a width W10B of each carrier die 10B is greater than a width W100 of (each semiconductor dies 10A/10A" of) each die stack 100. As shown in FIG. 18, in some embodiments, an offset is between the sidewall 100S of one die stack 100 and a sidewall S5 of the carrier dies 10B underlying thereto.

In some embodiments, the semiconductor dies (e.g., 10A and 10A") of the tiers (e.g., the inner tiers such as 10A(1)/10A(2) . . . 10A(T−1) and the topmost tier 10A(T)) may be tested before bonding, so that only known good dies (KGDs) are used to form the die stacks 100, thereby increasing manufacturing yield. In some embodiments in which the semiconductor dies (e.g., 10A and 10A") are memory dies, since the semiconductor dies stacked and bonded vertically, faster inter-memory communication may be achieved by the die stacks 100 during operation, which in turn may improve data bandwidth and enable faster data access and data storage. In some embodiments, during operation, the semiconductor die at the first tier 10A(1) may help to manage data storage and data format interoperability between the respective semiconductor dies at the other tiers (e.g., 10A(2) through 10A(T−1) and 10A(T)) stacked thereon and/or the carrier die 10B at the base tier 10B(0).

In some embodiments, the semiconductor dies (e.g., 10A and 10A") of the die stacks 100 are stacked and bonded vertically by hybrid bonding. For example, for every two adjacent tiers of one die stack 100, the upper tier is bonded to the lower tier in a face-to-back configuration. In some embodiments, as shown in FIG. 18, the front surface S1 of the second tier 10A(2) is bonded to the back surface S2 of the first tier 10A(1). By such bonding (without uses of any other external connectors), there is no gap between the dies at two adjacent stacked tiers, therefore the semiconductor structure P1a having a better form factor with a die stack of a higher density in devices is achieved. As shown in FIG. 18, for example, the die stacks 100 are separated and isolated from each other by the isolation structures 50(T−1), and the carrier dies 10B are also separated and isolated from each other by the isolation structures 50(T−1).

Figure 19:
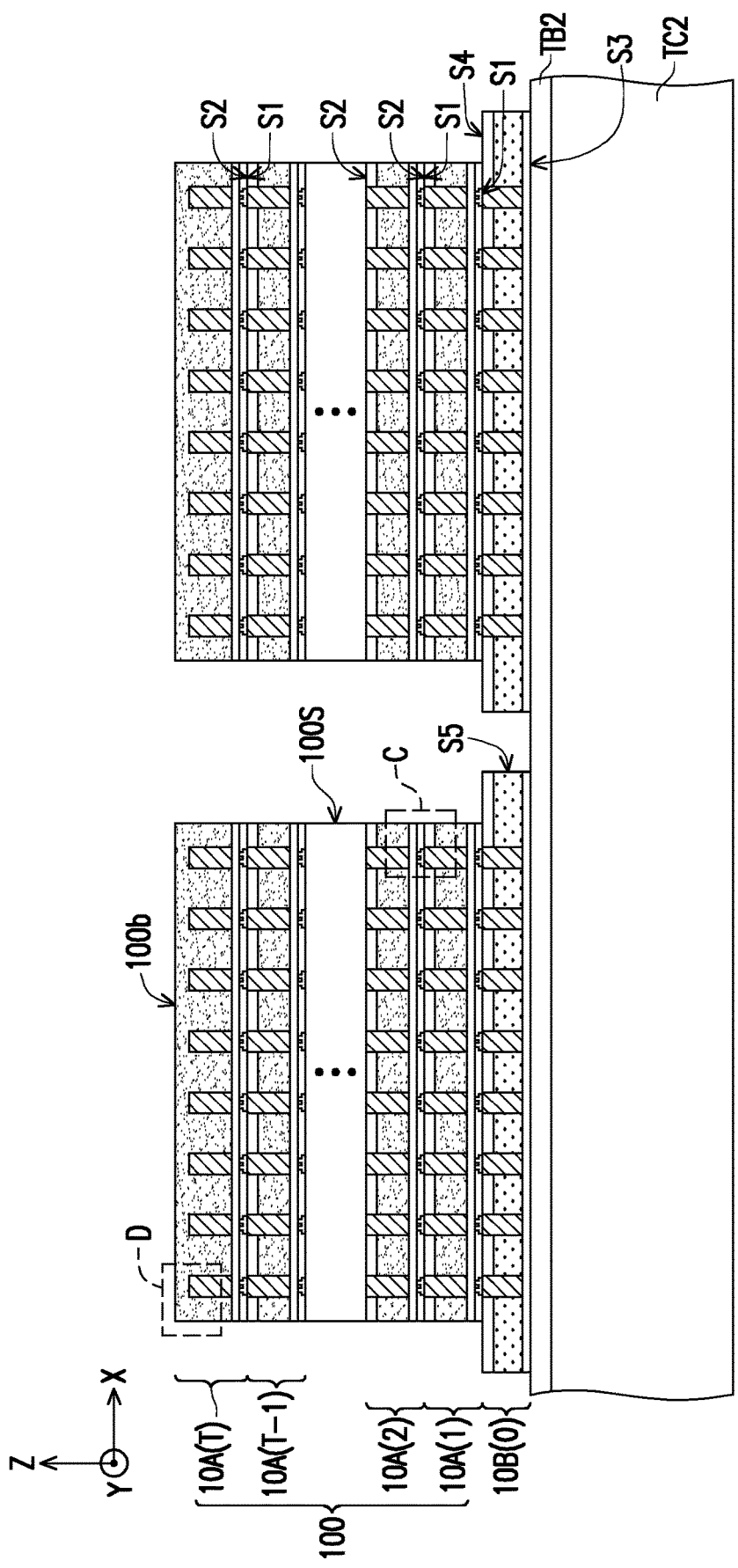

Referring FIG. 19, in some embodiments, the isolation structures 50(T−1) are removed from the temporary carrier TC2. For example, the isolation structures 50(T−1) may be removed by etching or the like; the disclosure is not limited thereto. The etching process is similar to the step as described in FIG. 12, and thus is not repeated herein. That is, for example, the die stacks 100 are separated and isolated from each other by gaps, and the carrier dies 10B are also separated and isolated from each other by the gaps.

As illustrated in FIG. 19 and FIG. 28A (illustrating an enlarged cross-sectional view indicated by the dashed box C of FIG. 19), at least one of the semiconductor substrates 110 of the semiconductor dies 10A in the inner tiers (e.g. 10A(1) through 10A(T−1)) may have a rounded edge RE. For example, for each of the semiconductor dies 10A, the rounded edge RE is connected to the bottom surface 110b and the sidewall 110s of the semiconductor substrate 110. In some embodiments, the dielectric layer 140 of the semiconductor die 10A at the second tier 10A(2) is a substantially flat surface so that a gap is formed between the rounded edge RE of the semiconductor die 10A at the first tier 10A(1) and the dielectric layer 140 of the semiconductor die 10A at the second tier 10A(2). With such embodiment, the gap may be, in a sequential step, filled by a later-formed layer/element, such as a dielectric layer, a conductive layer, or a layer having at least one dielectric layer and at least one conductive layer. That is, the rounded edge RE may be covered by the later-formed layer/element. The disclosure is not limited thereto. In alternative embodiments, the gap may not be filled, and the rounded edge RE may not be covered by any layers/elements. In some embodiments, the rounded edge RE is created during the backside thinning process (e.g., the step described in conjunction with FIG. 13). For example, the grinding pad, which is contact with the edges of the semiconductor dies, makes the edges of the semiconductor dies rounded. By forming the rounded edges RE, the semiconductor dies 10A may spread out the stress in the edge/corner area caused by mechanical/thermal stress and by bonding, thereby preventing cracking.

Figure 28B:
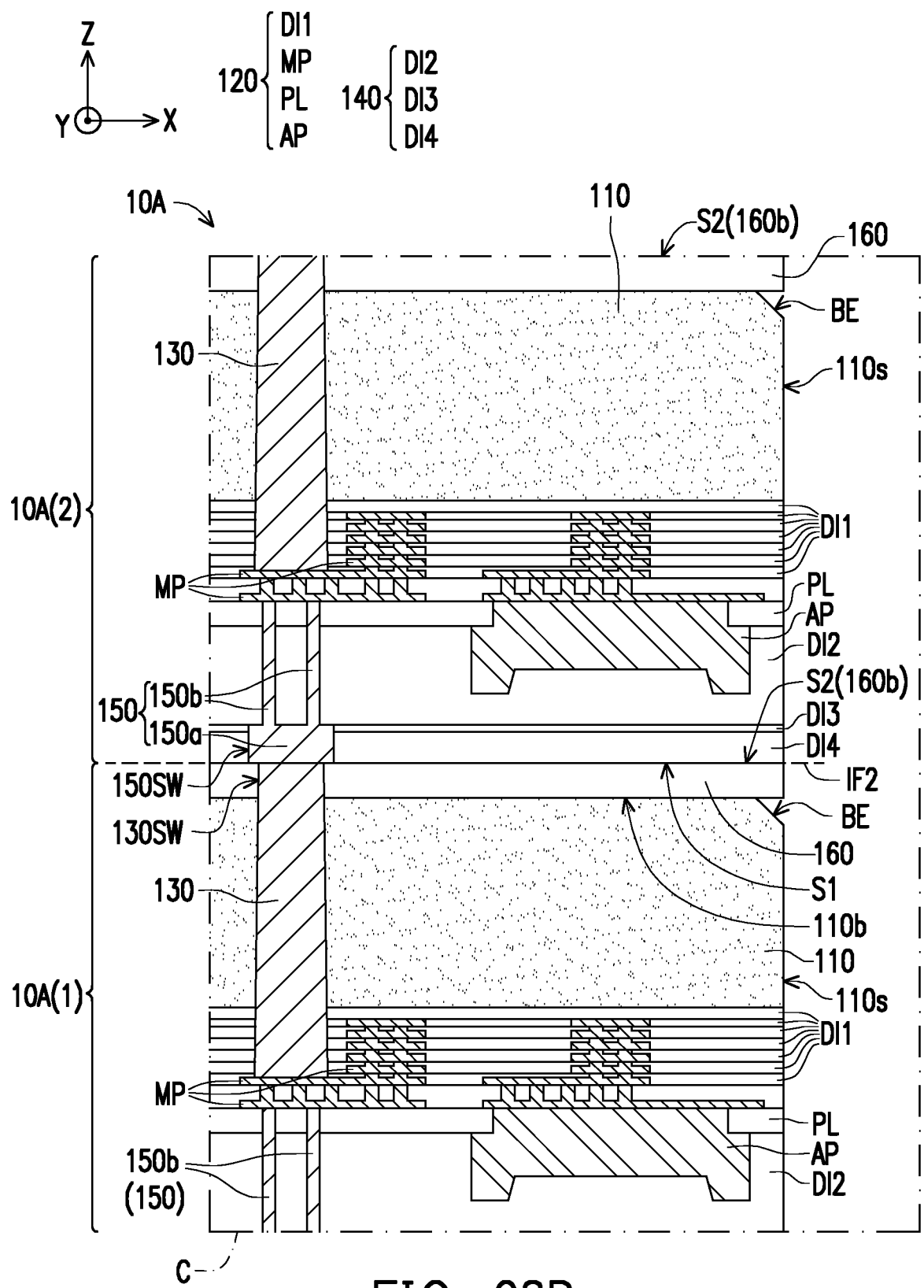
FIG. 28B is an enlarged and schematic cross-sectional view showing a bonding interface between adjacent tiers of a die stack in accordance with some embodiments of the disclosure.

In other embodiments, as illustrated in FIG. 28B, the rounded edge RE may be substituted by a bevel edge BE, where the bevel edge BE is connected to the bottom surface 110b and the sidewall 110s of the semiconductor substrate 110. In some embodiments, the dielectric layer 140 of the semiconductor die 10A at the second tier 10A(2) is a substantially flat surface so that a gap is formed between the bevel edge BE of the semiconductor die 10A at the first tier 10A(1) and the dielectric layer 140 of the semiconductor die 10A at the second tier 10A(2). With such embodiment, the gap may be, in a sequential step, filled by a later-formed layer/element, such as a dielectric layer, a conductive layer, or a layer having at least one dielectric layer and at least one conductive layer. That is, the bevel edge BE may be covered by the later-formed layer/element. However, in alternative embodiments, the gap may not be filled, and the bevel edge BE may not be covered by any layers/elements. In some embodiments, the bevel edge BE is created by singulation marks formed at the scribe lines for the singulation process (e.g., the step described in conjunction with FIG. 4). For example, the singulation marks, which are used to indicate the boundaries of the semiconductor dies, makes the edges of the semiconductor dies bevel. By forming the bevel edge BE, the semiconductor dies 10A may spread out the stress in the edge/corner area caused by mechanical/thermal stress and by bonding, thereby preventing cracking.

Figure 28C:
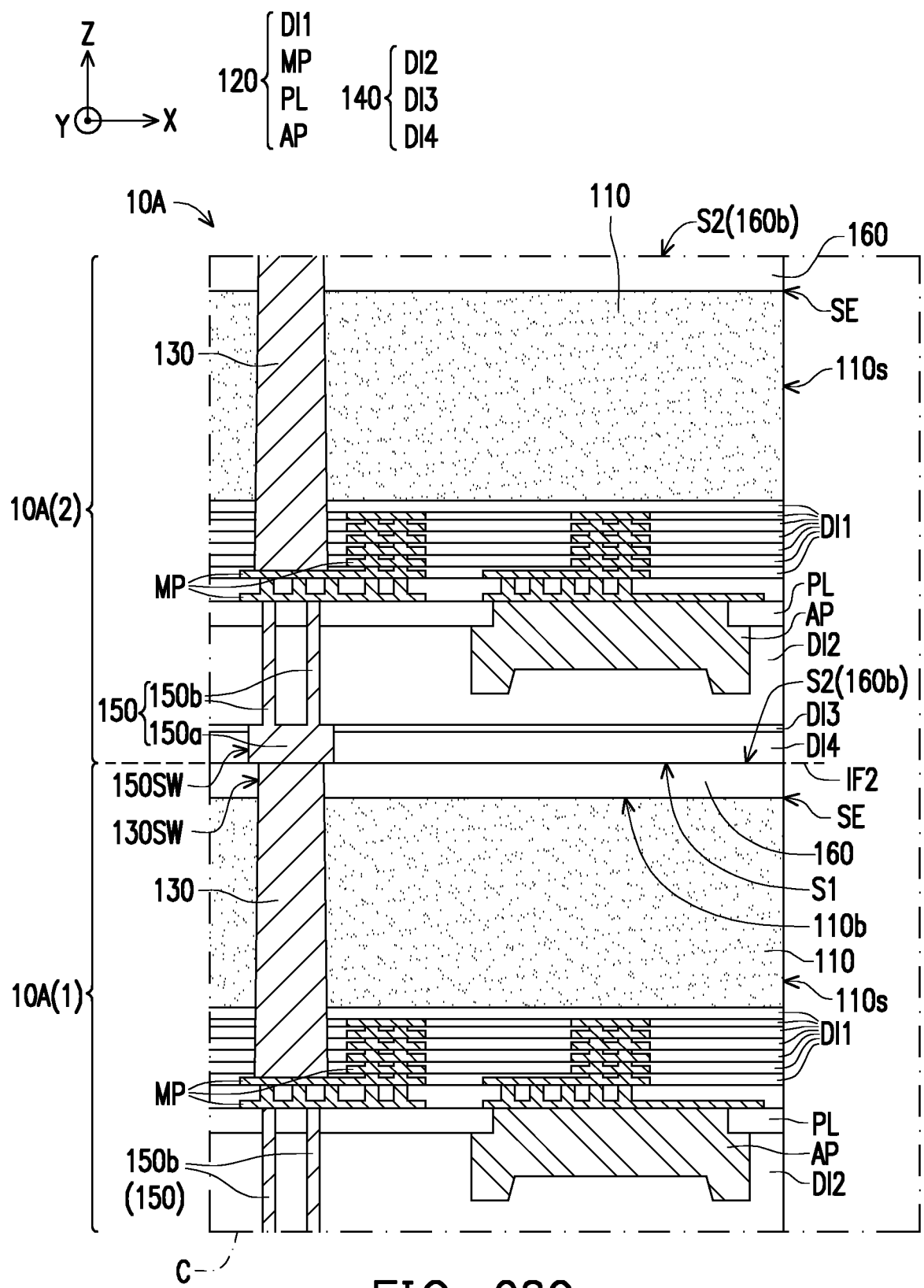
FIG. 28C is an enlarged and schematic cross-sectional view showing a bonding interface between adjacent tiers of a die stack in accordance with some embodiments of the disclosure.

In further other embodiments, as illustrated in FIG. 28C, the bottom surface 110b and the sidewall 110s of the semiconductor substrate 110 may be connected directly at a sharp edge SE. In such embodiments, there is no gap being formed between the sharp edge SE of the semiconductor die 10A at the first tier 10A(1) and the dielectric layer 140 of the semiconductor die 10A at the second tier 10A(2). In some embodiments, the sharp edge SE may or may not be covered by any layers/elements.

As illustrated in FIG. 19 and FIG. 29A (illustrating an enlarged cross-sectional view indicated by the dashed box D of FIG. 19), the semiconductor substrate 110 of the semiconductor die 10A" at the topmost tier 10A(T) may have the bevel edge BE. For example, for the semiconductor die 10A", the bevel edge BE is connected to the bottom surface 110b" and the sidewall 110s of the semiconductor substrate 110. With such embodiment, the bevel edge BE may be, in a sequential step, covered by a later-formed layer/element, such as a dielectric layer, a conductive layer, or a layer having at least one dielectric layer and at least one conductive layer. The disclosure is not limited thereto. In alternative embodiments, the bevel edge BE may not be covered by any layers/elements.

Figure 29B:
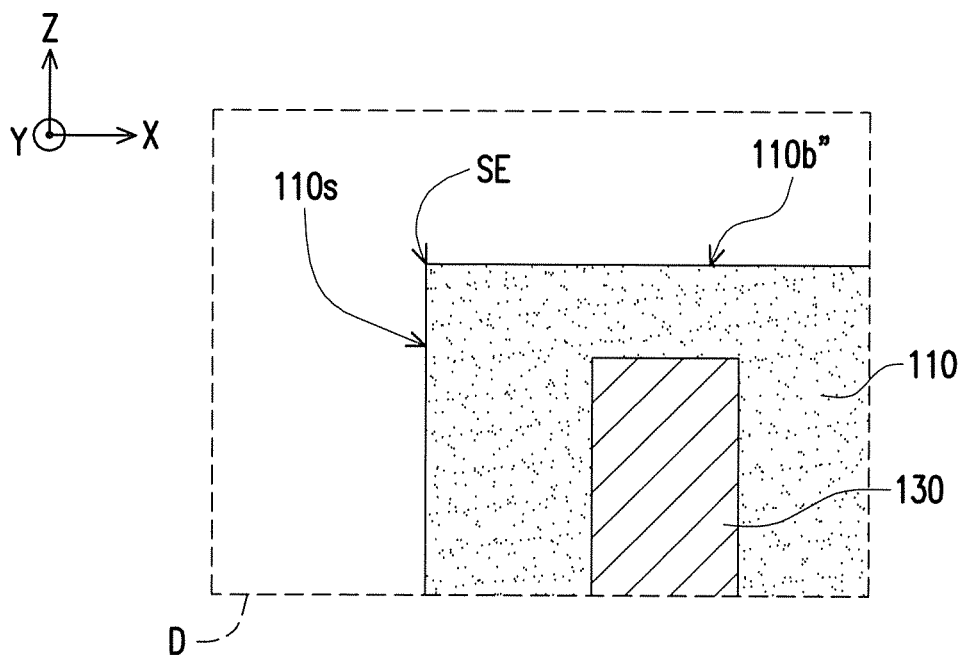
FIG. 29B is an enlarged and schematic cross-sectional view illustrating a configuration of an outermost tier of a die stack in accordance with some embodiments of the disclosure.

However, the disclosure is not limited thereto. In other embodiments, as illustrated in FIG. 29B, the bottom surface 110b" and the sidewall 110s of the semiconductor substrate 110 may be connected directly at a sharp edge SE. In some embodiments, the sharp edge SE may or may not be covered by any layers/elements.

Figure 20:
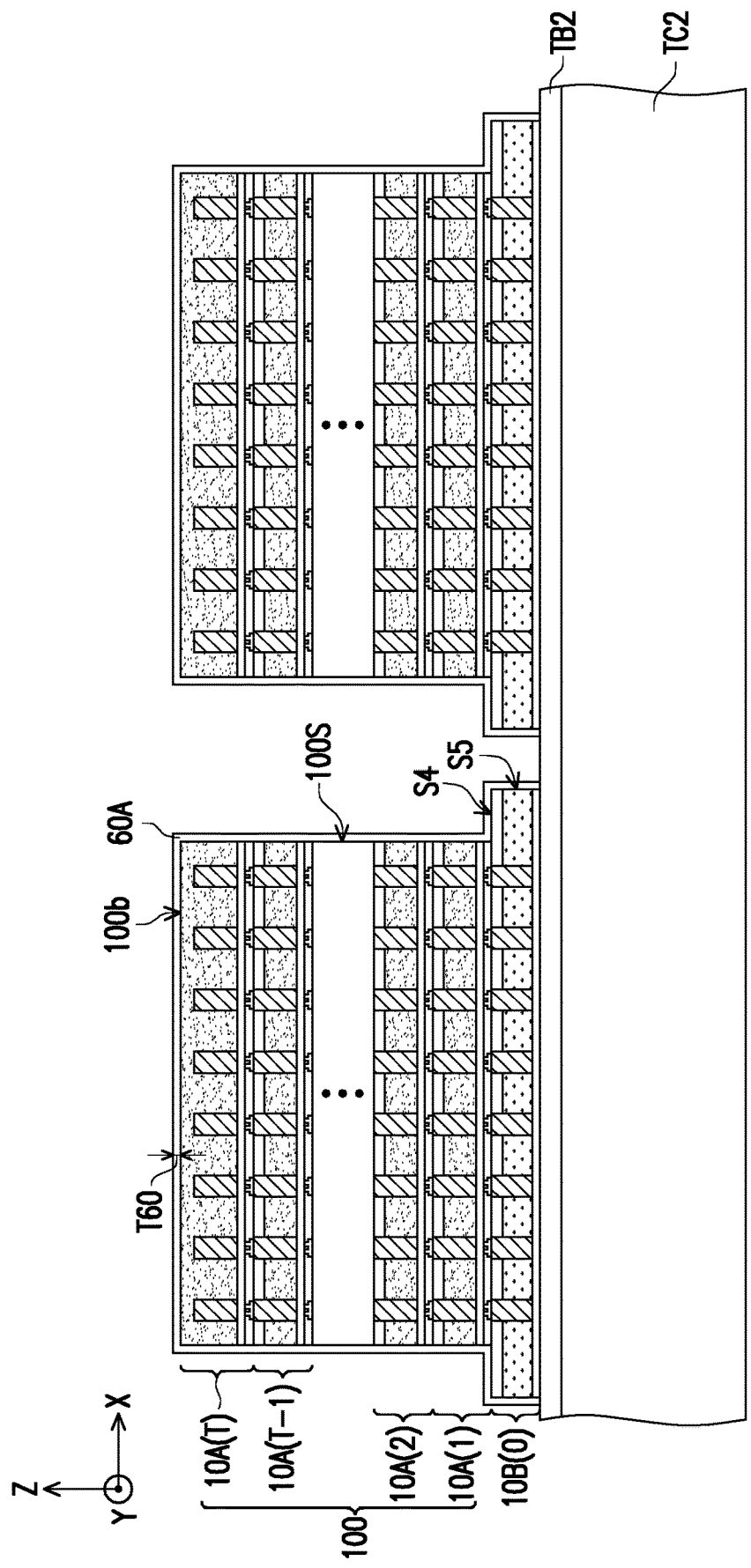

Referring to FIG. 20, in some embodiments, an electromagnetic interference shielding material 60A is disposed over the temporary carrier TC2 to be disposed on the die stacks 100 and the carrier dies 10B of the base tiers 10B(0). In some embodiments, the electromagnetic interference shielding material 60A covers the die stacks 100 and the carrier dies 10B of the base tiers 10B(0) in conformal manner. In some embodiments, the electromagnetic interference shielding material 60A has a thickness T60 approximately ranging from 500 Å to 5000 Å, where the thickness T60 is measured with a minimum distance between to opposite sides of the electromagnetic interference shielding material 60A. For example, the electromagnetic interference shielding material 60A at least covers the sidewalls 100S and bottom surfaces 100b of the die stacks 100 and further covers the sidewalls S5 and portions of the back surfaces S4 of the carrier dies 10B of the base tiers 10B(0).

In some embodiments, the electromagnetic interference shielding material 60A may be made of an electrically conductive material. Materials used for the electromagnetic interference shielding material 60A may include copper, nickel, an alloy of nickel and iron, an alloy of copper and nickel, silver, etc., but not limited thereto. In some embodiments, the electromagnetic interference shielding material 60A may be fabricated by using an electrolytic plating, electroless plating, sputtering, physical vapor deposition ("PVD"), chemical vapor deposition ("CVD"), or other suitable metal deposition process. A patterning process may be optionally performed to expose portions of the temporary bonding layer TB2, if need. The patterning process may include an etching process, such as dry etching, wet etching, or a combination thereof.

Figure 21:
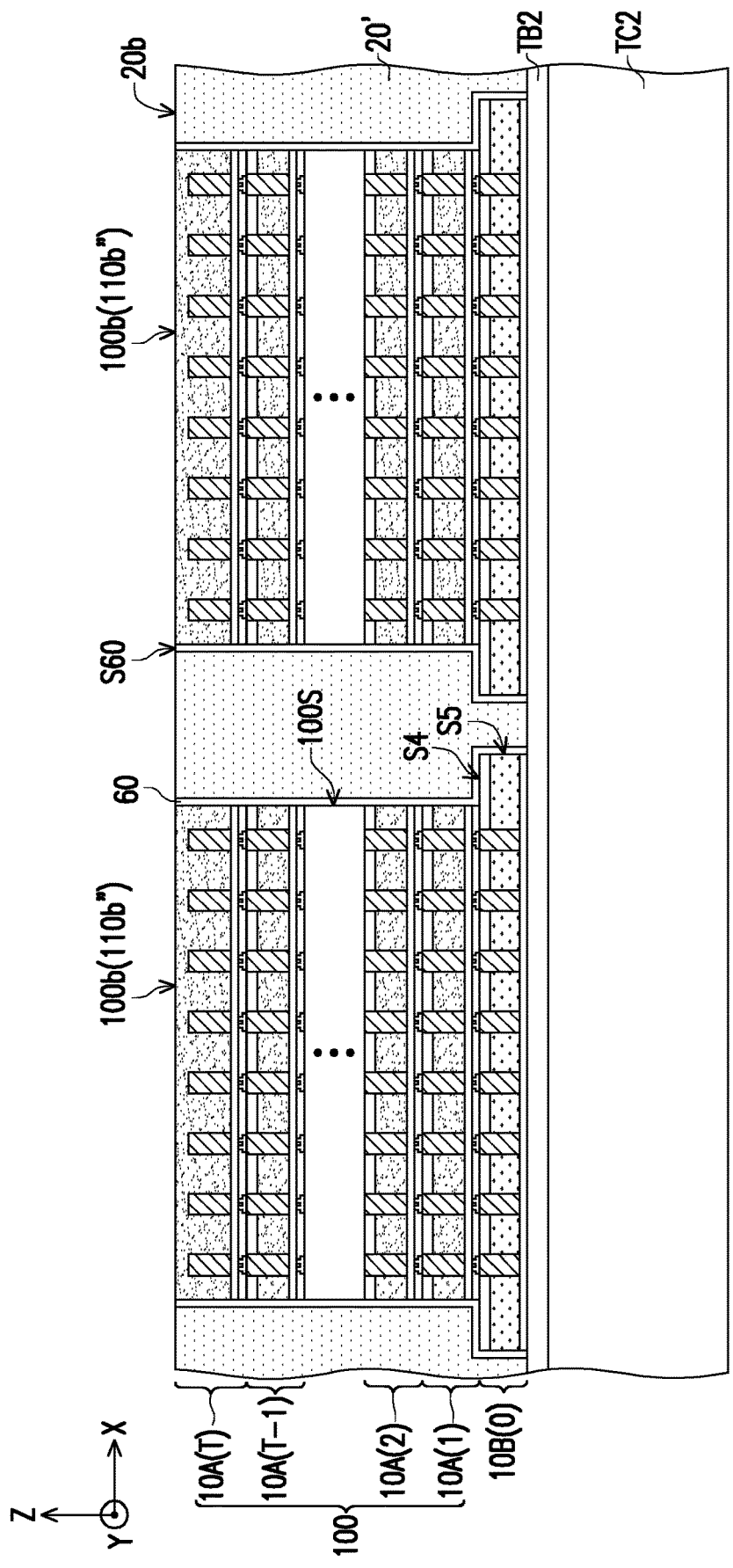

Referring to FIG. 21, in some embodiments, after forming the electromagnetic interference shielding material 60A, an insulating material 20' is formed over the temporary carrier TC2 to encapsulate the electromagnetic interference shielding material 60A, the die stacks 100 and the carrier dies 10B. For example, the insulating material 20' may be a molding compound, an epoxy resin, the like, or other suitable electrically insulating materials, and may be applied by compression molding, transfer molding, or the like. In some embodiments, the electromagnetic interference shielding material 60A, the die stacks 100 and the carrier dies 10B are over-molded, and then the insulating material 20' is thinned to reduce the overall thickness of the structure by using, for example, grinding, chemical mechanical polishing (CMP), combinations thereof, or other suitable thinning process. For example, the bottom surfaces 100b of the die stacks 100 (e.g., the bottom surfaces 110b" of the semiconductor dies 10A") are exposed by the insulating material 20' after thinning.

In some embodiments, during thinning the insulating material 20', the electromagnetic interference shielding material 60A is also be patterned to form an electromagnetic interference shielding layer 60. In certain embodiments, the thinning step may be, for example, performed on the over-molded insulating material 20' to level a surface 20b of the insulating material 20', the bottom surfaces 100b of the die stacks 100 (e.g. the bottom surfaces 110b" of the semiconductor dies 10A"), and a surface S60 of the electromagnetic interference shielding layer 60. For example, the surface 20b of the insulating material 20', the bottom surfaces 100b of the die stacks 100 (e.g. the bottom surfaces 110b" of the semiconductor dies 10A") and the surface S60 of the electromagnetic interference shielding layer 60 are substantially levelled with each other. In other words, the surface 20b of the insulating material 20' is substantially coplanar to the bottom surfaces 100b of the die stacks 100 (e.g. the bottom surfaces 10b" of the semiconductor dies 10A") and the surface S60 of the electromagnetic interference shielding layer 60. As shown in FIG. 21, for example, the electromagnetic interference shielding layer 60 does not extend on the bottom surfaces 100b of the die stacks 100 (e.g. the bottom surfaces 110b" of the semiconductor dies 10A"), and the carrier dies 10B and the die stacks 100 disposed thereon are separated from the insulating material 20' through the electromagnetic interference shielding layer 60.

The insulating material 20' may include a low moisture absorption rate and may be rigid after solidification for protecting the electromagnetic interference shielding layer 60, the die stacks 100 and the carrier dies 10B. The electromagnetic interference shielding layer 60 is used for reducing or inhibiting the electromagnetic field in a space by blocking the field with barriers made of conductive or magnetic materials. The electromagnetic interference shielding layer 60 in some embodiments may reduce the coupling of, for example, radio waves, electromagnetic fields and electrostatic fields. In some embodiment, the electromagnetic interference shielding layer 60 may be in electrical contact with a ground (not shown) for being electrically grounded.

In some embodiments, during thinning the insulating material 20', the semiconductor substrate 110 of the semiconductor dies 10A" may also be patterned, the disclosure is not limited thereto. In other embodiments, the thinning process may be omitted, and the electromagnetic interference shielding material 60A, the die stacks 100 and the carrier dies 10B are buried or covered by the insulating material 20'. In such embodiments, the electromagnetic interference shielding material 60A serves as the electromagnetic interference shielding layer, and is in electrical contact with a ground (not shown) for being electrically grounded.

Figure 22:
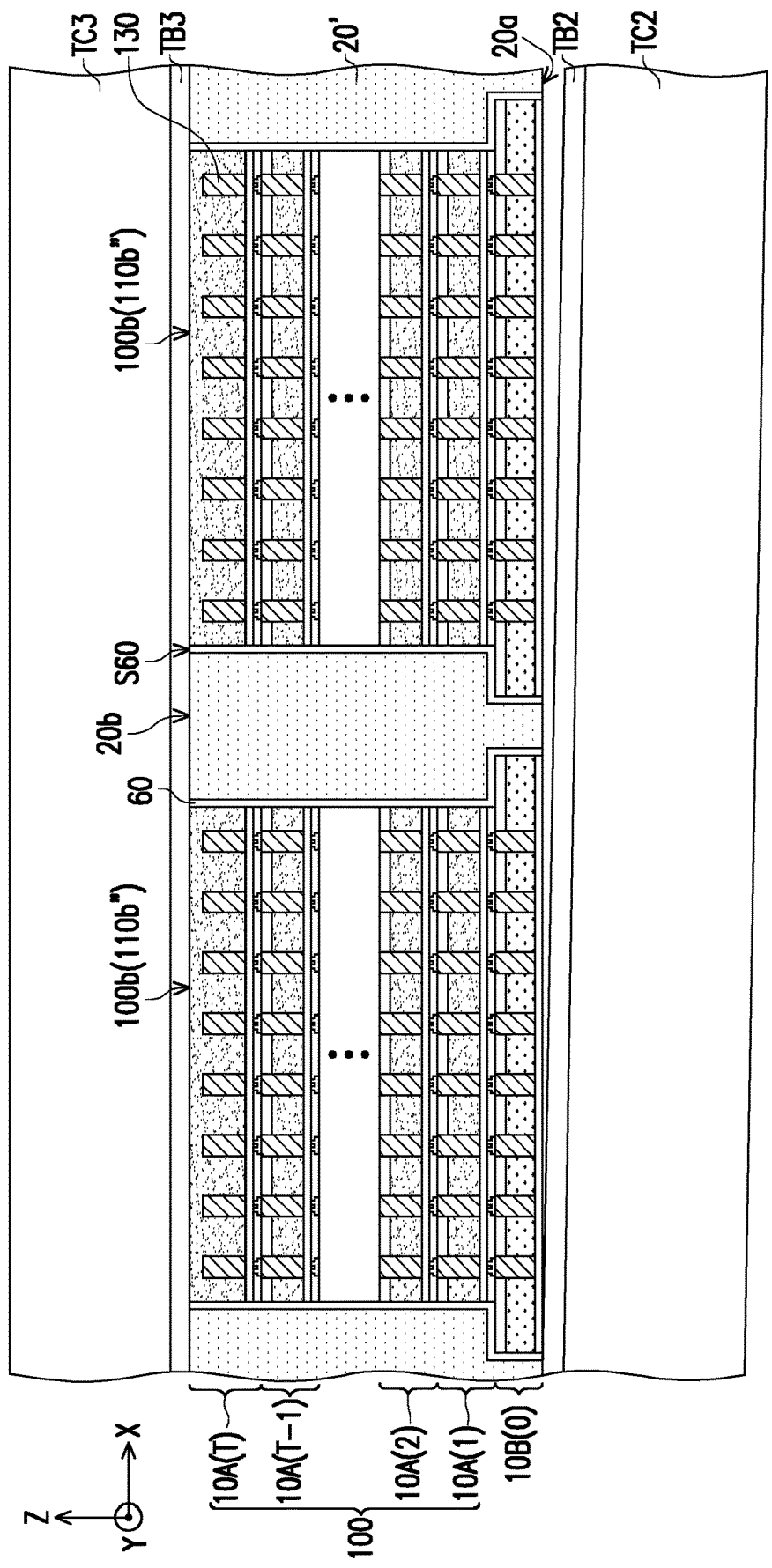

Referring to FIG. 22, in some embodiments, another temporary carrier TC3 is optionally attached to the insulating material 20' opposite to the temporary carrier TC2. In some embodiments in which the insulating material 20' is thinned to expose the semiconductor dies 10A" at the topmost tier 10A(T), the temporary carrier TC3 is, via an temporary bonding layer TB3, bonded to the insulating material 20' (e.g. the surface 20b) and the bottom surfaces 100b of the die stack 100 (e.g., the bottom surface 110b" of the semiconductor dies 10A"). A de-bonding process may be performed, where the temporary carrier TC2 and the temporary bonding layer TB2 are released from the carrier dies 10B at the base tiers 10B(0) such that the front surfaces S3 of the carrier dies 10B and a surface 20a of the insulating material 20' are exposed. For example, along the stacking direction Z, the surface 20a of the insulating material 20' is opposite to the surface 20b of the insulating material 20'. In some embodiments, the front surfaces S3 of the carrier dies 10B are cleaned after de-bonding the temporary carrier TC2 for further processing. The de-bonding process has been described in FIG. 4, and thus is not repeated herein for simplicity.

Figure 23:
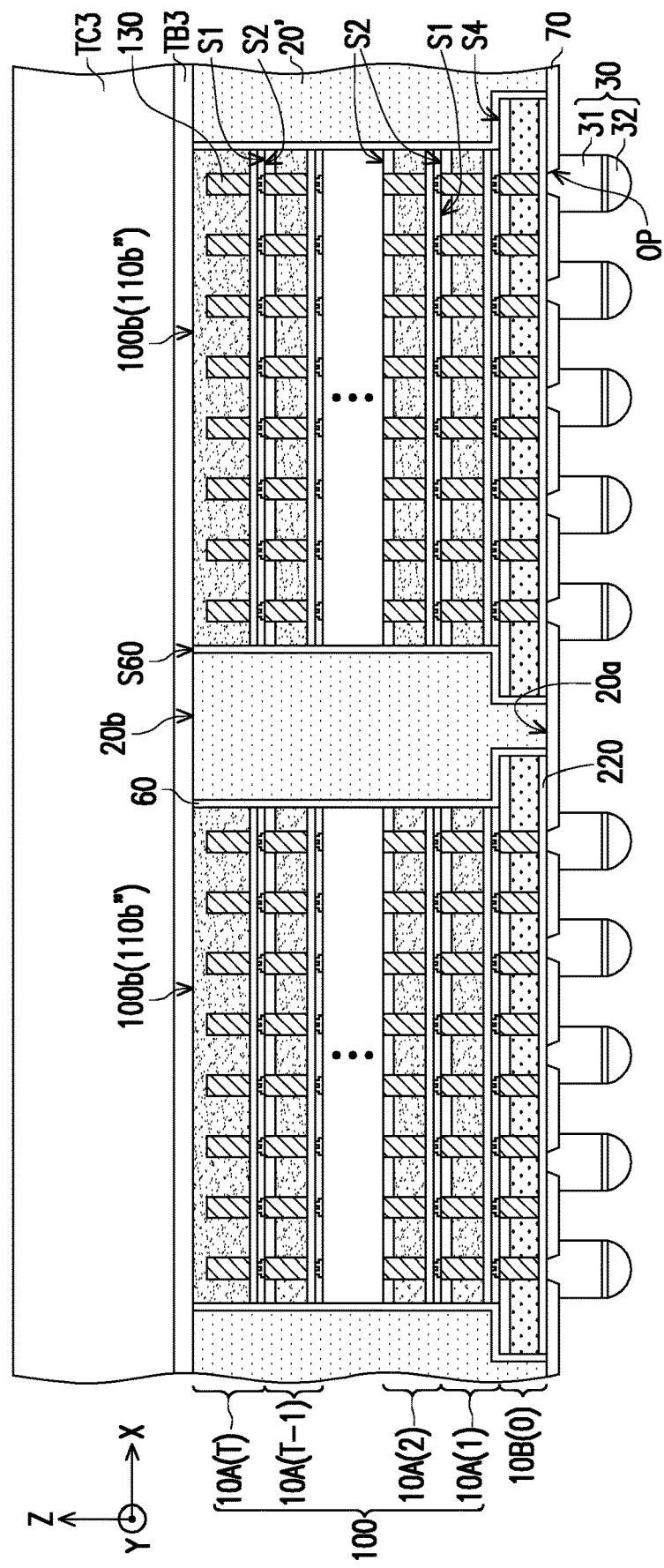

Referring to FIG. 23, in some embodiments, after removing the temporary carrier TC2 and the temporary bonding layer TB2, a plurality of conductive terminals 30 are subsequently formed at the exposed front surfaces S3 of the carrier dies 10B. The conductive terminals 30 may be formed by using, for example, a sputtering, printing, plating, deposition, or the like. The conductive terminals 30 may be formed of conductive material(s) including copper, aluminum, gold, nickel, silver, palladium, tin, solder, metal alloy, the like, or combinations thereof. For example, each of the conductive terminals 30 includes a bump 31. The bump 31 may be a micro-bump, a metal pillar, an electroless nickel-electroless palladium-immersion gold (ENEPIG) formed bump, a controlled collapse chip connection (C4) bump, a ball grid array (BGA) bump, or the like. In an embodiment in which the bumps 31 are micro-bumps, a bump pitch between two adjacent bumps 31 ranges from about 35 µm to about 55 µm. The bumps 31 may be solder free and may have substantially vertical sidewalls. In some embodiments, each of the conductive terminals 30 includes a metal cap 32 formed on the top of the bump 31 by, for example, plating, printing, or the like. For example, a material of the metal caps 32 includes nickel, tin, tin-lead, gold, silver, palladium, nickel-palladium-gold, nickel-gold, the like, or any combination of these.

In some embodiments, before forming the conductive terminals 30, a protection layer 70 is formed at the base tiers 10B(0) of the die stacks 100, as shown in FIG. 23. In some embodiments, the protection layer 70 is disposed on the carrier dies 10B and the insulating material 20', and extends to cover up the front surfaces S3 of the carrier dies 10B and the surface 20a of the insulating material 20'. In other words, the protection layer 70 is in contact with the insulating material 20' and the carrier dies 10B. For example, the protection layer 70 includes passivation materials such as silicon oxide, silicon nitride, un-doped silicate glass, polyimide, or other suitable insulating materials for protection the underlying structures. In some embodiments, the protection layer 70 includes a plurality of openings OP exposing at least a portion of the underlying conductive features (not illustrated) in the interconnect structure 220 of each of the carrier dies 10B for further electrical connection. For example, as shown in FIG. 23, the conductive terminals 30 are formed to be in physical and electrical contact with the conductive features in the interconnect structures 220 of the carrier dies 10B exposed by the openings OP formed in the protection layer 70.

Alternatively, the protection layer 70 may be omitted, the disclosure is not limited thereto. In such embodiments, the conductive terminals 30 are directly formed on the carrier dies 10B to be in physical and electrical contact with the conductive features in the interconnect structures 220 of the carrier dies 10B.

Alternatively, the protection layer 70 may be substituted with a redistribution circuit structure (not shown) including one or more than one dielectric layer and one or more than one metallization layer arranged in alternation. In such embodiments, the conductive terminals 30 are formed on the redistribution circuit structure to be in electrical contact with the conductive features in the interconnect structures 220 of the carrier dies 10B through the metallization layer(s) in the redistribution circuit structure.

Referring to FIG. 24, in some embodiments, the temporary carrier TC3 and the temporary bonding layer TB3 are removed from the insulating material 20' and the die stacks 100 by de-bonded process. For example, the de-bonding process includes applying energy to the temporary bonding layer, mechanical peeling, etching, or other suitable removal techniques. Subsequently, a singulation process is performed to form a plurality of separated and individual semiconductor structures P1a. The singulation may be performed along the scribe lines (not shown) by, for example, a sawing, laser cutting, or the like. The insulating material 20' may be cut through to form an insulating encapsulation 20. The insulating encapsulation 20 exposes the bottom surface 100b of the die stack 100 exposed by the electromagnetic interference shielding layer 60, and is disposed at the sidewall 100S of the die stack 100 and the sidewall S5 and a portion of the back surface S4 of the carrier die 10C covered by the electromagnetic interference shielding layer 60.

In some embodiments, as shown in FIG. 24, the semiconductor structure P1a has the carrier die 10B, the die stack 100 disposed thereon, the insulating encapsulation 20 formed on the carrier die 10B and the die stack 100, the electromagnetic interference shielding layer 60 sandwiched between the insulating encapsulation 20 and the carrier die 10B and between the insulating encapsulation 20 and the die stack 100, the protection layer 70 disposed on the carrier die 10B and the insulating encapsulation 20, and the conductive terminals 30 disposed on the insulating encapsulation 20. In some embodiments, the carrier die 10B is, for example, a logic die configured to perform read, program, erase, and/or other operations, and the die stack 100 is, for example, a memory stack including memory dies stacked upon one another and programmed by the carrier die 10B. In certain embodiments, the semiconductor structure P1a is referred to as a (semiconductor) device package. For example, the semiconductor dies 10A/10A" in the die stack 100 of the semiconductor structure P1a may be high bandwidth memory (HBM) dies, and the carrier die 10B may be a logic die providing control functionality for these memory dies. In other words, the semiconductor dies 10A/10A" in the die stack 100 and the carrier die 10B are bonded together through hybrid bonding, and are electrically connected and electrically communicated to each other. Other types of dies may be employed in the semiconductor structure P1a depending on the product requirements. In the disclosure, the die stack 100 and the carrier die 10B together are referred to as a stacked structure SS1.

In some embodiments, the sidewall S5 of the carrier die 10B covered by the electromagnetic interference shielding layer 60 is further covered by the insulating encapsulation 20 after singulation. For example, a sidewall 20S of the insulating encapsulation 20 may be substantially leveled with a sidewall 70S of the protection layer 70 after singulation. That is, the sidewall 20S of the insulating encapsulation 20 is aligned with the sidewall 70S of the protection layer 70. The sidewall 100S of the die stack 100 is distant from the sidewall 20S of the insulating encapsulation 20, and the sidewall S5 of the carrier die 10B is also distant from the sidewall 20S of the insulating encapsulation 20, as shown in FIG. 24, in some embodiments.

As illustrated in FIG. 24 and FIG. 25 (a top plane view on the X-Y plane), for the semiconductor structure P1a, a positioning location of the die stack 100 is within a positioning location of the carrier die 10B and within a positioning location of the insulating encapsulation 20, and the positioning location of the carrier die 10B is within the positioning location of the insulating encapsulation 20. In other words, a perimeter of the die stack 100 is less than a perimeter of the carrier die 10B and a perimeter of the insulating encapsulation 20, and the perimeter of the carrier die 10B is less than the perimeter of the insulating encapsulation 20.

However, the disclosure is not limited thereto. FIG. 30 through FIG. 44 are schematic cross-sectional views respectively showing a semiconductor structure in accordance with some embodiments of the disclosure. Like elements are designated with the same reference numbers for ease of understanding and the details thereof are not repeated herein.

Figure 30:
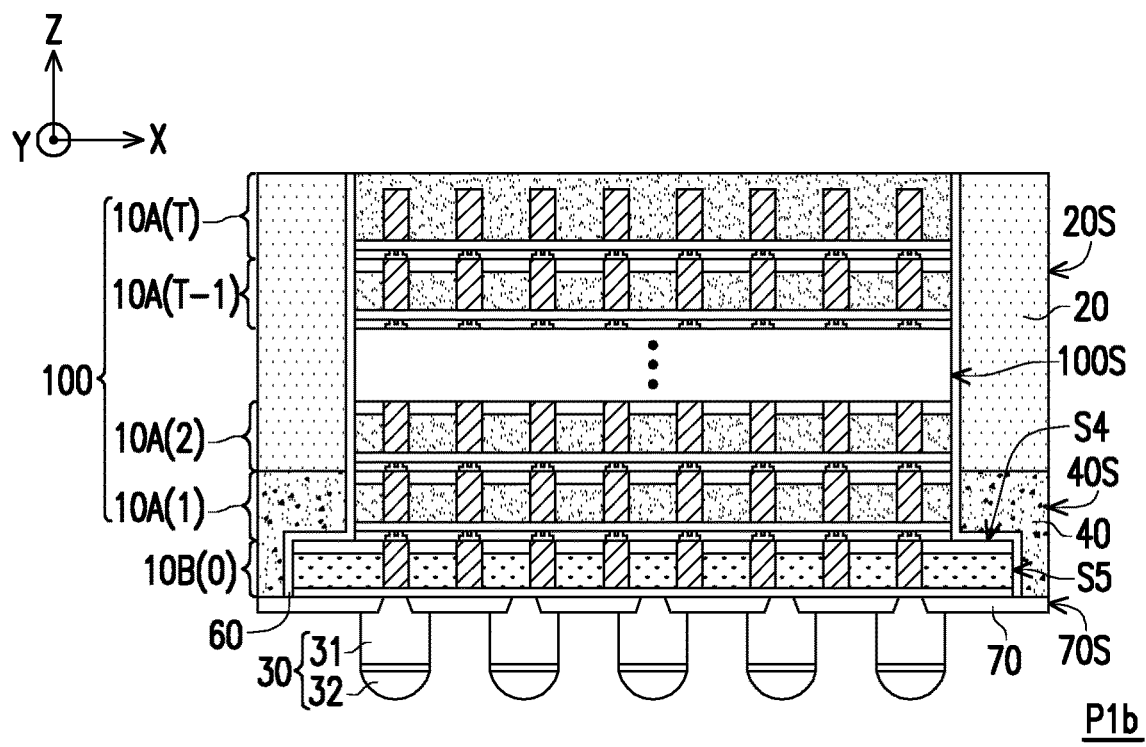
FIG. 30 through FIG. 44 are schematic cross-sectional views respectively showing a semiconductor structure in accordance with some embodiments of the disclosure.

In alternative embodiments, an additional insulating encapsulation may be included. A semiconductor structure P1b depicted in FIG. 30 is similar to the semiconductor structure P1a depicted in FIG. 24, the difference is that, the semiconductor structure P1b further includes an insulating encapsulation 40. For example, as shown in FIG. 30, the insulating encapsulation 40 is at least located between the protection layer 70 and the insulating encapsulation 20. In some embodiments, the insulating encapsulation 40 is formed prior to the formation of the insulating encapsulation 20, such that the sidewall S5 of the carrier die 10B covered by the electromagnetic interference shielding layer 60 is further covered by the insulating encapsulation 40. For example, the insulating encapsulation 40 not only further covers the portion of the back surface S4 of the carrier die 10B exposed by the die stack 100 and covered by the electromagnetic interference shielding layer 60, but also covers a portion of the sidewall 100S of the die stack 100 covered by the electromagnetic interference shielding layer 60. That is, the insulating encapsulation 40 is further partially located between the insulating encapsulation 20 and the carrier die 10B. As shown in FIG. 30, for example, the sidewall 20S of the insulating encapsulation 20 and the sidewall 70S of the protection layer 70 are substantially coplanar to and aligned with a sidewall 40S of the insulating encapsulation 40.

In some embodiments, the insulating encapsulation 40 may be conformally formed by, for example, spin-coating, deposition or the like. In some embodiments, a material of the insulating encapsulation 40 may include a nitride (such as silicon nitride), an oxide (such as silicon oxide) or the like (such as, silicon oxynitride, silicon carbide, a polymer, the like). The disclosure is not specifically limited. In the disclosure, the insulating encapsulation 40 is different from the insulating encapsulation 20.

Figure 31:
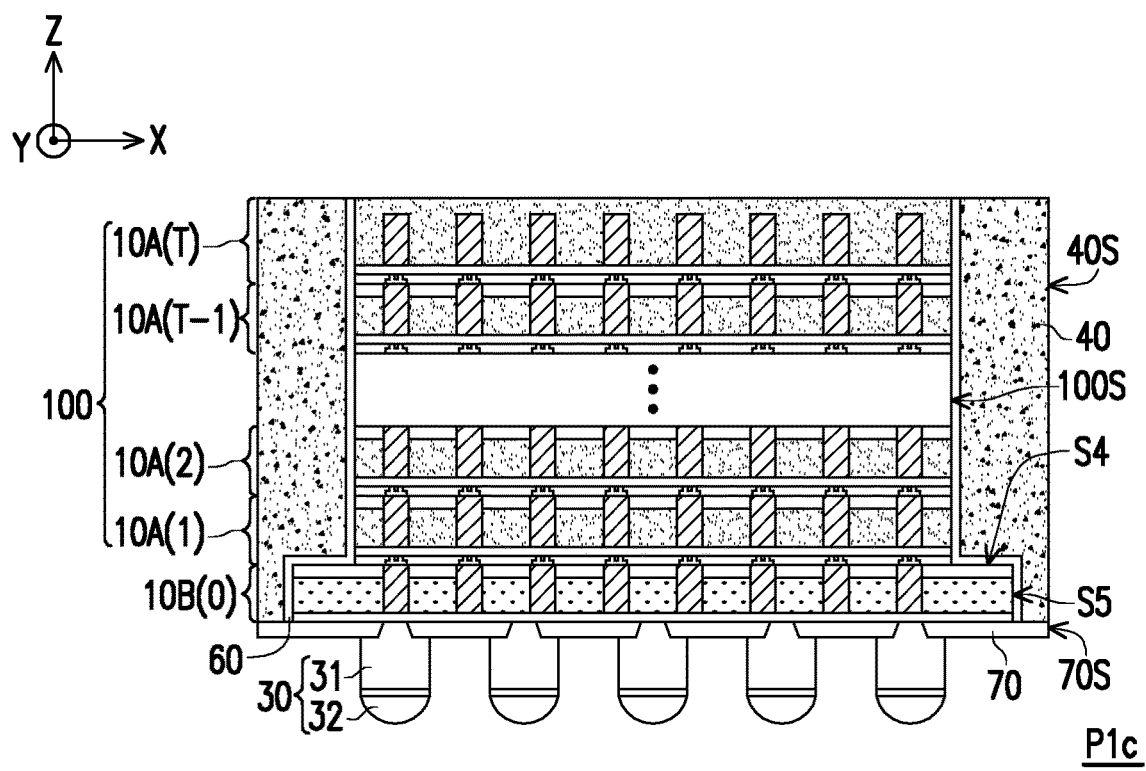

In further alternative embodiment, the insulating encapsulation 20 is substituted by the insulating encapsulation 40, see a semiconductor structure P1c depicted in FIG. 31. A semiconductor structure P1c depicted in FIG. 31 is similar to the semiconductor structure P1a depicted in FIG. 24, the difference is that, the semiconductor structure P1c employs the insulating encapsulation 40 instead of the insulating encapsulation 20. For example, the insulating encapsulation 40 completely covers the electromagnetic interference shielding layer 60. As shown in FIG. 31, for example, the sidewall 70S of the protection layer 70 is substantially coplanar to and aligned with the sidewall 40S of the insulating encapsulation 40.

Figure 32:
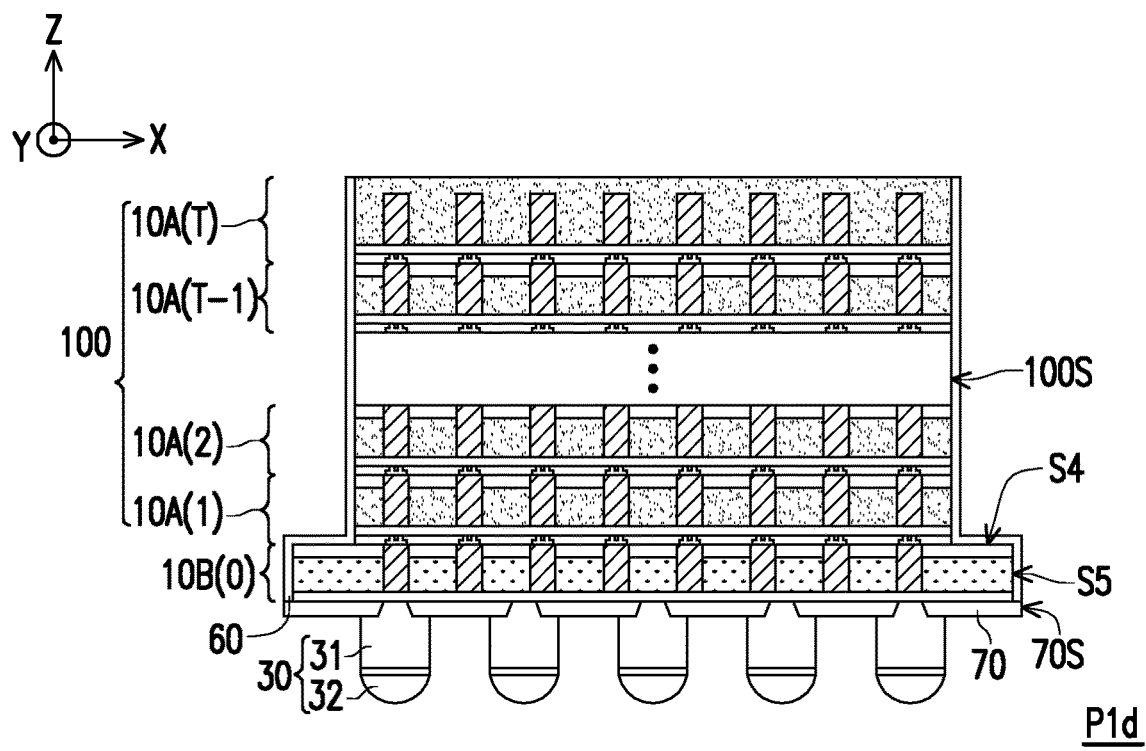

In other alternative embodiments, there is no insulating encapsulation (e.g. 20, 40), see a semiconductor structure P1d depicted in FIG. 32. A semiconductor structure P1d depicted in FIG. 32 is similar to the semiconductor structure P1a depicted in FIG. 24, the difference is that, the die stack 100 and the carrier die 10B are only covered by the electromagnetic interference shielding layer 60. As shown in FIG. 32, for example, the sidewall 70S of the protection layer 70 is substantially coplanar to and aligned with a side of a portion of the electromagnetic interference shielding layer 60 located on the sidewall S5 of the carrier die 10B.

Figure 33:
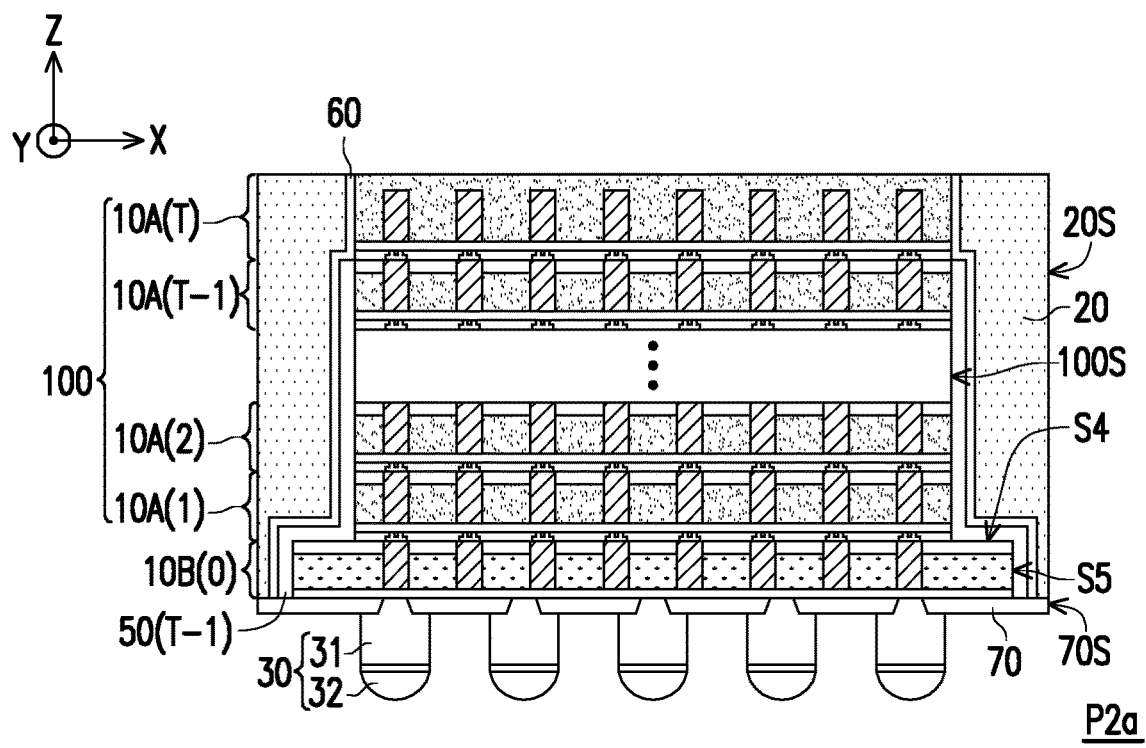
Figure 34:
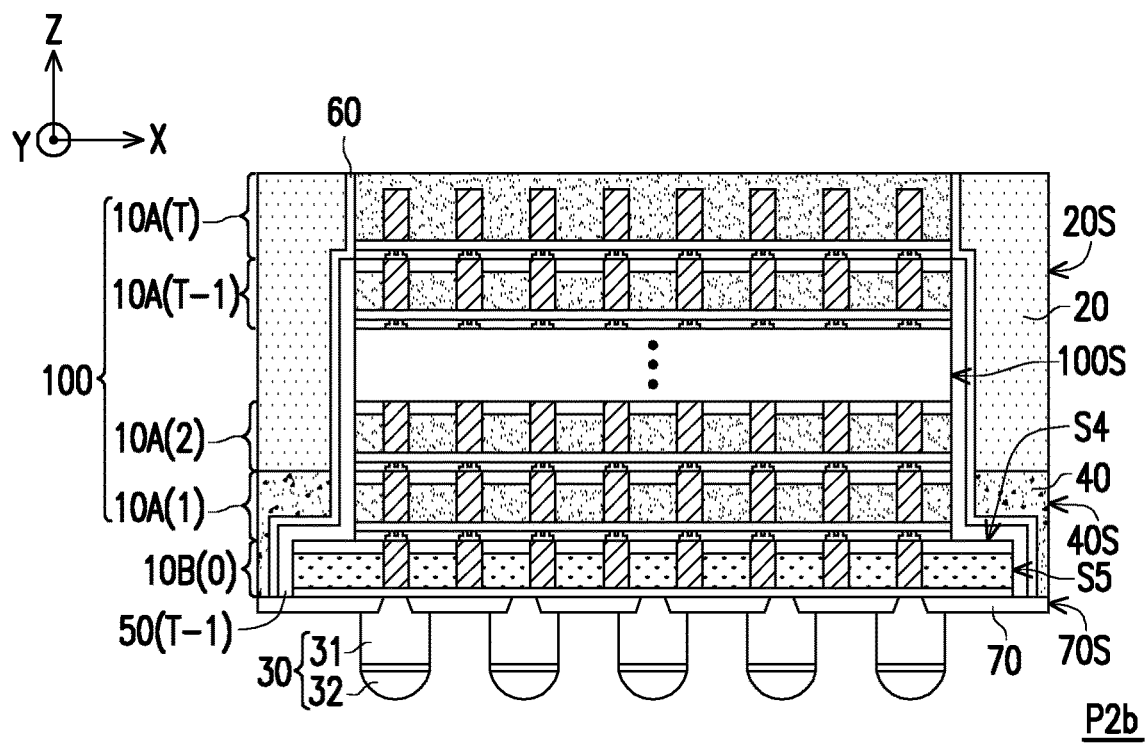
Figure 35:
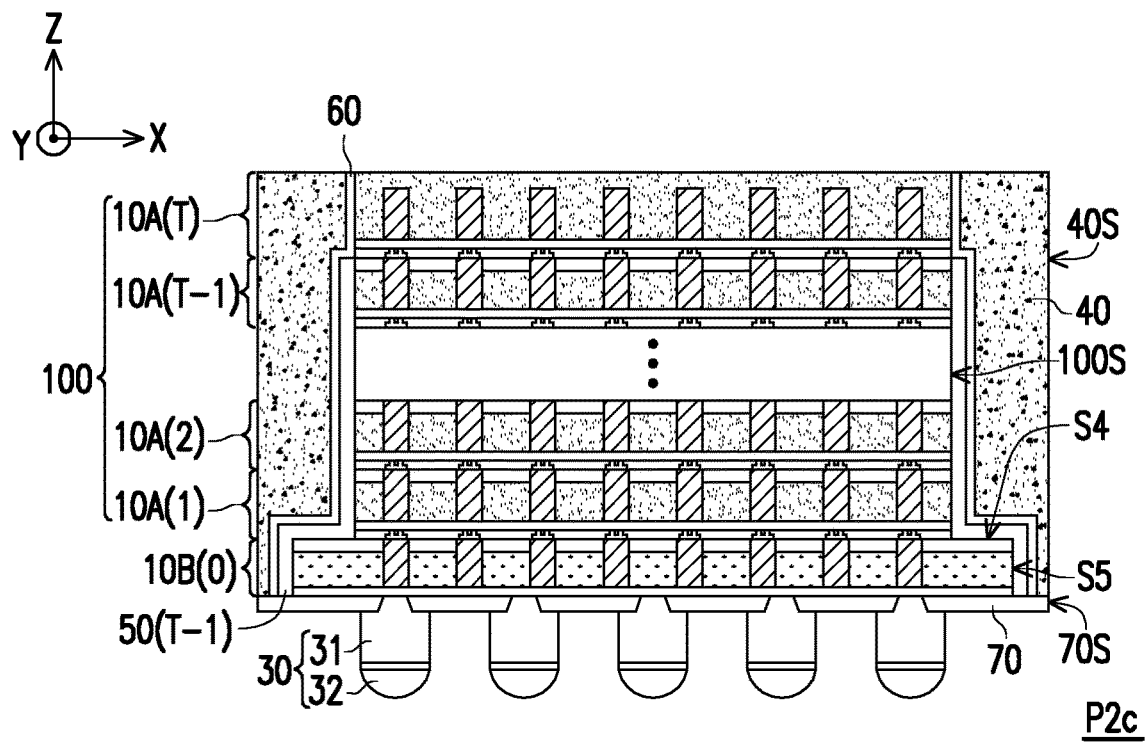
Figure 36:
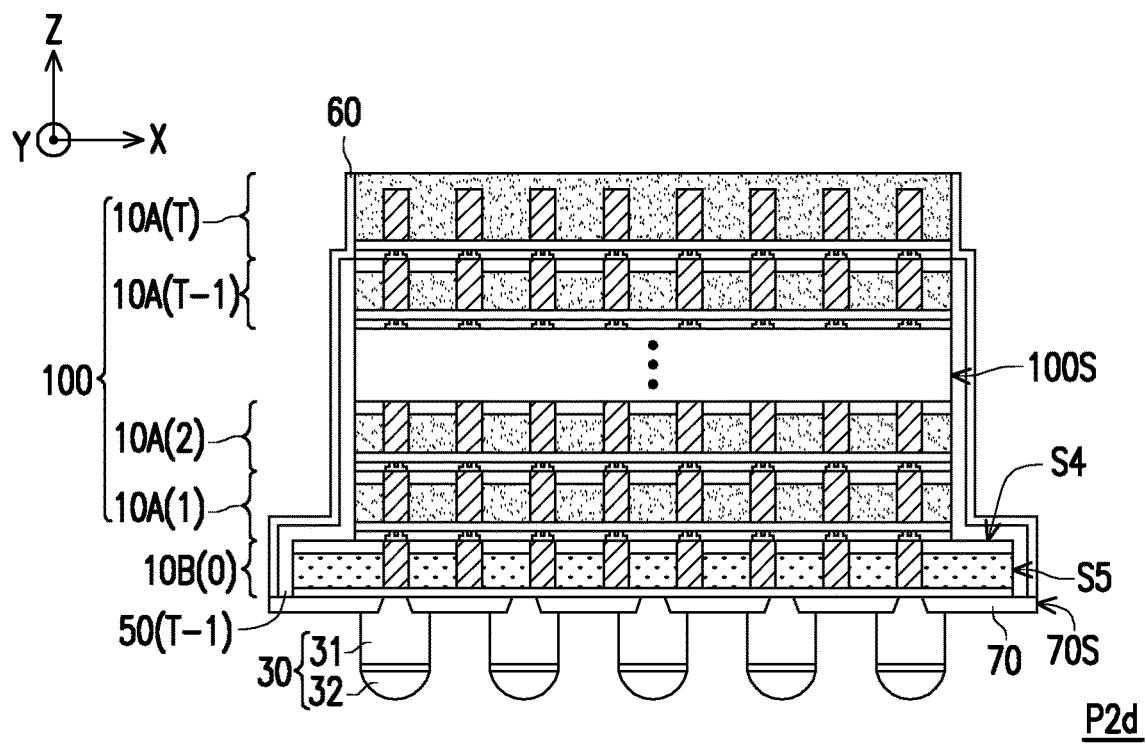
Figure 37:
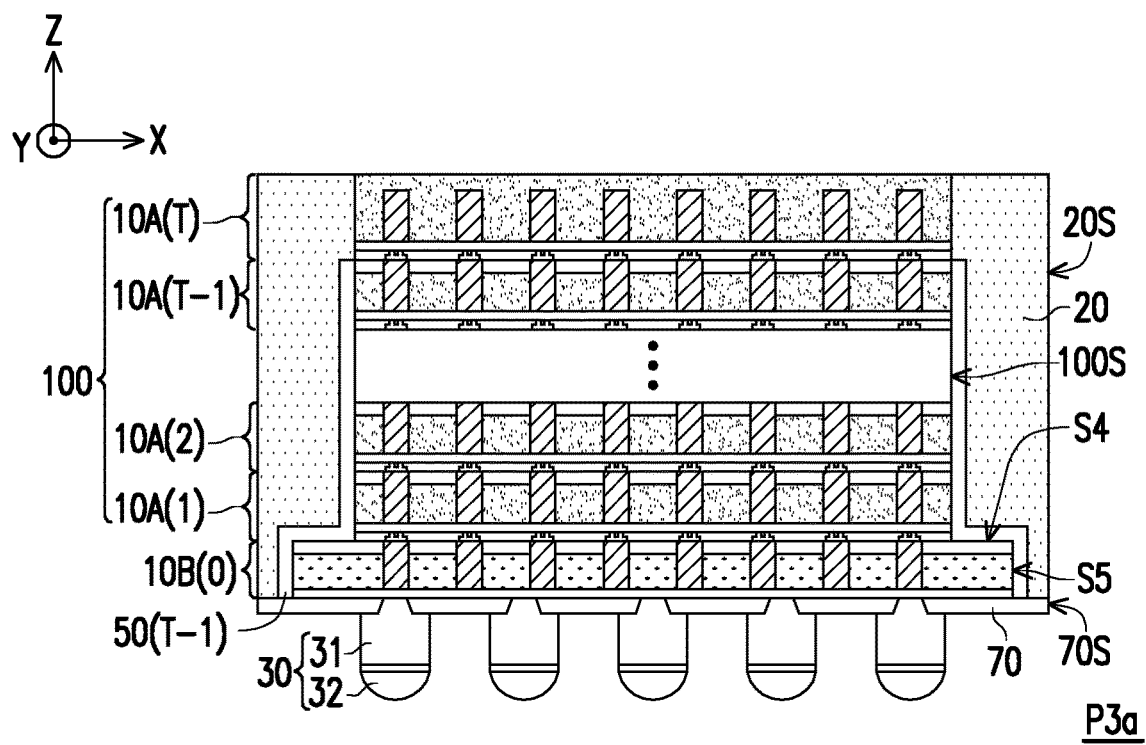
Figure 38:
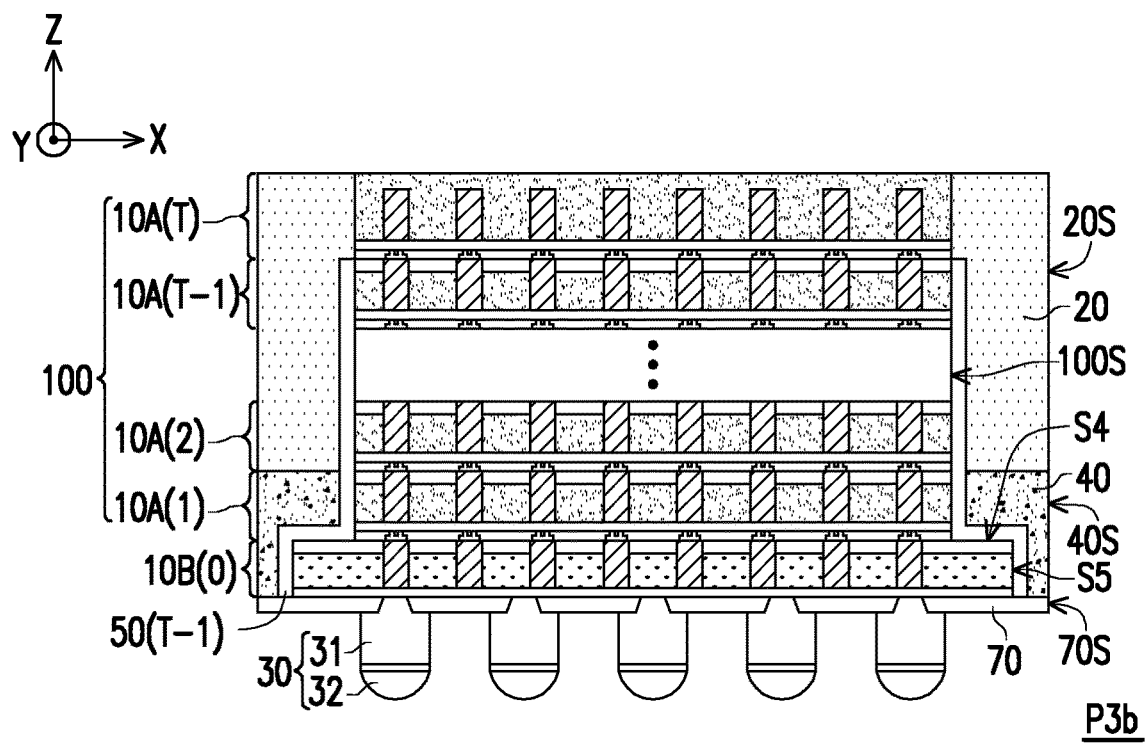
Figure 39:
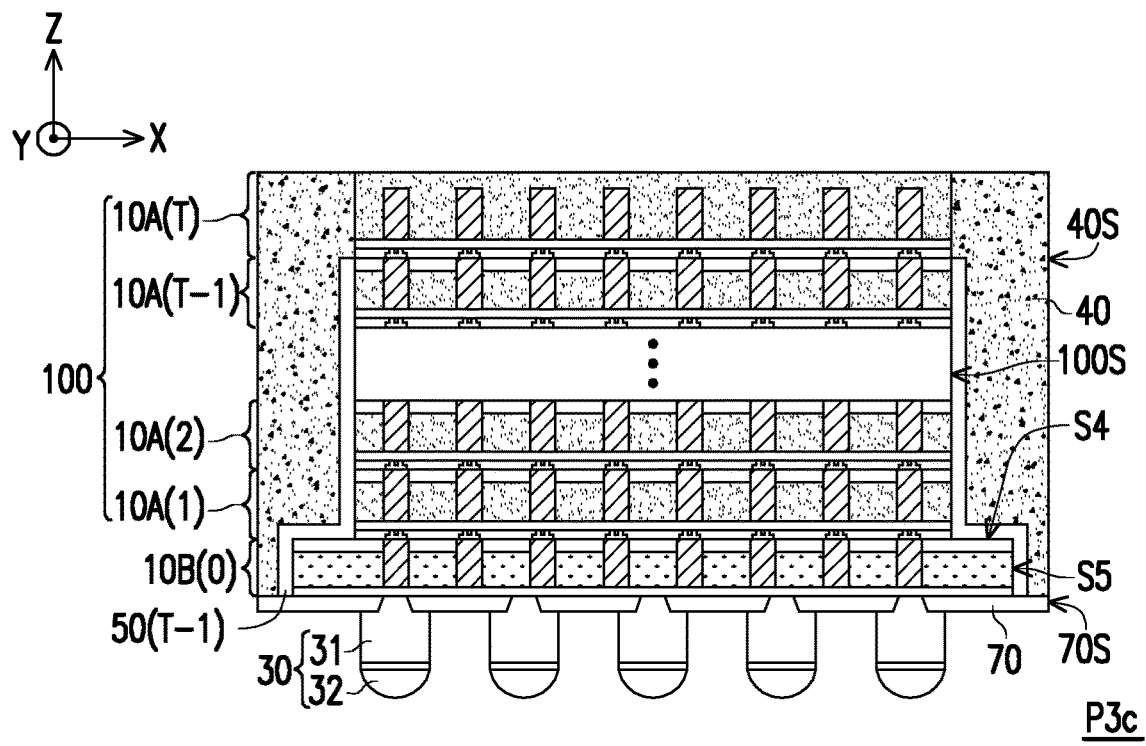
Figure 40:
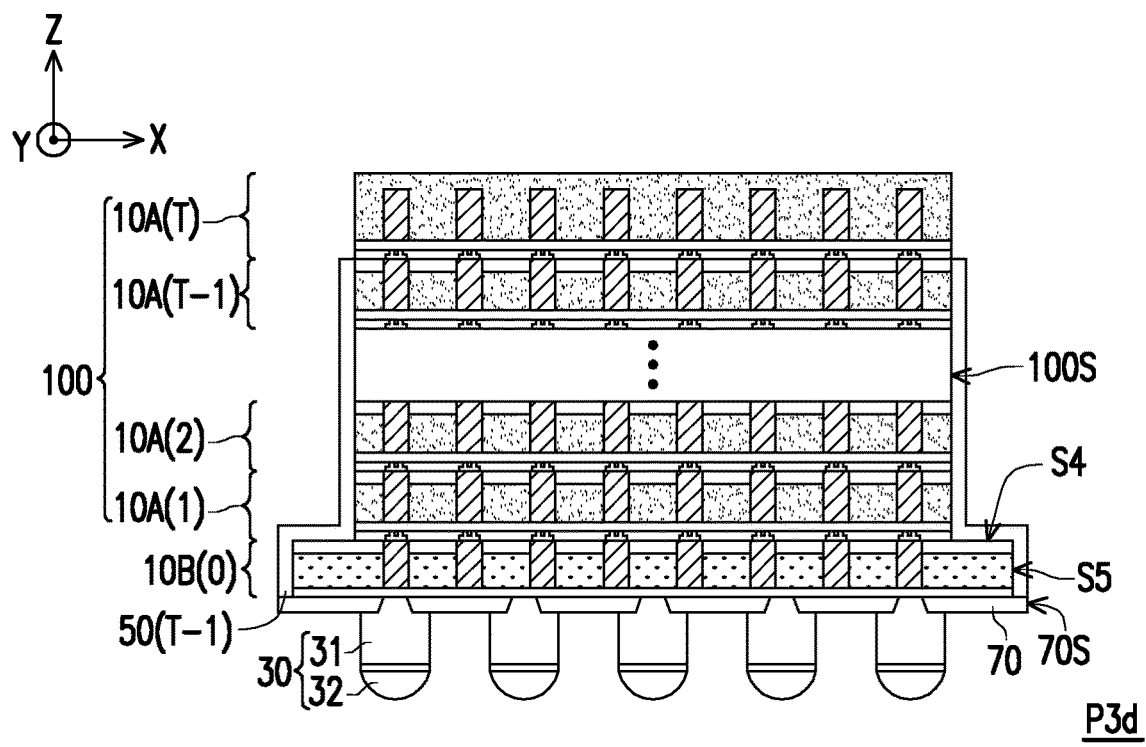

In some embodiments, as compared with the semiconductor structures P1a through P1d, an isolation structure (e.g. 50(T−1) depicted in FIG. 18) may be included in semiconductor structures P2a through P2d respectively depicted in FIG. 33 through FIG. 36. For example, the semiconductor structure P2a depicted in FIG. 33 is similar to the semiconductor structure P1a depicted in FIG. 24, the difference is that, in the semiconductor structure P2a, the isolation structures 50(T−1) is remained on the carrier die 10B and the die stack 100. As shown in FIG. 33, a portion of the sidewall 100S of the die stack 100, the sidewall S5 of the carrier die 10B and the back surface S4 of the carrier die 10B exposed by the die stack 100 are covered by the isolation structure 50(T−1). For example, the isolation structure 50(T−1) is located between the die stack 100/the carrier die 10B and the insulating encapsulation 20. As illustrated in FIG. 33, the protection layer 70 is located on the carrier die 10B, the isolation structure 50(T−1), the electromagnetic interference shielding layer 60 and the insulating encapsulation 20, and the sidewalls of the inner tiers (e.g. 10A(1) through 10A(T−1) are covered by the isolation structure 50(T−1). Similarly, the isolation structure may also be introduced to the semiconductor structures P1b, P1c and P1d to respectively form semiconductor structures P2b, P2c and P2d, as shown in FIG. 34 to FIG. 36.

On the other hand, in some embodiments, as compared with the semiconductor structures P2a through P2d, an electromagnetic interference shielding element (e.g. 60 or 60A) may be excluded in semiconductor structures P3a through P3d respectively depicted in FIG. 37 through FIG. 40.

Figure 41:
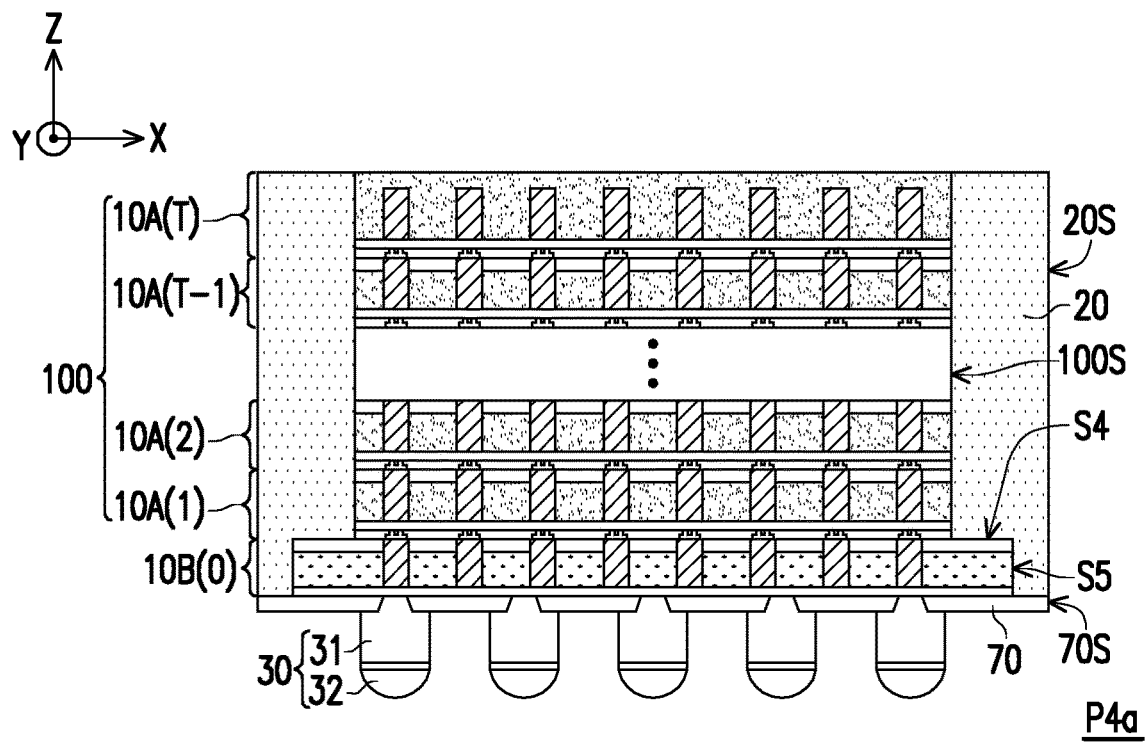
Figure 42:
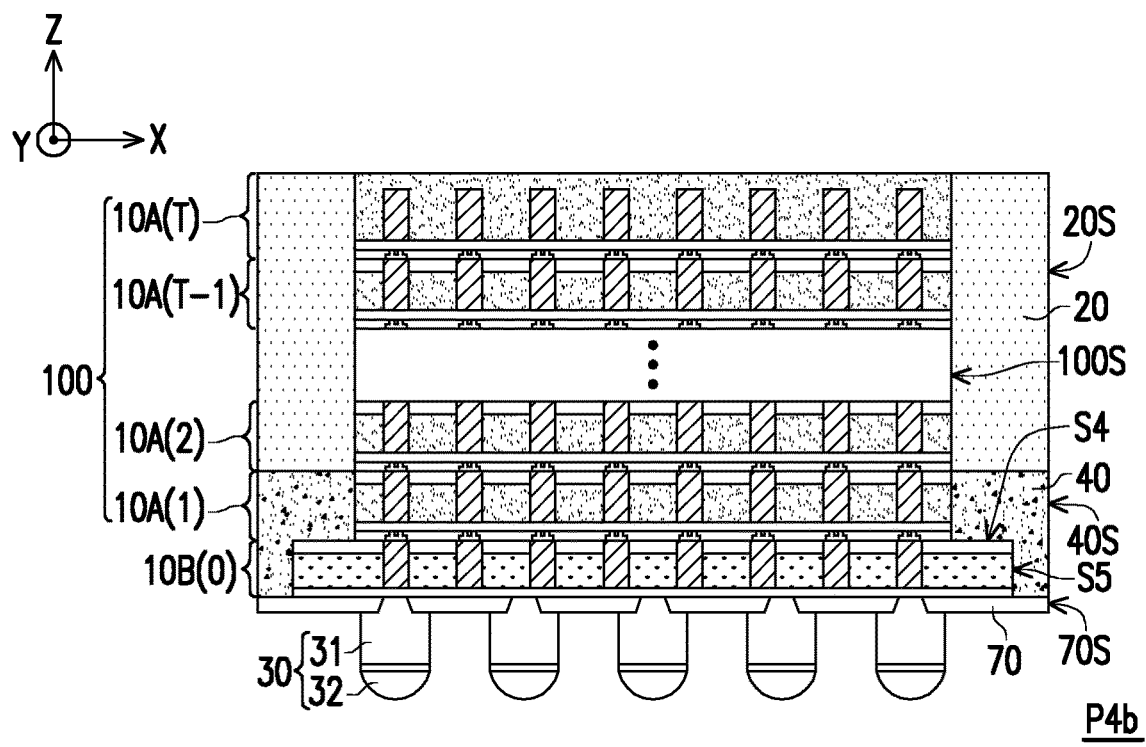
Figure 43:
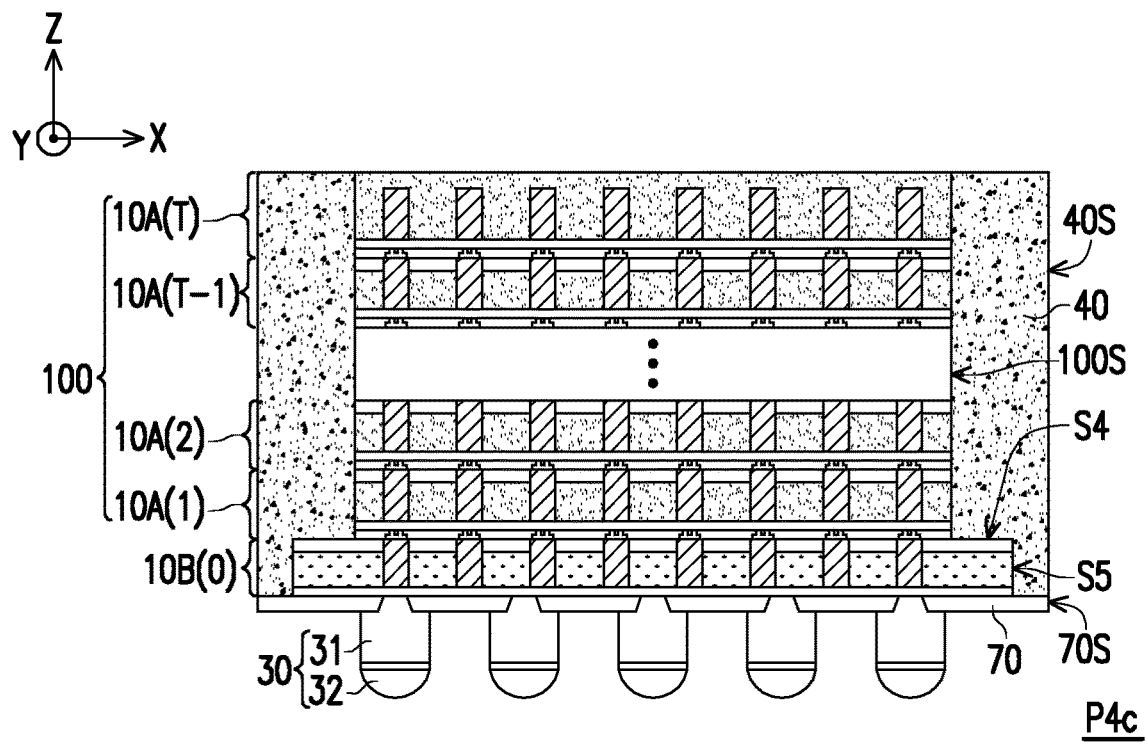
Figure 44:
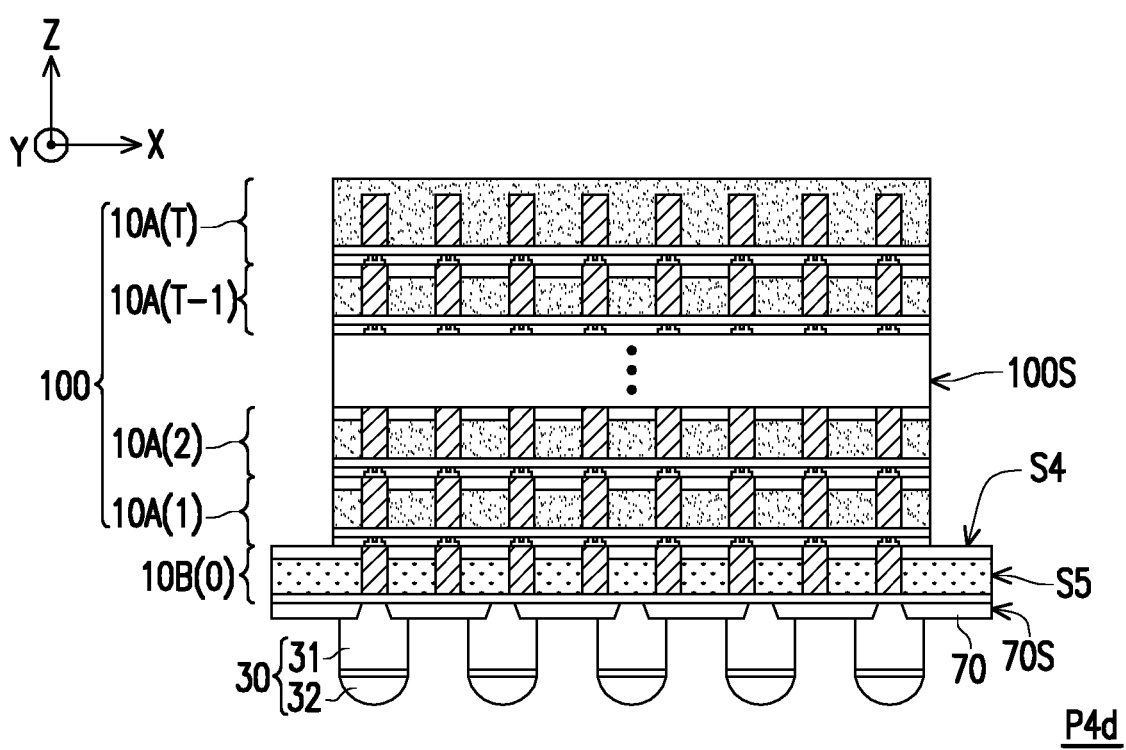

In some embodiments, as compared with the semiconductor structures P1a through P1d, no electromagnetic interference shielding element (e.g. 60 or 60A) may be included in semiconductor structures P4a through P4d respectively depicted in FIG. 41 through FIG. 44. The semiconductor structure P4a depicted in FIG. 41 is similar to the semiconductor structure P1a depicted in FIG. 24, the difference is that, in the semiconductor structure P4a, the electromagnetic interference shielding layer 60 is removed from the carrier die 10B and the die stack 100. As shown in FIG. 41, the sidewall 100S of the die stack 100, the sidewall S5 of the carrier die 10B and the back surface S4 of the carrier die 10B exposed by the die stack 100 are in physical contact with the insulating encapsulation 20. Similarly, the electromagnetic interference shielding element may also be removed from the semiconductor structures P1b, P1c and P1d to respectively form semiconductor structures P4b, P4c and P4d, as shown in FIG. 41 to FIG. 44.

Figure 45:
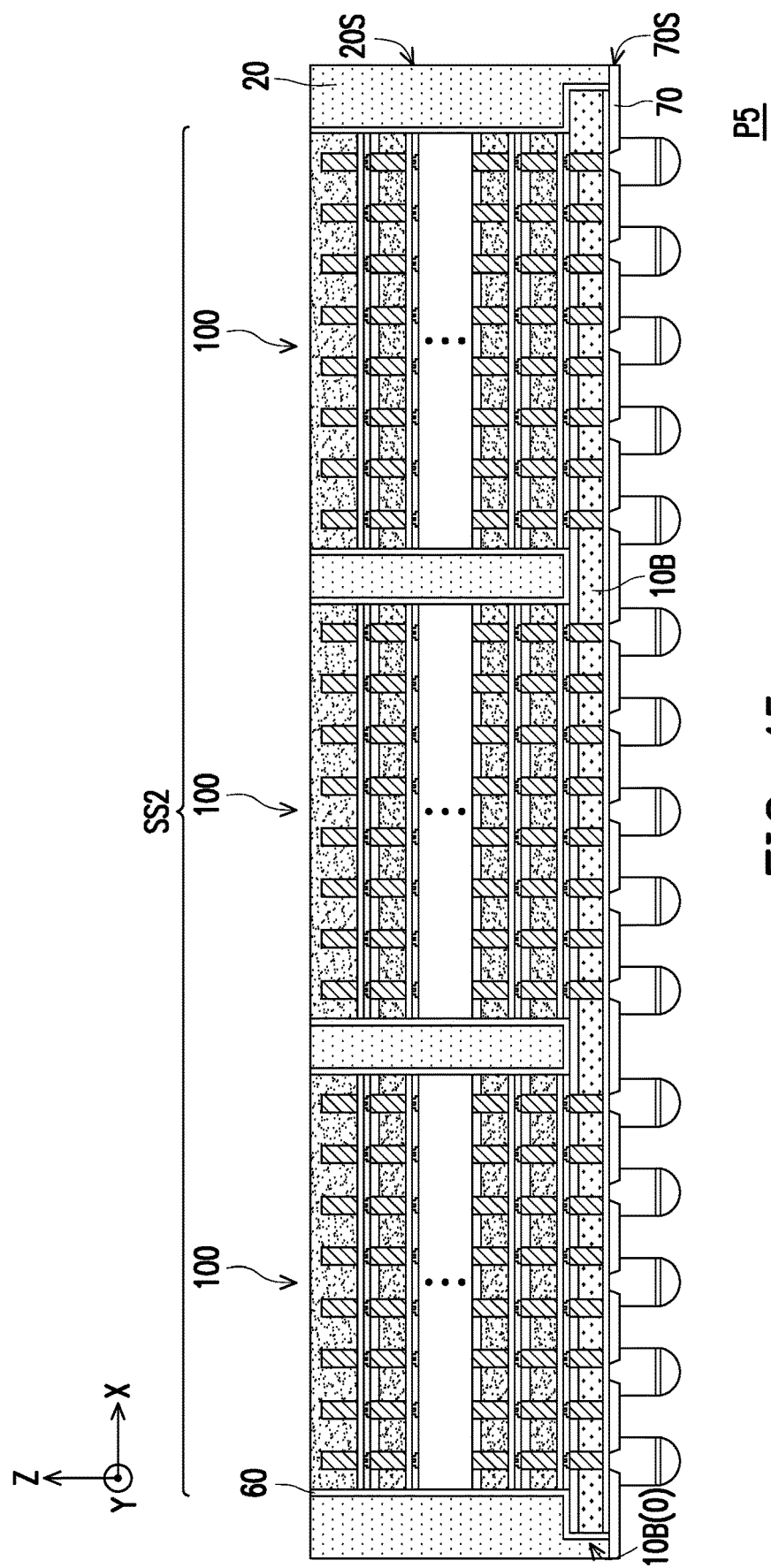
FIG. 45 is a schematic cross-sectional view showing a semiconductor structure in accordance with some embodiments of the disclosure.
Figure 46A:
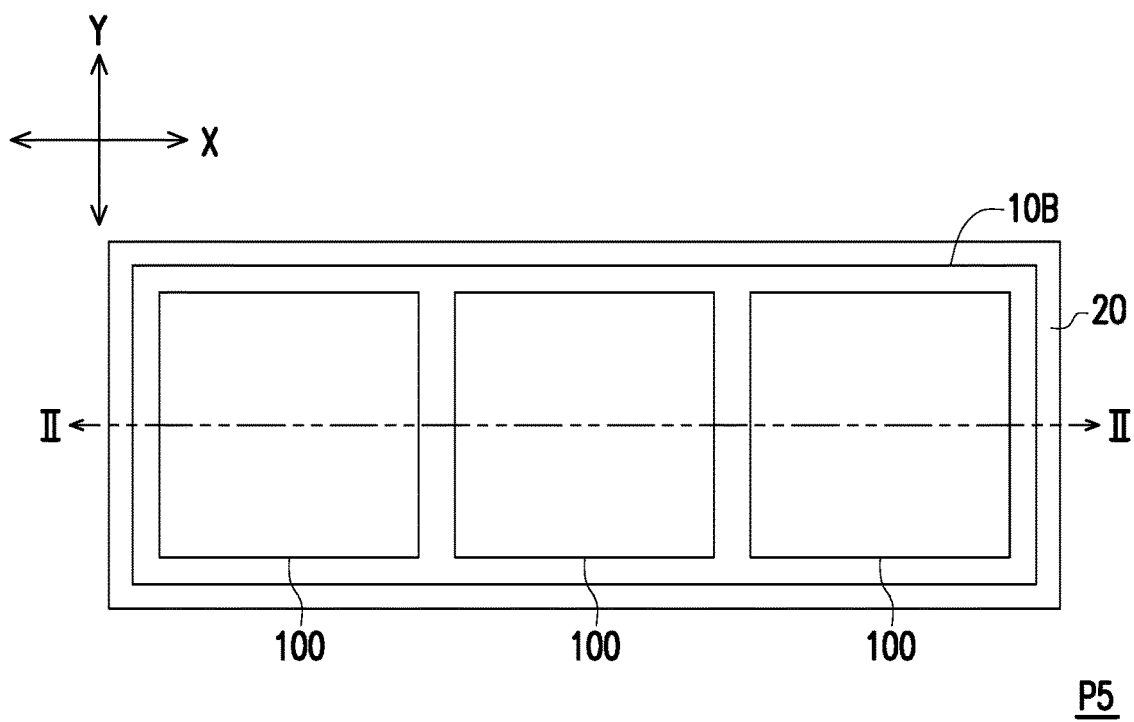
FIGS. 46A and 46B are schematic top views respectively illustrating a relative position between a semiconductor die, a carrier die and an insulating encapsulation of a semiconductor structure in accordance with some embodiments of the disclosure.
Figure 46B:
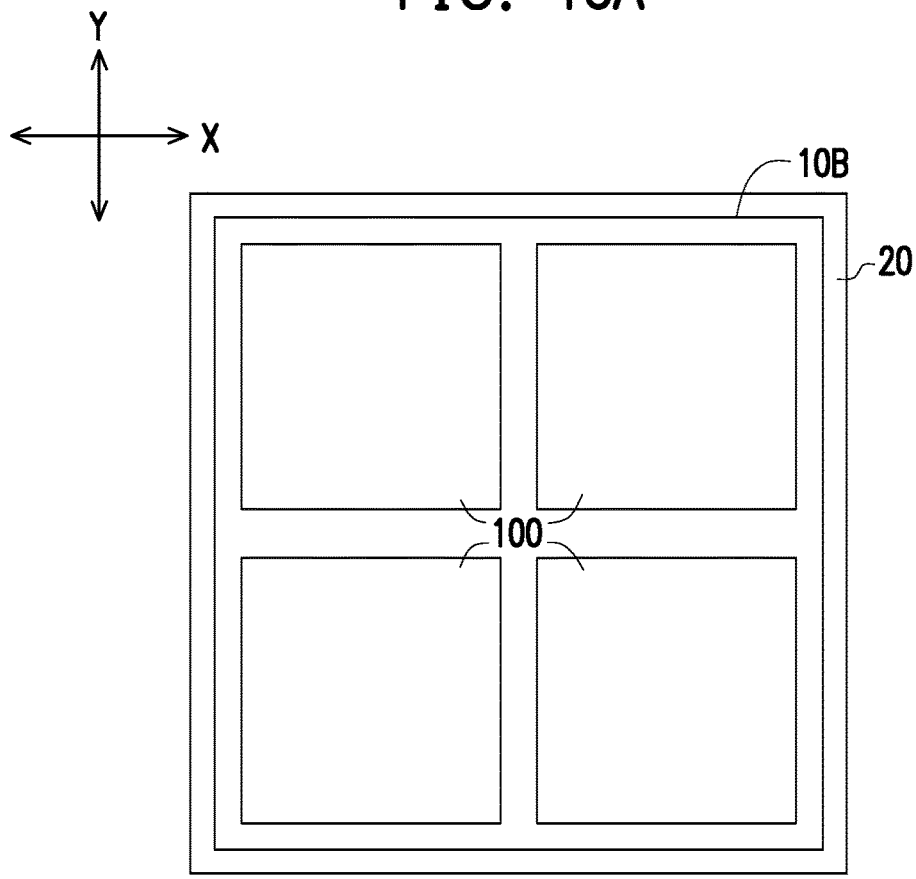

FIG. 45 is a schematic cross-sectional view showing a semiconductor structure in accordance with some embodiments of the disclosure. FIG. 46A and FIG. 46B are schematic top views respectively illustrating a relative position between a semiconductor die, a carrier die and an insulating encapsulation of a semiconductor structure in accordance with some embodiments of the disclosure. Like elements are designated with the same reference numbers for ease of understanding and the details thereof are not repeated herein. For example, FIG. 45 is the schematic cross-sectional view of a semiconductor structure P5 taken along a cross-sectional line II-II depicted in FIG. 46A.

The semiconductor structure P5 depicted in FIG. 41 is similar to the semiconductor structure P1a depicted in FIG. 24, the difference is that, in the semiconductor structure P4a, a plurality of the die stacks 100 are disposed on one base tier 10B(0). In other words, in the semiconductor structure P5, multiple semiconductor dies (e.g. 10A and 10A") are disposed on one carrier die 10B. In some embodiments, through the hybrid bonding, the die stacks 100 are bonded to the carrier die 10B at the base tier 10B(0) in a face-to-back configuration. In the disclosure, the die stacks 100 and the carrier die 10B together are referred to as a stacked structure SS2.

As illustrated in FIG. 45 and FIG. 46A, for example, the die stacks 100 are arranged in a matrix form on the carrier die 10B, such as the N×N or N×M arrays (N, M>0, N may or may not be equal to M). The size of the array for the die stacks 100 can be designated and selected based on the demand, and is not limited to the disclosure. In some embodiment, the die stacks 100 are arranged into a 1×3 array depicted in FIG. 46A. However, the disclosure is not limited thereto; in an alternative embodiment, the die stacks 100 may be arranged into a 2×2 array depicted in FIG. 46B.

In some embodiments, for the semiconductor structure P5, positioning locations of the die stacks 100 are within a positioning location of the carrier die 10B and within a positioning location of the insulating encapsulation 20, and the positioning location of the carrier die 10B is within the positioning location of the insulating encapsulation 20. In other words, the carrier die 10B and the insulating encapsulation 20 are overlapped with the die stacks 100 arranged side-by-side.

Figure 47:
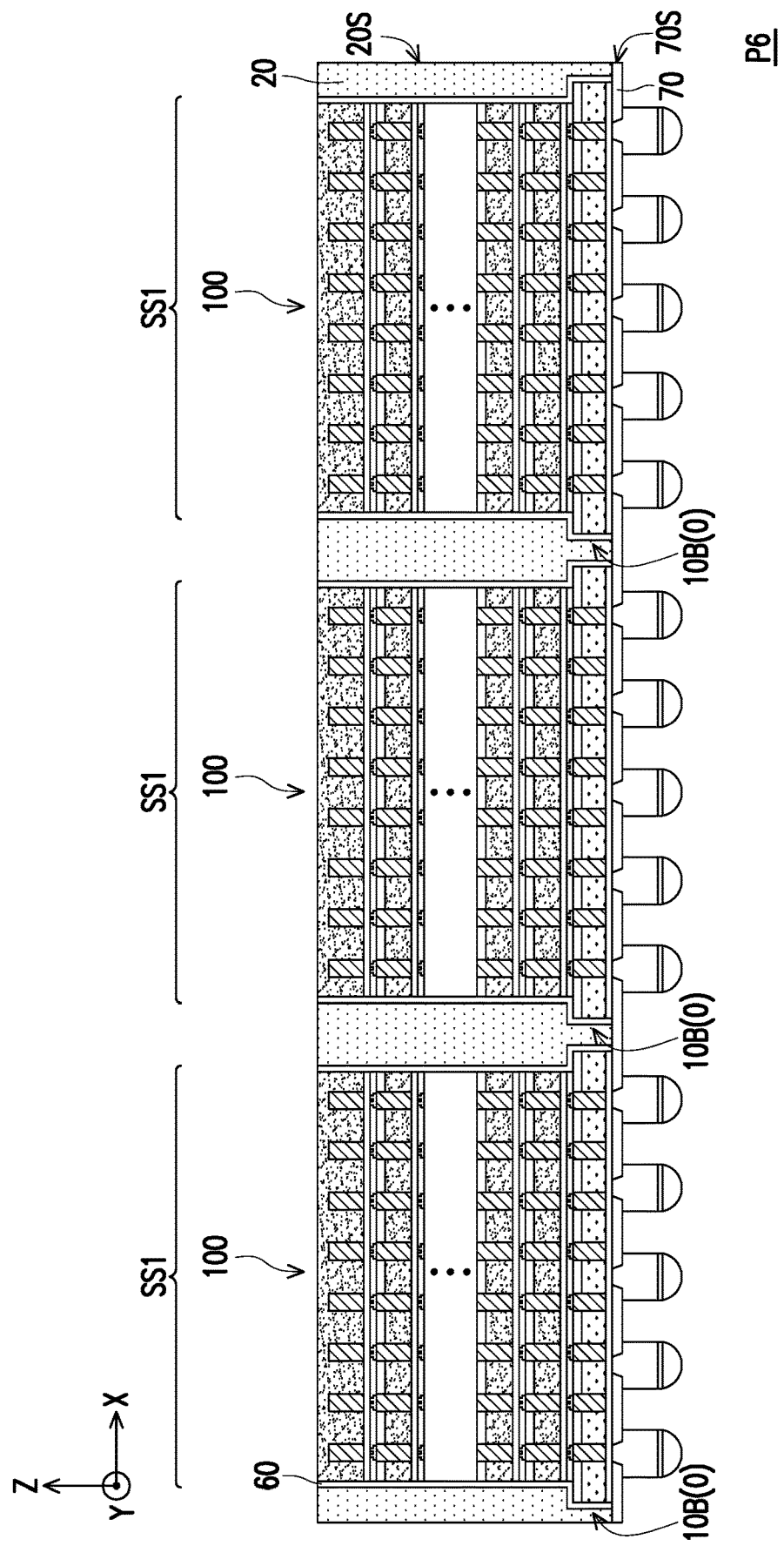
FIG. 47 is a schematic cross-sectional view showing a semiconductor structure in accordance with some embodiments of the disclosure.
Figure 48A:
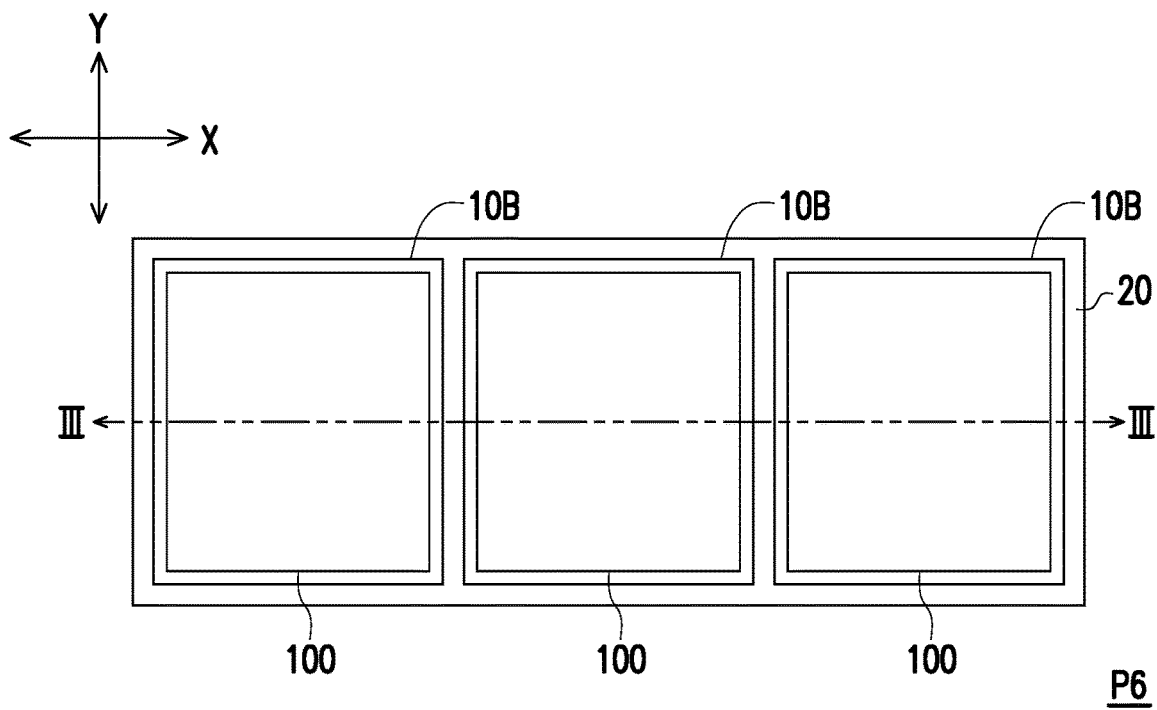
FIG. 48A and FIG. 48B are schematic top views respectively illustrating a relative position between a semiconductor die, a carrier die and an insulating encapsulation of a semiconductor structure in accordance with some embodiments of the disclosure.
Figure 48B:
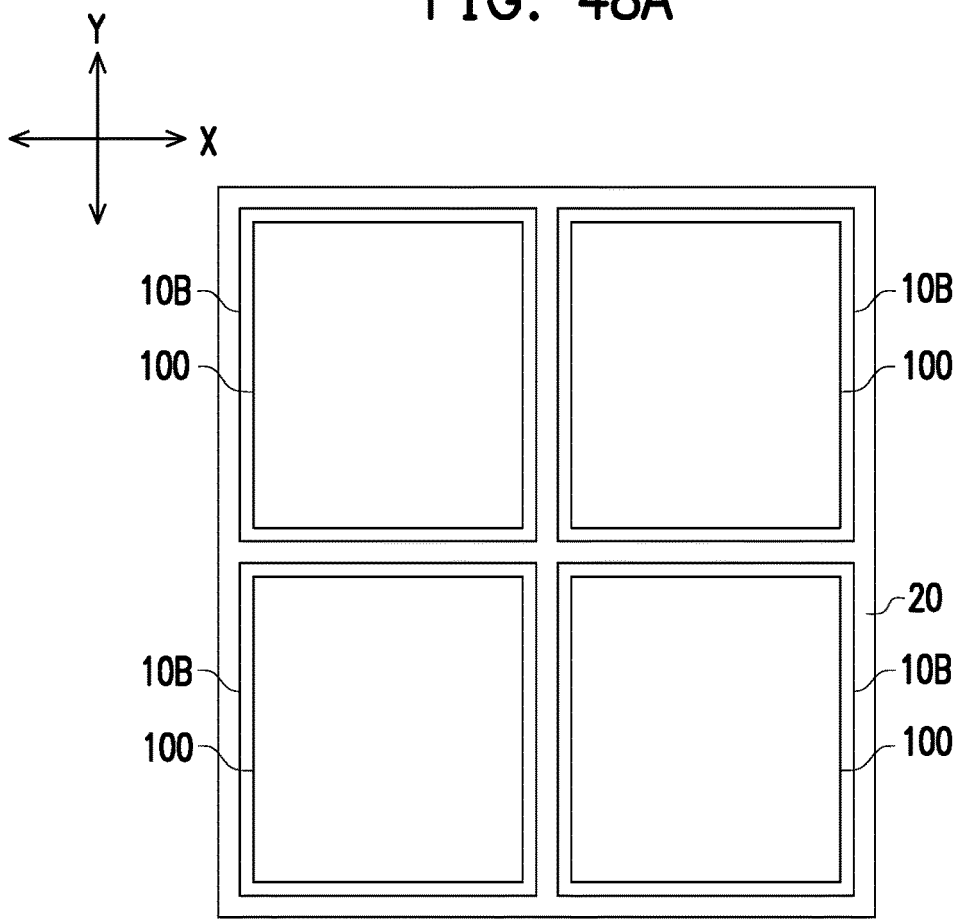

FIG. 47 is a schematic cross-sectional view showing a semiconductor structure in accordance with some embodiments of the disclosure. FIG. 48A and FIG. 48B are schematic top views respectively illustrating a relative position between a semiconductor die, a carrier die and an insulating encapsulation of a semiconductor structure in accordance with some embodiments of the disclosure. Like elements are designated with the same reference numbers for ease of understanding and the details thereof are not repeated herein. For example, FIG. 47 is the schematic cross-sectional view of a semiconductor structure P6 taken along a cross-sectional line depicted in FIG. 48A.

The semiconductor structure P6 depicted in FIG. 47 is similar to the semiconductor structure P1a depicted in FIG. 24, the difference is that, the semiconductor structure P4a includes multiple stacked structures SS1 (depicted in FIG. 24). As illustrated in FIG. 47 and FIG. 48A, for example, the stacked structures SS1 are arranged side-by-side in a matrix form in the, such as the N×N or N×M arrays (N, M>0, N may or may not be equal to M). The size of the array for the stacked structures SS1 can be designated and selected based on the demand, and is not limited to the disclosure. In some embodiment, the stacked structures SS1 are arranged into a 1×3 array depicted in FIG. 48A. However, the disclosure is not limited thereto; in an alternative embodiment, the stacked structures SS1 may be arranged into a 2×2 array depicted in FIG. 48B.

As illustrated in FIG. 47 and FIG. 48 (a top plane view on the X-Y plane), for the semiconductor structure P6, a positioning location of each die stack 100 is within a positioning location of each carrier die 10B and within a positioning location of the insulating encapsulation 20, and the positioning location of each carrier die 10B is within the positioning location of the insulating encapsulation 20. In other words, a perimeter of each die stack 100 is less than a perimeter of each carrier die 10B and a perimeter of the insulating encapsulation 20, and the perimeter of each carrier die 10B is less than the perimeter of the insulating encapsulation 20.

In addition, the stacked structures SS1 may be replaced with the stacked structure SS2 depicted in FIG. 45, in part or all. The disclosure is not limited thereto.

Figure 49:
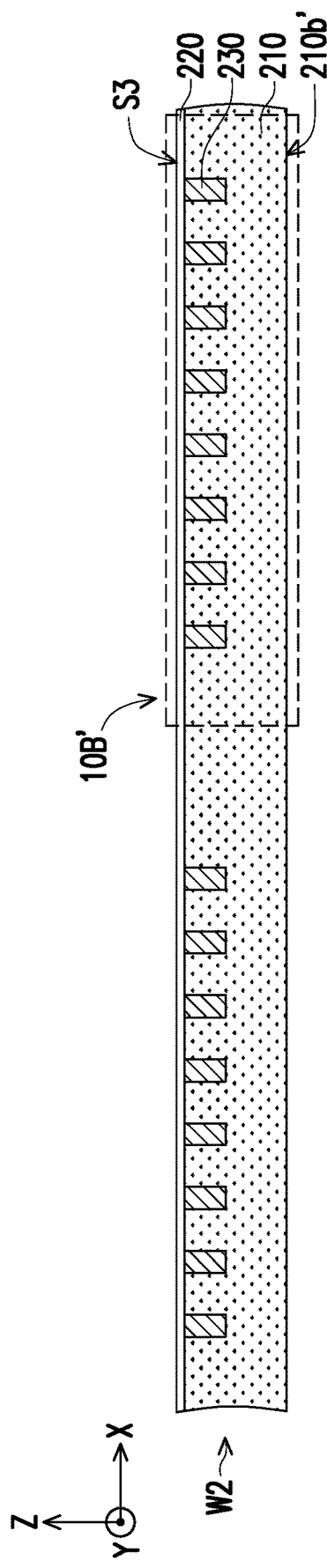
FIG. 49 through FIG. 56 are schematic cross-sectional views showing various stages in a manufacturing method of a semiconductor structure in accordance with some embodiments of the disclosure.

FIG. 49 through FIG. 56 are schematic cross-sectional views showing various stages in a manufacturing method of a semiconductor structure in accordance with some embodiments of the disclosure. FIG. 57 is a schematic top view illustrating a relative position between a semiconductor die, a carrier die and an insulating encapsulation of a semiconductor structure in accordance with some embodiments of the disclosure. For example, FIG. 49 is the schematic cross-sectional view of a semiconductor structure P7 taken along a cross-sectional line IV-IV depicted in FIG. 57. Like elements are designated with the same reference numbers for ease of understanding and the details thereof are not repeated herein.

Referring to FIG. 49, in some embodiments, a semiconductor wafer W2 is provided. In some embodiments, the semiconductor wafer W2 includes a plurality of semiconductor dies 10B' connected to one another. The details of the semiconductor dies 10B' have been described in FIG. 5, thus is not repeated herein for simplicity. For example, each of the semiconductor dies 10B' may include an integrated circuit device (e.g., a logic die, a memory die, a radio frequency die, a power management die, a micro-electro-mechanical-system (MEMS) die, the like, or combinations of these).

Figure 50:
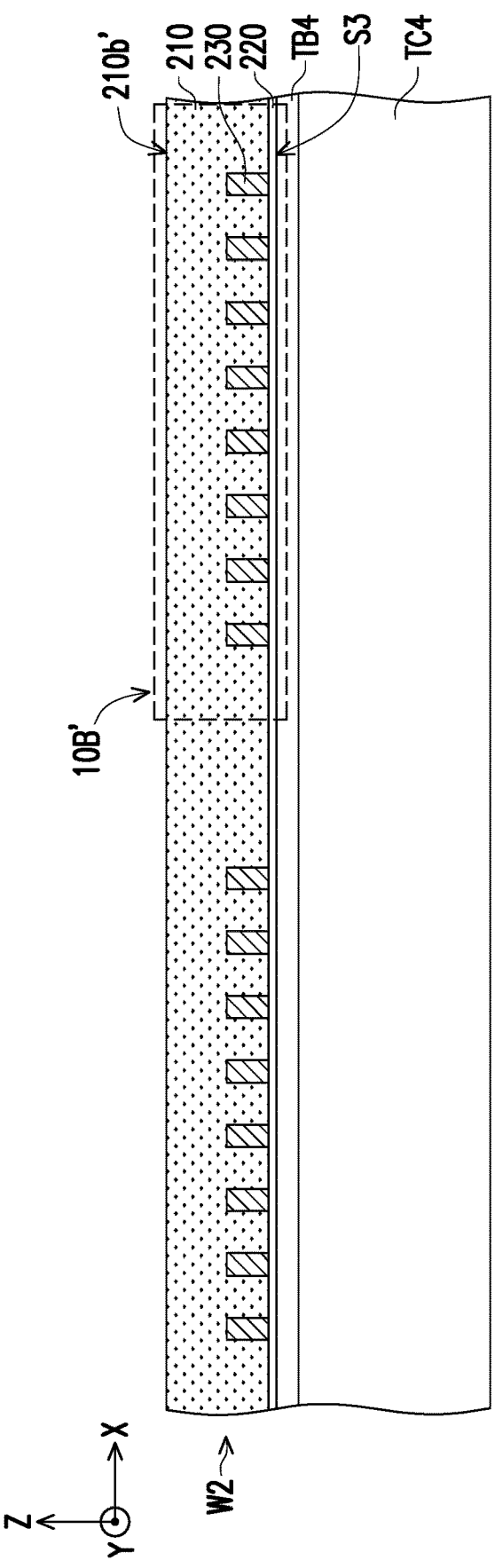

Referring to FIG. 50, in some embodiments, the semiconductor wafer W2 is disposed on a temporary carrier TC4 through a temporary bonding layer TB4. In some embodiments, the temporary bonding layer TB4 is deposited on the temporary carrier TC4, and the semiconductor wafer W2 is attached to the temporary carrier TC4 through the temporary bonding layer TB4 by placing the front surfaces S3 of the semiconductor dies 10B' to be in contact with the temporary bonding layer TB4. Alternatively, the temporary bonding layer TB4 may be omitted. The formation and/or material of the temporary bonding layer TB4 and the temporary carrier TC4 are similar to the formation and/or material of the temporary bonding layer TB1 and the temporary carrier TC1 described in FIG. 2, thus are not repeated herein. As shown in FIG. 50, for example, the bottom surfaces 210b' of the semiconductor dies 10B' face upwardly for subsequent processing.

Figure 51:
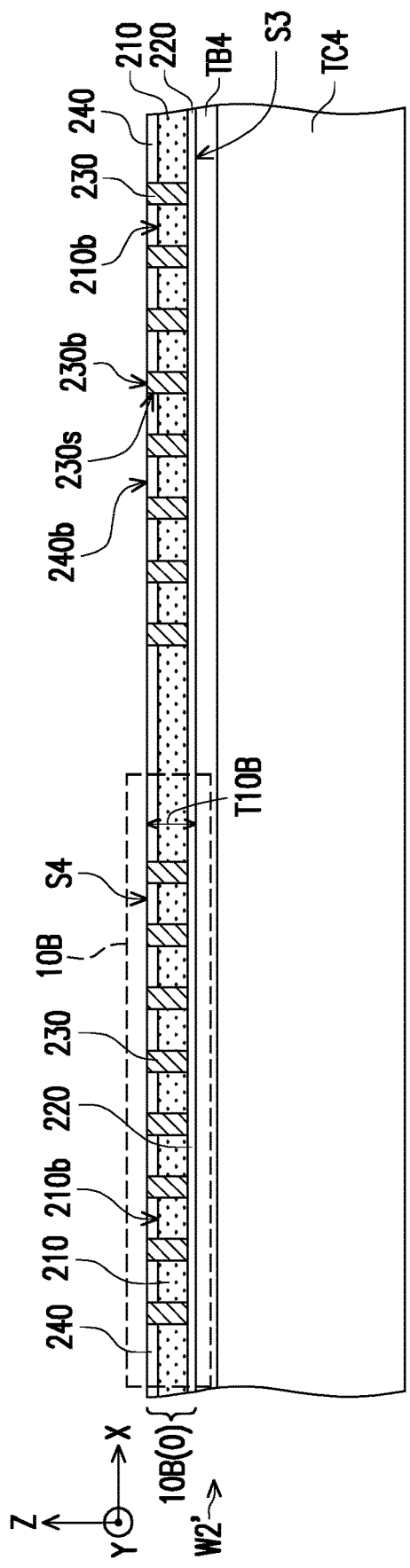

Referring to FIG. 51, in some embodiments, the semiconductor wafer W2 is processed to form a semiconductor wafer W2' having a plurality of semiconductor dies 10B connected to one another. The semiconductor dies 10B are referred to as the carrier dies 10B, in some embodiment. For example, the semiconductor wafer W2 is processed through the steps described in FIG. 7 through FIG. 10, so the detailed descriptions are omitted for brevity. As shown in FIG. 51, each of the carrier dies 10B includes the semiconductor substrate 210 having semiconductor devices formed therein, the interconnect structure 220 formed over the semiconductor substrate 210 and including dielectric layers and metallization patterns proximal to the front surface S3, the isolation layer 240 formed over the semiconductor substrate 210 opposite to the interconnect structure 220, and the conductive vias 230 formed in the semiconductor substrate 210, extending into the dielectric layers of the interconnect structure 220 to be in physical and electrical contact with the metallization pattern of the interconnect structure 220 and penetrating through the isolation layer 240. The conductive vias 230 of each of the carrier dies 10B may be electrically coupled to the semiconductor devices in the semiconductor substrate 210 through the metallization patterns of the interconnect structure 220. In some embodiments, the semiconductor dies 10B each have the front surface S3 and the back surface S4 opposite to the front surface S3. In some embodiments, each of the carrier dies 10B is referred to as one base tier 10B(0) for one die stack 100.

Figure 52:
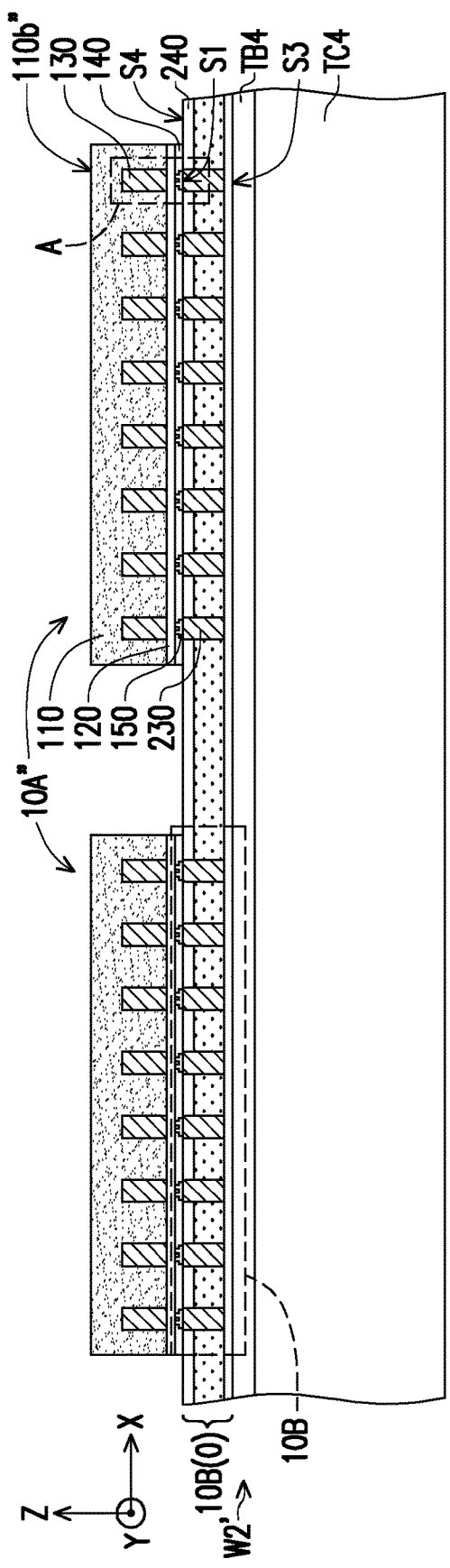

Referring to FIG. 52, in some embodiments, a first set of semiconductor dies 10A" are provided, where these semiconductor dies 10A" are stacked on the carrier dies 10B. For example, the semiconductor dies 10A" are fabricated as described in conjunction with FIG. 1 through FIG. 4. In some embodiments, the semiconductor dies 10A" are bonded to the carrier dies 10B in a face-to-back configuration, through a hybrid bonding process. The bonding process and the bonding relationship/configuration are described in FIG. 11 in combination with FIG. 26A and FIG. 26B (illustrating the enlarged cross-sectional views indicated by the dashed box A), and thus are not repeated herein. For example, as shown in FIG. 52, the front surfaces S1 of the semiconductor dies 10A" are bonded to the back surface S4 of the carrier dies 10B, respectively.

Figure 53:
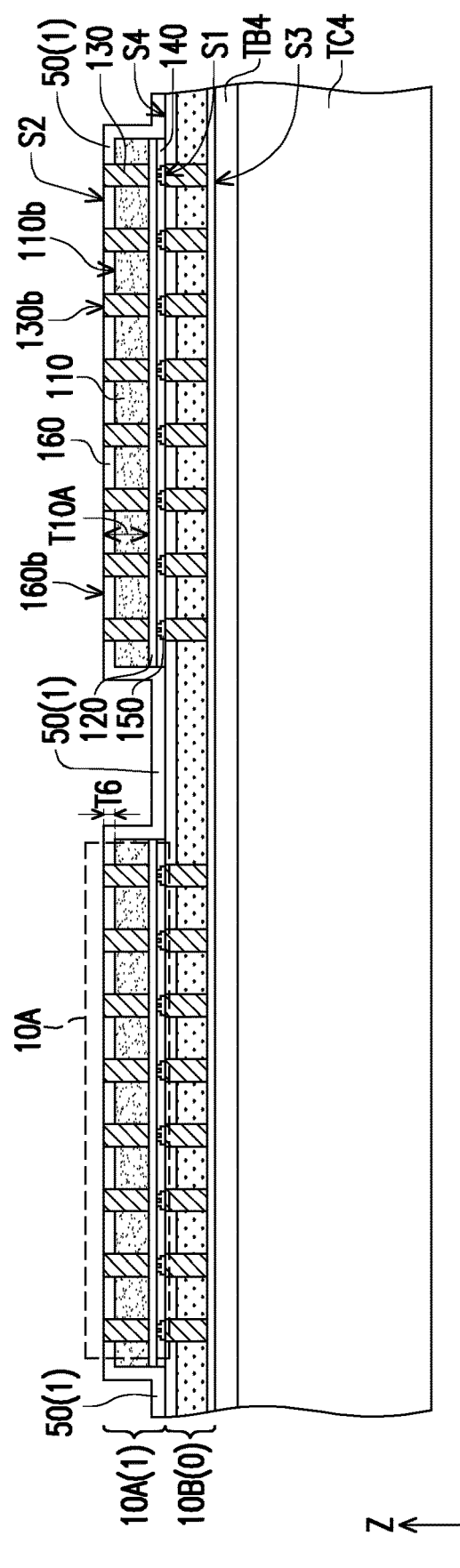

Referring to FIG. 53, in some embodiments, the first set of the semiconductor dies 10A" are processed to form semiconductor dies 10A of the first tier 10A(1) in the die stacks 100. For example, the semiconductor dies 10A" are processed through the steps described in FIG. 12 through FIG. 16, so the detailed descriptions are omitted for brevity. As shown in FIG. 53, each of the semiconductor die 10A includes the semiconductor substrate 110 having semiconductor devices (not shown) formed therein, the interconnect structure 120 formed on the semiconductor substrate 110, the plurality of conductive vias 130 formed in the semiconductor substrate 110 and extending into the interconnect structure 120, the dielectric layer 140 formed on the interconnect structure 120 and opposite to the semiconductor substrate 110, the bonding conductors 150 formed over the interconnect structure 120 and laterally covered by the dielectric layer 140, and the isolation layer 160 disposed on the semiconductor substrate 110 opposite to the interconnect structure 120 and with the conductive vias 130 penetrating therethrough. In some embodiments, the semiconductor dies 10A each have the front surface S1 and the back surface S2 opposite to the front surface S1. For example, as shown in FIG. 53, the semiconductor dies 10A are separated from each other through the isolation structure 50(1), where the isolation structure 50(1) is over the semiconductor wafer W2'.

Figure 54:
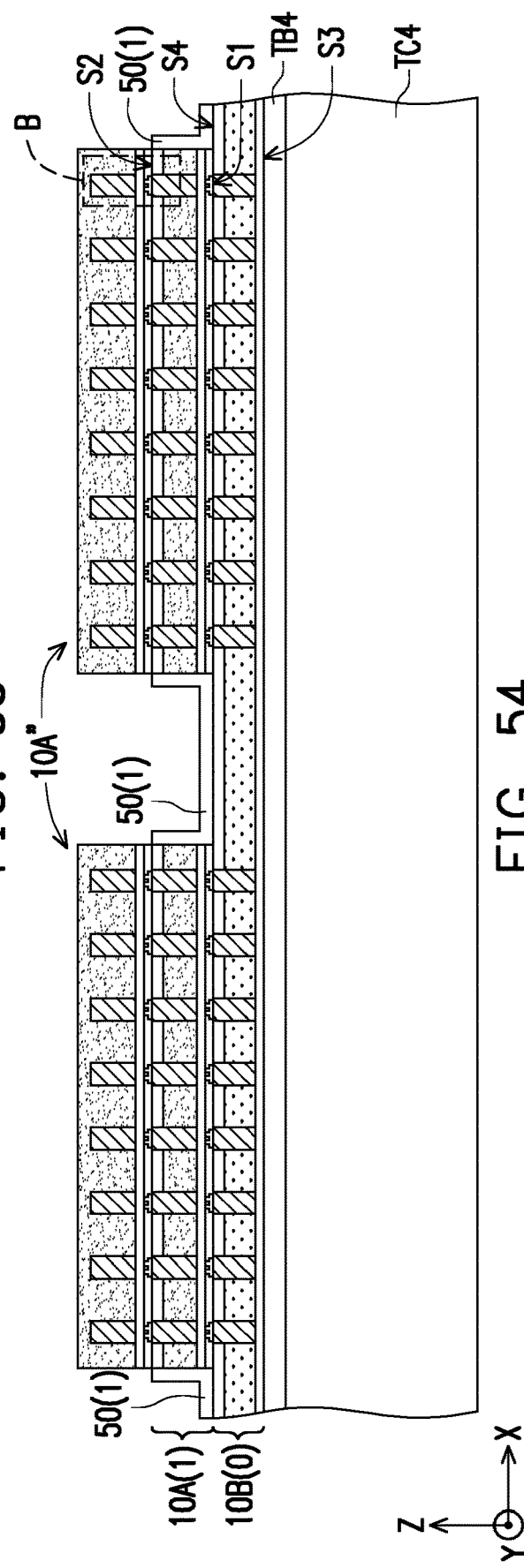

Referring to FIG. 54, in some embodiments, a second set of the semiconductor dies 10OA" are provided, and these semiconductor dies 10A" are respectively stacked on the semiconductor dies 10A of the first tier 10A(1). In the disclosure, each semiconductor die 10A" (from the second set) is disposed on one of the semiconductor dies 10A of the first tier 10A(1) in a face-to-back configuration for forming a second tier (e.g. 10A(2) depicted in FIG. 55) of the die stacks 100. In some embodiments, the semiconductor dies 10A" (from the second set) are bonded to the semiconductor dies 10A of the first tier 10A(1) through a hybrid bonding process. The bonding process and the bonding relationship/configuration are described in FIG. 17 in combination with FIG. 27A and FIG. 27B (illustrating the enlarged cross-sectional views indicated by the dashed box B), and thus are not repeated herein. For example, as shown in FIG. 54, the front surfaces S1 of the semiconductor dies 10A" (from the second set) are bonded to the back surface S2 of the semiconductor dies 10A of the first tier 10A(1), respectively. For example, the conductive vias 130 are not yet accessibly revealed by the semiconductor substrate 110.

Figure 55:
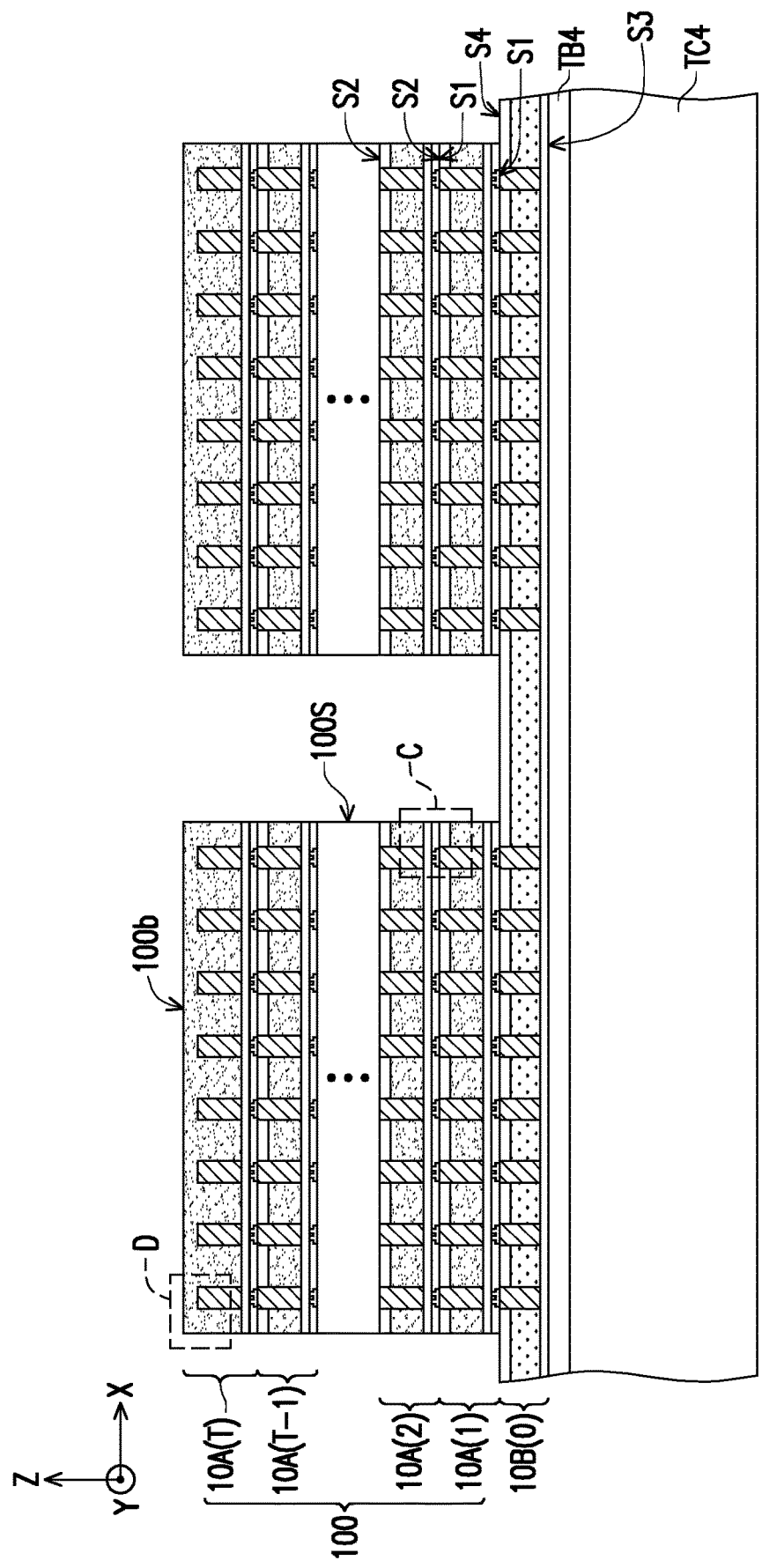

Referring to FIG. 55, in some embodiments, the die stacks 100 is formed over the carrier dies 10B. For example, each of the die stacks 100 includes at least one inner tier (e.g. 10A(1) through 10A(T−1)) and a topmost tier 10A(T). In some embodiments, the structure depicted in FIG. 54 is processed to form the die stacks 100. For example, in each die stack 100, each inner tier (e.g. 10A(2) through 10A(T−1)) may be fabricated by the same steps forming the first tier 10A(1) as described in FIG. 53, and the topmost tier 10A(T) may be fabricated by the process as described in FIG. 54, and thus the detailed descriptions are omitted for brevity. That is, the semiconductor dies 10A at the inner tiers (e.g., 10A(1) through 10A(T−1)) may be individually fabricated by repeating the steps as described in conjunction with FIG. 12 through FIG. 16, and the topmost tier 10A(T) may be fabricated by repeating the steps as described in conduction with FIG. 17. With such, the semiconductor dies 10A at the first tier 10A(1) through the (T−1)th tier 10A(T−1) of each die stack 100 may be similar or the same in configurations, functions, and properties due to the similar forming steps are utilized. In some embodiments, after forming the die stacks 100, the isolation structure is removed from the semiconductor wafer W2'. For example, for every two adjacent tiers of each die stack 100, the upper tier is bonded to the lower tier in a face-to-back configuration. By such bonding (without uses of any other external connectors), the semiconductor structure P7 having a better form factor with a die stack of a higher density in devices is achieved.

Figure 56:
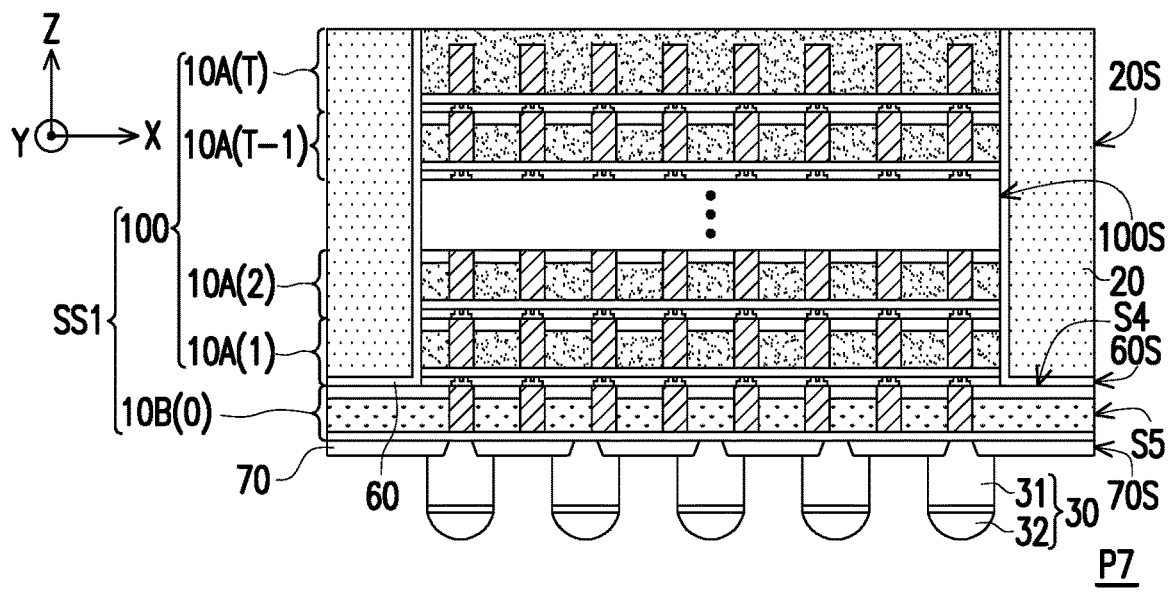
Figure 57:
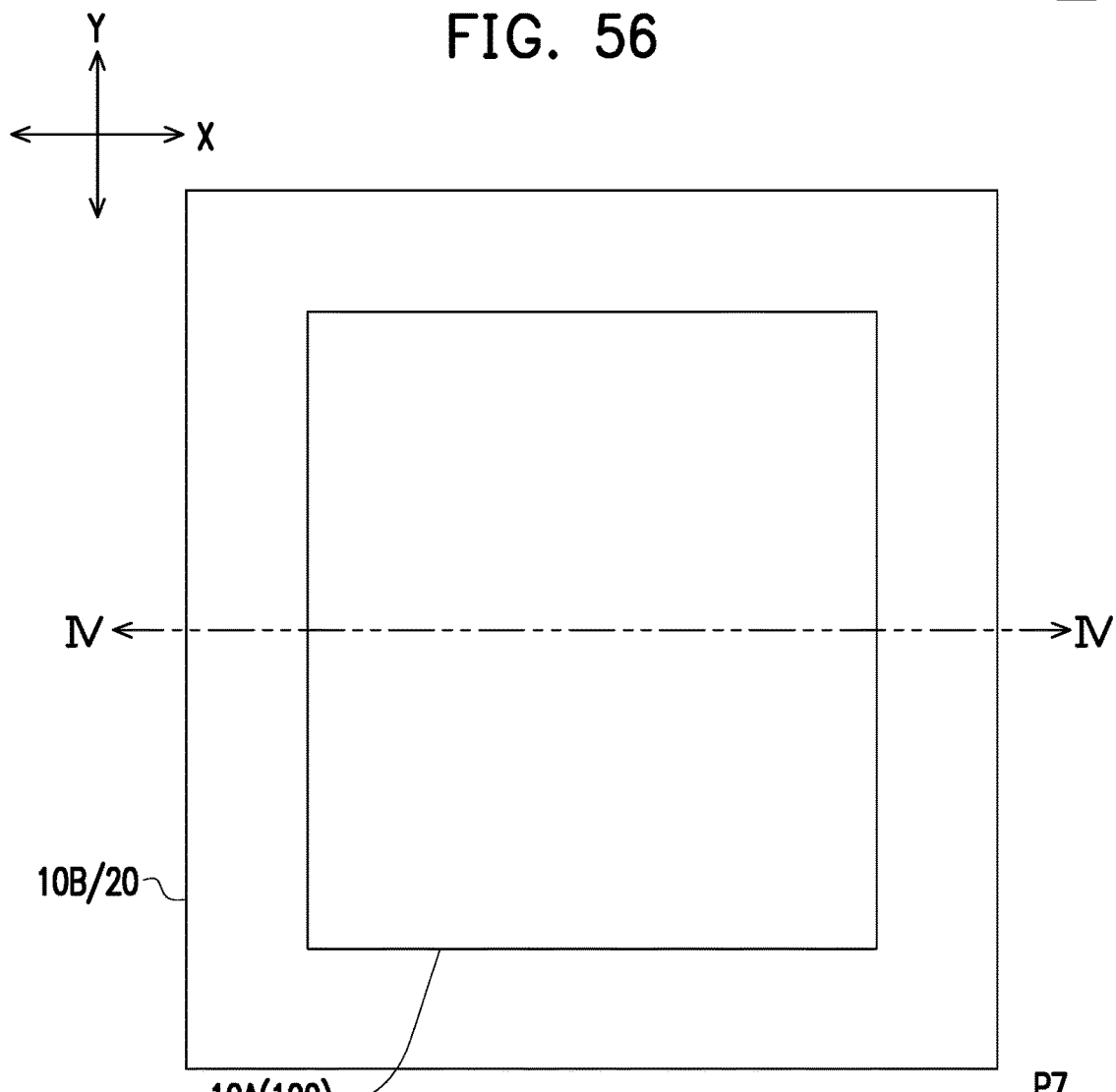
FIG. 57 is a schematic top view illustrating a relative position between a semiconductor die, a carrier die and an insulating encapsulation of a semiconductor structure in accordance with some embodiments of the disclosure.

Referring to FIG. 56, in some embodiments, the semiconductor structure P7 is manufactured by processing the structure depicted in FIG. 55 with the steps described in FIG. 20 through FIG. 24, thus the detailed descriptions are omitted for brevity. In some embodiments, the semiconductor structure P7 has the carrier die 10B, the die stack 100 disposed thereon, the insulating encapsulation 20 formed on the carrier die 10B and the die stack 100, the electromagnetic interference shielding layer 60 sandwiched between the insulating encapsulation 20 and the carrier die 10B and between the insulating encapsulation 20 and the die stack 100, the protection layer 70 disposed on the carrier die 10, and the conductive terminals 30 disposed on the insulating encapsulation 20. As shown in FIG. 56, a sidewall 20S of the insulating encapsulation 20 is aligned with a sidewall S5 of the carrier die 10B and a sidewall 70S of the protection layer 70, for example. That is, the sidewall 20S of the insulating encapsulation 20 may be substantially levelled with and coplanar to the sidewall S5 of the carrier die 10B and the sidewall 70S of the protection layer 70.

As illustrated in FIG. 56 and FIG. 57 (a top plane view on the X-Y plane), for the semiconductor structure P7, a positioning location of the die stack 100 is within a positioning location of the carrier die 10B and within a positioning location of the insulating encapsulation 20, where the edges of the carrier die 10B are overlapped with the edges of the insulating encapsulation 20. In other words, a perimeter of the die stack 100 is less than a perimeter of the carrier die 10B and a perimeter of the insulating encapsulation 20, and the perimeter of the carrier die 10B is substantially equal to the perimeter of the insulating encapsulation 20.

In addition, the modifications to the semiconductor structure P1a may also be adopted by the semiconductor structures P5, P6, and P7. Since the details of the modifications to the semiconductor structure P1a are described in FIG. 30 to FIG. 44, so the detailed descriptions are omitted for brevity.

Figure 58:
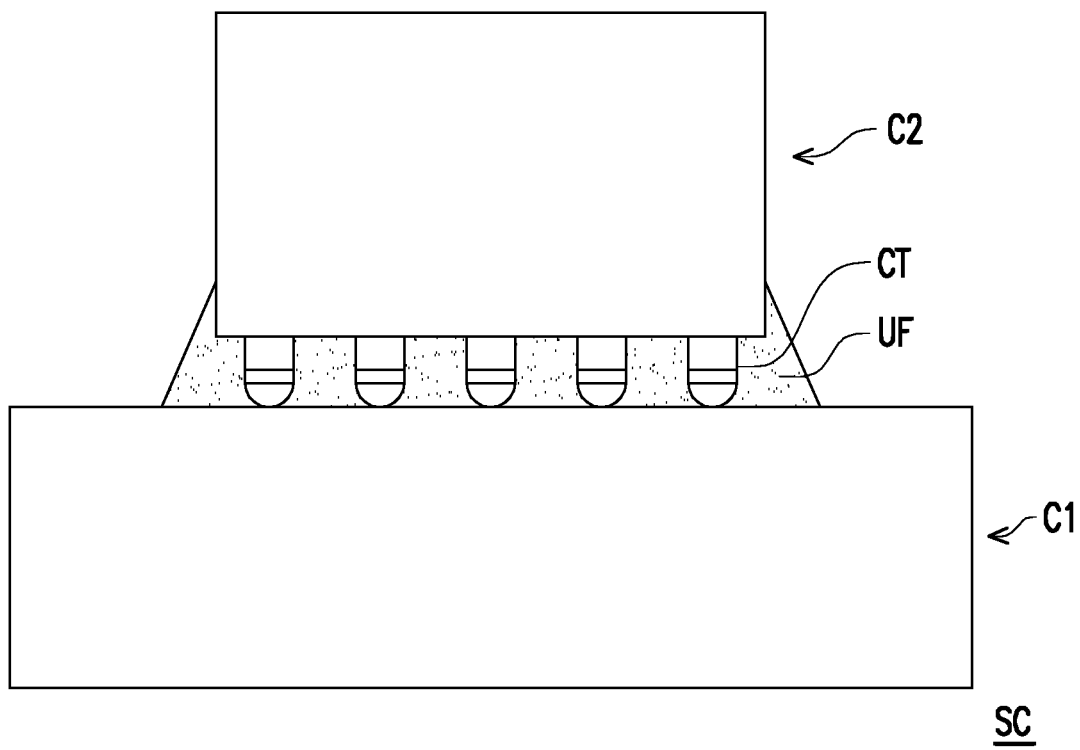
FIG. 58 is a schematic cross-sectional view showing an application of a semiconductor structure in accordance with some embodiments of the disclosure.

FIG. 58 is a schematic cross-sectional view showing an application of a semiconductor structure in accordance with some embodiments of the disclosure. Like elements are designated with the same reference numbers for ease of understanding and the details thereof are not repeated herein. Referring to FIG. 58, a component assembly SC including a first component C1 and a second component C2 disposed over the first component C1 is provided. The first component C1 may be or may include an interposer, a package substrate, a printed circuit board (PCB), a printed wiring board, and/or other carrier that is capable of carrying integrated circuits. In some embodiments, the second component C2 mounted on the first component C1 is similar to one of the semiconductor structures P1a-P1d, P2a-P2d, P3a-P3d, P4a-P4d, P5, P6 and P7 described above. For example, one or more the semiconductor structures (e.g., P1a-P1d, P2a-P2d, P3a-P3d, P4a-P4d, P5, P6 and P7) may be electrically coupled to the first component C1 through a plurality of terminals CT. The terminals CT may be the conductive terminals 30.

In some embodiments, an underfill layer UF is formed between the gap of the first component C1 and the second component C2 to at least laterally cover the terminals CT. Alternatively, the underfill layer UF is omitted. In one embodiment, the underfill layer UF may be formed by underfill dispensing or any other suitable method. In some embodiments, a material of the underfill layer UF may be the same or different from a material of the insulating encapsulations 20, 40, the disclosure is not limited thereto. Owing to the underfill layer UF, a bonding strength between the first component C1 and the second component C2 is enhanced.

In some other embodiments, the second component C2 mounted on the first component C1 may be an integrated fan-out (InFO) package including at least one semiconductor structure (e.g., P1a-P1d, P2a-P2d, P3a-P3d, P4a-P4d, P5, P6 and P7 respectively described above in conjunction with FIG. 24, FIG. 31 through FIG. 44, FIG. 45, FIG. 47 and FIG. 56) packaged therein. For example, the second component C2 includes a plurality of semiconductor structures (e.g., any combinations of semiconductor structures P1a-P1d, P2a-P2d, P3a-P3d, P4a-P4d, P5, P6 and P7) disposed side by side and surrounding by a packaging encapsulation (not shown; e.g., a molding compound). The second component C2 may further include a fan-out redistribution structure (not shown) formed on the packaging encapsulation and these semiconductor structures laterally encapsulated by the packaging encapsulation, and the fan-out redistribution structure may be electrically coupled to these semiconductor structures. In such embodiments, the terminals CT may be controlled collapse chip connection (C4) bumps, ball grid array (BGA) bumps, other suitable terminals having the dimension greater than the conductive terminals of the semiconductor structures, and/or the like. For example, the terminals CT are formed on the fan-out redistribution structure to be electrically coupled to the first component C1, and these semiconductor structures are electrically coupled to the terminals CT through the fan-out redistribution structure.

Other packaging techniques may be used to form the component assembly SC, which are not limited in the disclosure. For example, the component assembly SC is formed using a wafer level packaging (WLP), a chip-on-wafer-on-substrate (CoWoS) process, a chip-on-chip-on-substrate (CoCoS) process, etc. The component assembly SC may be a part of an electronic system for such as computers (e.g., high-performance computer), computational devices used in conjunction with an artificial intelligence system, wireless communication devices, computer-related peripherals, entertainment devices, etc. The component assembly SC including the semiconductor structure(s) discussed herein may provide high bandwidth data communication. It should be noted that other electronic applications are also possible. Alternatively, an additional terminals may be physical and electrical contact with first component C1 opposite to the terminals CT for electrical connection to any other external component(s).

In accordance with some embodiments, a semiconductor structure includes a stacked structure. The stacked structure includes a first semiconductor die and a second semiconductor die. The first semiconductor die includes a first semiconductor substrate having a first active surface and a first back surface opposite to the first active surface. The second semiconductor die is over the first semiconductor die and includes a second semiconductor substrate having a second active surface and a second back surface opposite to the second active surface. The second semiconductor die is bonded to the first semiconductor die through joining the second active surface to the first back surface at a first hybrid bonding interface along a vertical direction. Along a lateral direction, a first dimension of the first semiconductor die is greater than a second dimension of the second semiconductor die.

In accordance with some embodiments, a semiconductor structure includes a semiconductor device, a plurality of conductive terminals, and a connection structure. The semiconductor device includes a base tier and a die stack. The base tier includes a first die. The die stack is bonded to the base tier and includes second dies arranged into at least one inner tier and an outmost tier. The die stack and the base tier are bonded through a first hybrid bonding interface. The at least one inner tier and the outmost tier are bonded through a second hybrid bonding interface. An offset is between a sidewall of the base tier and a sidewall of the die stack, wherein the first die and the second dies are electrically communicated to each other. The plurality of conductive terminals are over and electrically connected to the semiconductor device. The connection structure is located between the semiconductor device and the plurality of conductive terminals, wherein the base tier is located between the connection structure and the die stack, and the at least one inner tier is located between the base tier and the outmost tier.

In accordance with some embodiments, a method of manufacturing semiconductor structure includes the following steps, forming at least one stacked structure comprising: providing a base tier comprising a first semiconductor die and forming a die stack comprising second semiconductor dies on the base tier through hybrid bonding, wherein a first dimension of the base tier is greater than a second dimension of the die stack along a lateral direction, and the first semiconductor die is electrically connected to the second semiconductor dies; forming a connection structure over the at least one stacked structure, the base tier being between the connection structure and the die stack; and disposing a plurality of conductive terminals over the at least one stacked structure and electrically connecting the plurality of conductive terminals to the first semiconductor die, the connection structure being between the plurality of conductive terminals and the base tier.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:
   a stacked structure, comprising:
      a first semiconductor die, comprising a first semiconductor substrate having a first active surface and a first back surface opposite to the first active surface and a plurality of first conductive vias penetrating through the first semiconductor substrate; and
      a second semiconductor die, over the first semiconductor die, comprising a second semiconductor substrate having a second active surface and a second back surface opposite to the second active surface, and being bonded to the first semiconductor die through joining the second active surface to the first back surface at a first hybrid bonding interface along a vertical direction,
      wherein along a lateral direction, a first dimension of the first semiconductor die is greater than a second dimension of the second semiconductor die, and a positioning location of the second semiconductor die is within a positioning location of the first semiconductor die in a projection along the vertical direction.

2. The semiconductor structure of claim 1, wherein the second semiconductor die further comprises a plurality of second conductive vias penetrating through the second semiconductor substrate, and
   wherein the plurality of first conductive vias are respectively joined to the plurality of second conductive vias at the first hybrid bonding interface, and the first semiconductor die are electrically connected and communicated to the second semiconductor die through the plurality of first conductive vias and the plurality of second conductive vias.

3. The semiconductor structure of claim 2, wherein the second semiconductor die comprises a first stack of second semiconductor dies,
   wherein two adjacent second semiconductor dies of the first stack of second semiconductor dies are bonded to each other through another hybrid bonding interface, and a second active surface of one of the two adjacent second semiconductor dies is joined to a second back surface of other one of the two adjacent second semiconductor dies at the another hybrid bonding interface,
   wherein the first stack of second semiconductor dies are electrically connected and communicated to each other through the plurality of second conductive vias, and are electrically connected and communicated to the first semiconductor die through the plurality of first conductive vias and the plurality of second conductive vias.

4. The semiconductor structure of claim 3, wherein the stacked structure further comprises:
   a third semiconductor die, comprising a third semiconductor substrate and a plurality of third conductive vias embedded in the third semiconductor substrate, and having a third active surface and a third back surface opposite to the third active surface, wherein:
      the third semiconductor die is bonded to an outmost second semiconductor die of the first stack opposite to the first semiconductor die through joining the third active surface to a second back surface of the outmost second semiconductor die at a second hybrid bonding interface along the vertical direction,
      along the lateral direction, a third dimension of the third semiconductor die is substantially equal to the second dimension of each second semiconductor die, and
      the plurality of third conductive vias are respectively joined to the plurality of second conductive vias of the outmost second semiconductor die at the second hybrid bonding interface, and the third semiconductor die is electrically connected and communicated to the first semiconductor die and the first stack of second semiconductor dies.

5. The semiconductor structure of claim 3, wherein the second semiconductor die further comprises at least one second stack of second semiconductor dies on the first semiconductor die, and the at least one second stack of second semiconductor dies and the first stack of second semiconductor dies are arranged side-by-side along the lateral direction,
   wherein two adjacent second semiconductor dies of the at least one second stack of second semiconductor dies are bonded to each other through another hybrid bonding interface, and a second active surface of one of the two adjacent second semiconductor dies of the at least one second stack of second semiconductor dies is joined to a second back surface of other one of the two adjacent second semiconductor dies of the at least one second stack of second semiconductor dies at the another hybrid bonding interface,
   wherein the at least one second stack of second semiconductor dies are electrically connected and communicated to each other through the plurality of second conductive vias of the at least one second stack of second semiconductor dies; and are electrically connected and communicated to the first semiconductor die through the plurality of first conductive vias and the plurality of second conductive vias of the at least one second stack of second semiconductor dies.

6. The semiconductor structure of claim 5, wherein the stacked structure further comprises:
   a third semiconductor die, comprising a third semiconductor substrate and a plurality of third conductive vias embedded in the third semiconductor substrate, and having a third active surface and a third back surface opposite to the third active surface, wherein:
      the third semiconductor die is bonded to an outmost second semiconductor die of the first stack opposite to the first semiconductor die through joining the third active surface to a second back surface of the outmost second semiconductor die of the first stack at a second hybrid bonding interface along the vertical direction,
      along the lateral direction, a third dimension of the third semiconductor die is substantially equal to the second dimension of each second semiconductor die of the first stack, and
      the plurality of third conductive vias are respectively joined to the plurality of second conductive vias of the outmost second semiconductor die of the first stack at the second hybrid bonding interface, and the third semiconductor die is electrically connected and communicated to the first semiconductor die and the first stack of second semiconductor dies; and at least one fourth semiconductor die, comprising a fourth semiconductor substrate and a plurality of fourth conductive vias embedded in the fourth semiconductor substrate, and having a fourth active surface and a fourth back surface opposite to the fourth active surface, wherein:
  the at least one fourth semiconductor die is bonded to an outmost second semiconductor die of the at least one second stack opposite to the first semiconductor die through joining the fourth active surface to a second back surface of the outmost second semiconductor die of the at least one second stack at a third hybrid bonding interface along the vertical direction,
  along the lateral direction, a fourth dimension of the at least one fourth semiconductor die is substantially equal to the second dimension of each second semiconductor die of the at least one second stack, and
  the plurality of fourth conductive vias are respectively joined to the plurality of second conductive vias of the outmost second semiconductor die of the at least one second stack at the third hybrid bonding interface, and the at least one fourth semiconductor die is electrically connected and communicated to the first semiconductor die and the at least one second stack of second semiconductor dies.

7. The semiconductor structure of claim 1, wherein the second semiconductor substrate further comprises:
  a sidewall and a rounded edge connecting the second back surface and the sidewall; or
  a sidewall and a bevel edge connecting the second back surface and the sidewall.

8. The semiconductor structure of claim 1, further comprising:
  a plurality of conductive terminals, located on the first active surface of the first semiconductor die, and electrically connected to the first semiconductor die.

9. The semiconductor structure of claim 1, wherein the stacked structure comprises two or more than two stacked structures.

10. A semiconductor structure, comprising:
  a semiconductor device, comprising:
    a base tier, comprising a first die comprising a first semiconductor substrate and a plurality of first conductive vias penetrating through the first semiconductor substrate; and
    a die stack, bonded to the base tier, and comprising second dies arranged into at least one inner tier and an outmost tier, wherein the die stack and the base tier are bonded through a first hybrid bonding interface, the at least one inner tier and the outmost tier are bonded through a second hybrid bonding interface, and an offset is between a sidewall of the base tier and a sidewall of the die stack, wherein the first die and the second dies are electrically communicated to each other, and wherein a positioning location of the die stack is within a positioning location of the base tier in a projection along a stacking direction of the base tier and the die stack;
  a plurality of conductive terminals, over and electrically connected to the semiconductor device; and
  a connection structure, located between the semiconductor device and the plurality of conductive terminals, wherein the base tier is located between the connection structure and the die stack, and the at least one inner tier is located between the base tier and the outmost tier.

11. The semiconductor structure of claim 10, further comprising:
  an insulating encapsulation, covering the semiconductor device, wherein the base tier is located between the insulating encapsulation and the connection structure and between the die stack and the connection structure, wherein a sidewall of the insulating encapsulation is substantially coplanar with a sidewall of the connection structure, and the connection structure comprises a protection layer or a redistribution circuit stricture.

12. The semiconductor structure of claim 11, wherein the sidewall of the insulating encapsulation is further substantially coplanar with the sidewall of the base tier.

13. The semiconductor stricture of claim 10, further comprising:
  a first insulating encapsulation, over the semiconductor device and covering the base tier; and
  a second insulating encapsulation, over the first insulating encapsulation and covering the die stack,
  wherein a sidewall of the first insulating encapsulation and a sidewall of the second insulating encapsulation are substantially coplanar with a sidewall of the connection structure, and the connection structure comprises a protection layer or a redistribution circuit structure.

14. The semiconductor structure of claim 13, wherein the sidewall of the first insulating encapsulation and the sidewall of the second insulating encapsulation are further substantially coplanar with the sidewall of the base tier.

15. The semiconductor structure of claim 10, further comprising:
  an isolation element, at least partially covering a sidewall of the semiconductor device, wherein the isolation element extends from the base tier toward the die stack,
  wherein a material of the isolation element comprises a conductive layer or a dielectric layer.

16. The semiconductor structure of claim 10, wherein the die stack comprises two or more than two die stacks.

17. The semiconductor structure of claim 10, wherein the semiconductor device comprises two or more than two semiconductor devices.

18. A method of manufacturing a semiconductor structure, comprising:
  forming at least one stacked structure, comprising:
    providing a base tier comprising a first semiconductor die comprising a first semiconductor substrate and a plurality of first conductive vias penetrating through the first semiconductor substrate; and
    forming a die stack comprising second semiconductor dies on the base tier through hybrid bonding, wherein a first dimension of the base tier is greater than a second dimension of the die stack along a lateral direction, a positioning location of the die stack is within a positioning location of the base tier in a projection along a vertical direction, and the first semiconductor die is electrically connected to the second semiconductor dies;
  forming a connection structure over the at least one stacked structure, the base tier being between the connection structure and the die stack; and
  disposing a plurality of conductive terminals over the at least one stacked structure and electrically connecting the plurality of conductive terminals to the first semiconductor die, the connection structure being between the plurality of conductive terminals and the base tier.

19. A method of claim 18, wherein the die stack comprises a bottommost tier, a topmost tier and at least one inner tier located therebetween, and the bottommost tier, the at least one inner tier and the topmost tier each comprises one or more than one of the second semiconductor dies,
wherein forming the die stack on the base tier through hybrid bonding comprises:
hybrid bonding a front surface of the bottommost tier to a back surface of the base tier to electrically connect the first semiconductor die and the one or more than one of the second semiconductor dies of the bottommost tier;
hybrid bonding a front surface of the at least one inner tier to a back surface of the bottommost tier to electrically connect the one or more than one of the second semiconductor dies of the at least one inner tier and the one or more than one of the second semiconductor dies of the bottommost tier; and
hybrid bonding a front surface of the topmost tier to a back surface of the at least one inner tier to electrically connect the one or more than one of the second semiconductor dies of the at least one inner tier and the one or more than one of the second semiconductor dies of the topmost tier.

20. A method of claim 18, wherein forming the die stack on the base tier through hybrid bonding comprises forming a plurality of die stacks on the base tier through hybrid bonding.

* * * * *